US007537976B2

(12) United States Patent
Hirose

(10) Patent No.: US 7,537,976 B2
(45) Date of Patent: May 26, 2009

(54) MANUFACTURING METHOD OF THIN FILM TRANSISTOR

(75) Inventor: Atsushi Hirose, Kanagawa (JP)

(73) Assignee: Semiconductor Energy Laboratory Co., Ltd., Kanagawa-Ken (JP)

( * ) Notice: Subject to any disclaimer, the term of this patent is extended or adjusted under 35 U.S.C. 154(b) by 472 days.

(21) Appl. No.: 11/410,259

(22) Filed: Apr. 25, 2006

(65) Prior Publication Data

US 2006/0263576 A1    Nov. 23, 2006

(30) Foreign Application Priority Data

May 20, 2005    (JP)    ............................. 2005-147660

(51) Int. Cl.
H01L 21/84    (2006.01)
H01L 21/00    (2006.01)
H01L 21/285    (2006.01)
H01L 21/288    (2006.01)
H01L 21/445    (2006.01)

(52) U.S. Cl. ...................... 438/149; 438/151; 438/158; 257/E21.414; 257/E21.166; 257/E21.479; 257/E21.174

(58) Field of Classification Search ................. 438/149, 438/151, 158; 257/E21.414, E21.166, E21.479, 257/E21.174
See application file for complete search history.

(56) References Cited

U.S. PATENT DOCUMENTS

| 5,847,413 | A | 12/1998 | Yamazaki et al. |
| 6,750,618 | B2 | 6/2004 | Yamazaki et al. |
| 6,853,052 | B2 * | 2/2005 | Ishikawa .................... 257/532 |
| 2004/0147113 | A1 | 7/2004 | Yamazaki et al. |
| 2004/0224433 | A1 | 11/2004 | Yamazaki et al. |
| 2005/0014319 | A1 | 1/2005 | Yamazaki et al. |
| 2005/0026410 | A1 | 2/2005 | Yamazaki et al. |
| 2005/0043186 | A1 | 2/2005 | Maekawa et al. |
| 2005/0048289 | A1 | 3/2005 | Muranaka et al. |

(Continued)

FOREIGN PATENT DOCUMENTS

WO    WO 2005/022262 A1    3/2005

(Continued)

OTHER PUBLICATIONS

Tatsuya Shimoda, "39.1: Invited Paper: Ink-jet Technology for Fabrication Processes of Flat Panel Displays", SID Digest, '03: SID International Symposium Digest of Technical Papers, 2003, pp. 1178-1181.

*Primary Examiner*—Luan C Thai
(74) *Attorney, Agent, or Firm*—Nixon Peabody LLP; Jeffrey L. Costellia; Marc W. Butler

(57) ABSTRACT

The invention provides a manufacturing method of a circular thin film transistor of which shape is more controlled than the conventional case, while simplifying the steps and reducing the manufacturing time and cost by forming a circular thin film transistor by a maskless process such as a droplet discharge method. In the invention, a circular thin film transistor having a circular electrode is formed by stacking concentric circular thin films over a substrate by a maskless process such as a droplet discharge method. Moreover, a circular thin film transistor having a circular semiconductor layer may be formed by stacking concentric circular thin films over a substrate by a maskless process such as a droplet discharge method.

44 Claims, 30 Drawing Sheets

U.S. PATENT DOCUMENTS

| | | |
|---|---|---|
| 2005/0095356 A1 | 5/2005 | Nakamura et al. |
| 2005/0112906 A1 | 5/2005 | Maekawa et al. |
| 2005/0121675 A1 | 6/2005 | Maekawa et al. |
| 2005/0142896 A1 | 6/2005 | Imai et al. |
| 2005/0146551 A1 | 7/2005 | Yamazaki et al. |
| 2005/0163938 A1 | 7/2005 | Yamazaki et al. |
| 2005/0164423 A1 | 7/2005 | Maekawa et al. |
| 2005/0196710 A1 | 9/2005 | Shiroguchi |
| 2005/0230752 A1 | 10/2005 | Kanno et al. |
| 2005/0244995 A1 | 11/2005 | Fukuchi et al. |
| 2006/0028503 A1 | 2/2006 | Yamazaki et al. |
| 2006/0038174 A1 | 2/2006 | Maekawa |
| 2006/0134918 A1 | 6/2006 | Fujii et al. |
| 2006/0158482 A1 | 7/2006 | Nakamura et al. |
| 2006/0166411 A1 | 7/2006 | Morisue et al. |
| 2006/0170067 A1 | 8/2006 | Maekawa et al. |
| 2007/0019032 A1 | 1/2007 | Maekawa et al. |
| 2007/0042597 A1 | 2/2007 | Yamazaki |
| 2007/0051952 A1 | 3/2007 | Yamazaki et al. |
| 2007/0051958 A1 | 3/2007 | Yamazaki et al. |
| 2007/0082443 A1 | 4/2007 | Yamazaki et al. |
| 2007/0120471 A1 | 5/2007 | Yamazaki et al. |
| 2007/0164280 A1 | 7/2007 | Maekawa et al. |

FOREIGN PATENT DOCUMENTS

| | | |
|---|---|---|
| WO | WO 2005/041286 A1 | 5/2005 |
| WO | WO 2005/041310 A1 | 5/2005 |
| WO | WO 2005/041311 A1 | 5/2005 |

* cited by examiner

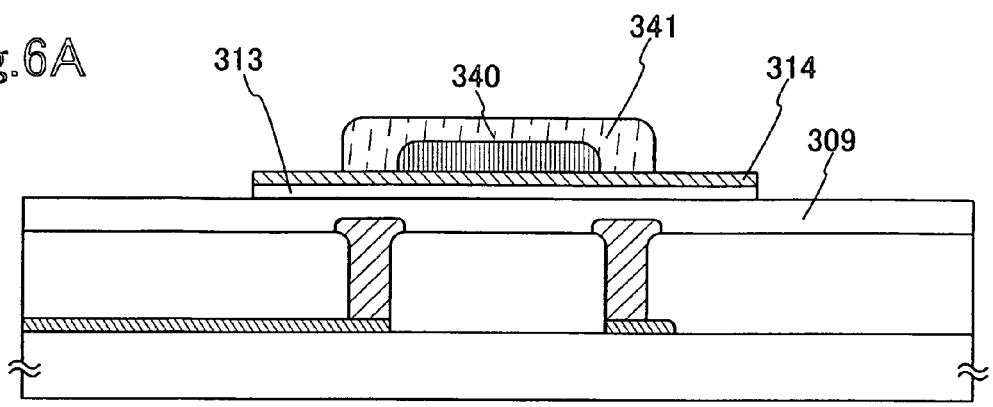
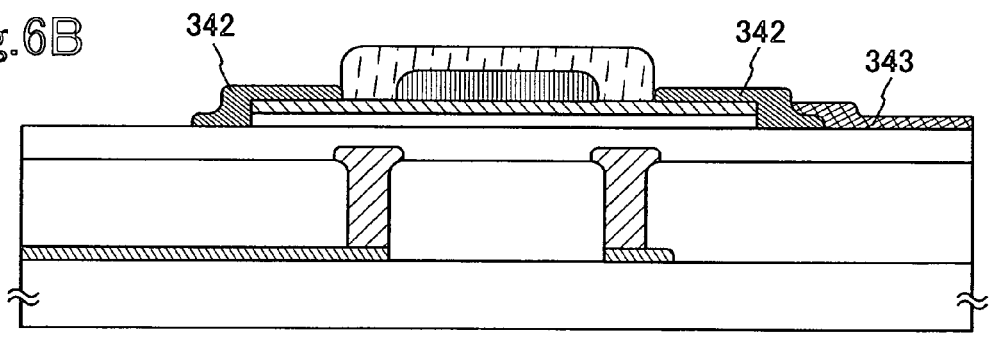
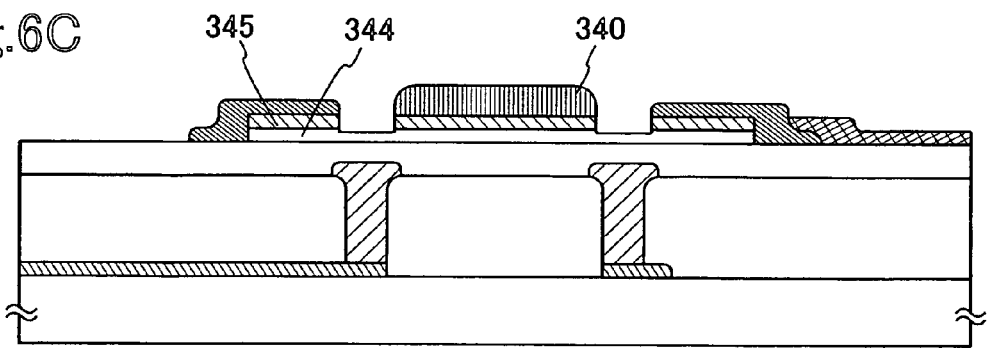

Fig.12A
Fig.12B
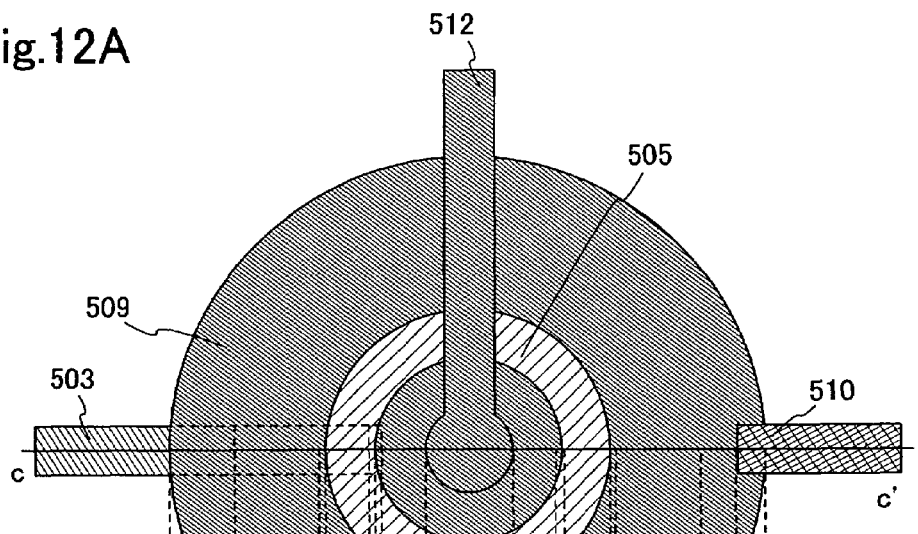
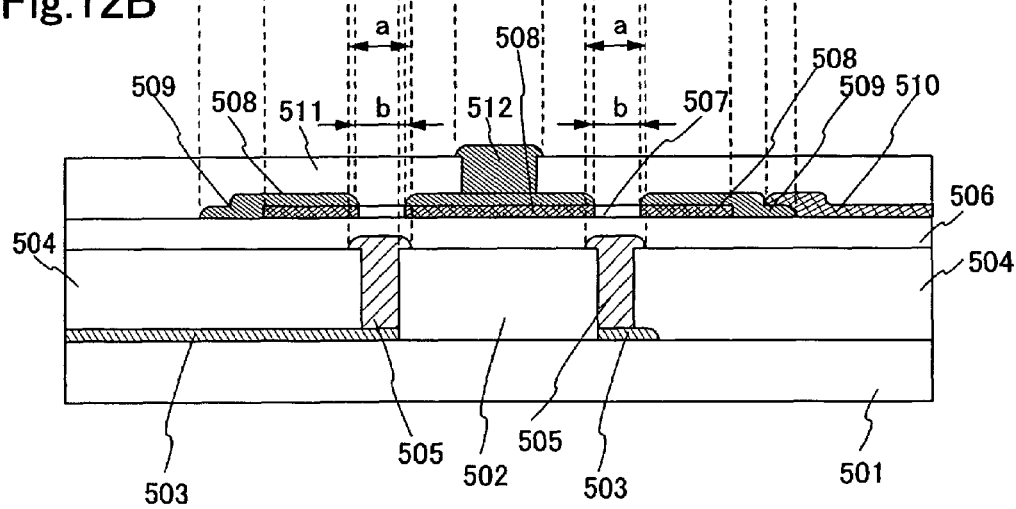

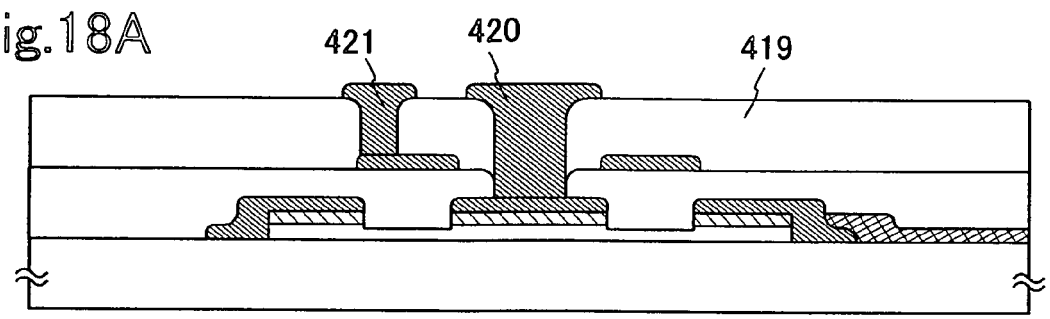
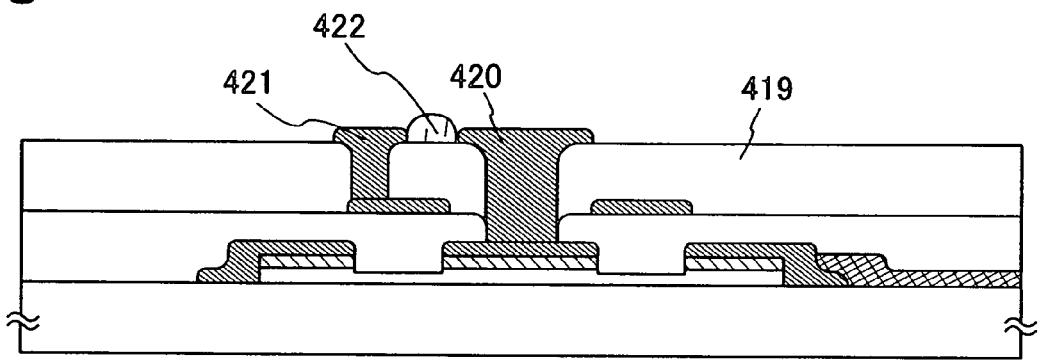

MANUFACTURING METHOD OF THIN FILM TRANSISTOR

BACKGROUND OF THE INVENTION

1. Field of the Invention

The invention relates to a thin film transistor (TFT) having a circular electrode (hereinafter referred to as a circular thin film transistor (TFT)), a semiconductor device including the circular thin film transistor, and a manufacturing method thereof. It is to be noted that a semiconductor device corresponds to a thin film transistor substrate including a thin film transistor over a substrate, a liquid crystal panel substrate or a liquid crystal module substrate including a thin film transistor and liquid crystals over a substrate, an EL (Electro Luminescence) panel substrate or an EL module substrate including a thin film transistor and a light emitting element over a substrate, a liquid crystal panel including a thin film transistor and liquid crystals over a substrate which are sealed by a sealing material, an EL panel including a thin film transistor and a light emitting element over a substrate which are sealed by a sealing material, a module including an FPC or the like attached to the aforementioned panel, a module including a driver IC connected to an end of the FPC or the like, and a module including a driver IC mounted to the panel by a COG method or the like.

2. Description of the Related Art

A conventional thin film transistor is formed by using a mask such as a photo mask, therefore, a mask is required to be formed for every change in design. Moreover, a thin film transistor is formed by forming a film over the entire surface of a substrate as a mainstream method. For example, in the case of connecting an electrode and a wire formed so as to sandwich an insulating layer, it is required that the insulating layer be partially removed prior to connecting the wire. Furthermore, patterning of an electrode, a wire, and the like requires exposure of a resist to light using a mask, which leads to problems in that the number of steps is increased and that efficiency and environment are both affected by the waste liquid.

It is to be noted that a conventional thin film transistor has each electrode which cross each other, for example, linearly or perpendicularly. In addition, a conventional thin film transistor has each electrode which ultimately has a start point and an end point which do not form a closed loop structure. Therefore, the mechanical and electrical behavior or the like is different between the center and end portions of each electrode. Further, there are many unnecessary areas in the electrode, which ends in occupying a wide area for the thin film transistor. The aforementioned problems are notably present in a thin film transistor having a conventional shape, which is formed by a method using no mask (maskless process) in particular.

In the case of forming a circular thin film transistor having a circular electrode by using a mask as in a conventional way in order to solve the aforementioned problems, it is difficult to form each electrode into a perfect circular shape. Originally, it is difficult to form a perfect curve in forming a circular shape by using a photo mask since the mask is drawn by a laser or the like. Further, cost is increased when the precision is improved. Moreover, when such a photo mask is used to form a resist and etching is performed, corner portions of the resist formed by the photo mask are likely to be etched more (for example, over etching, or the like), which leads to the formation a distorted circular shape. When a source electrode and a drain electrode of a thin film transistor have such irregular shapes, it becomes difficult to form channel portions uniformly, which causes deterioration and variations in characteristics of the thin film transistor.

On the other hand, an ink-jet method has been applied to the field of flat panel displays and actively developed as a manufacturing method using no mask (maskless process), by which a thin film can be patterned without using a mask. An ink-jet method has many advantages in that no mask is required since patterns are directly drawn, application to a large substrate is easy, efficiency of materials is high, and the like, and has been applied to the manufacture of a color filter, electrodes of plasma displays, and the like (For example, see Non-patent Document 1).

However, when such a maskless process is used to form a thin film transistor having a conventional shape, the shape is dependent on an uncertain factor such as a shape of a landed droplet. Therefore, it is difficult to control the shape of an electrode, an active layer, or the like. In this manner, the maskless process has been a major factor to promote the variations in design values which influence the characteristics such as a channel length of a thin film transistor.

[Non-patent Document 1]
  T. Shimoda, Ink-jet Technology for Fabrication Processes of Flat Panel Displays, SID 03 DIGEST, p. 1178-p 1181

SUMMARY OF THE INVENTION

In view of the aforementioned problems, the invention provides a manufacturing method of a thin film transistor of which shape is more controlled than the conventional case of using a maskless process, while simplifying the steps and reducing the manufacturing time and cost by forming a thin film transistor (for example, a circular thin film transistor) by a maskless process such as a droplet discharge method.

In order to solve the aforementioned problems, the invention provides the following measures.

According to the invention, a thin film transistor is formed by stacking thin films over a substrate by a maskless process such as a droplet discharge method typified by an ink-jet method.

The invention provides a manufacturing method of a thin film transistor including steps of forming a first insulating layer over a substrate by a droplet discharge method, forming a first liquid-repellent layer over the first insulating layer by a droplet discharge method, forming a first conductive layer in contact with the first insulating layer over the substrate by a droplet discharge method, forming a second liquid-repellent layer over the first liquid-repellent layer and the first conductive layer by a droplet discharge method, forming a second insulating layer in contact with the second liquid-repellent layer over the first conductive layer and the substrate by a droplet discharge method, removing the first liquid-repellent layer and the second liquid-repellent layer, forming a third liquid-repellent layer over the first insulating layer, forming a second conductive layer in contact with the first insulating layer and the third liquid-repellent layer over the first conductive layer and the second insulating layer, removing the third liquid-repellent layer, forming a third insulating layer over the first insulating layer, the second conductive layer, and the second insulating layer by a droplet discharge method, forming a first semiconductor layer over the third insulating layer, forming a second semiconductor layer imparted with one conductivity type over the first semiconductor layer, forming a first mask over a portion of the second semiconductor layer by a droplet discharge method, forming a third semiconductor layer and a fourth semiconductor layer by etching the first semiconductor layer and the second semiconductor layer using the first mask, removing the first mask, forming a third conductive layer in contact with a portion of the fourth semiconductor layer by a droplet discharge method, forming a fourth liquid-repellent layer over the third conductive layer and a portion of the fourth semiconductor layer by a droplet discharge method, forming a fourth conductive layer in contact with the third semiconductor layer, the fourth semiconductor layer, and the fourth liquid-repellent layer by a droplet discharge method, forming a fifth conductive layer in contact with the fourth conductive layer by a droplet discharge method, removing the fourth liquid-repellent layer, etching a portion of the third semiconductor layer and a portion of the fourth semiconductor layer using the third conductive layer and the fourth conductive layer as masks, forming a fifth semiconductor layer and a sixth semiconductor layer, forming a fifth liquid-repellent layer over the third conductive layer by a droplet discharge method, forming a fourth insulating layer in contact with the fifth liquid-repellent layer over the third insulating layer, the fourth conductive layer, and the fifth conductive layer by a droplet discharge method, removing the fifth liquid-repellent layer, and forming a sixth conductive layer in contact with the third conductive layer and the fourth insulating layer by a droplet discharge method.

In the invention, concentric circular thin films are stacked over a substrate by way of a maskless process such as a droplet discharge method, thereby a circular thin film transistor having a circular electrode is formed. Alternatively, a circular thin film transistor having a circular semiconductor layer or a circular thin film transistor having a circular insulating layer may also be used by way of a maskless process such as a droplet discharge method. It is to be noted in the case of forming a concentric circular thin film with a hole in the center by using a liquid material, the shape thereof can be controlled by forming a liquid-repellent layer which is repellent to the liquid material and then forming a concentric circular thin film thereover.

In the invention, a structure of a thin film transistor to lead out a gate electrode, a source electrode, and a drain electrode is improved into form a shape where each electrode and a channel are connected in the loop. In other cases, a thin film transistor has electrodes and a channel each forming a shape like the letter C (alphabet) or a rectangular shape instead of a circular shape.

In forming a circular thin film transistor of the invention, a step of partially removing the insulating layer can be omitted by selectively forming an insulating film which forms a portion of a thin film transistor in only required places instead of forming it over the entire substrate.

The invention provides a manufacturing method of a circular thin film transistor having a circular electrode and a manufacturing method of a semiconductor device. That is, in a thin film transistor of the invention, a source electrode, a drain electrode, and the like (for example, a semiconductor layer imparted with p-type or n-type conductivity, to which a source electrode or a drain electrode is connected, which is described in embodiment modes) are arranged at equal distances in the entire transistor. Moreover, the thin film transistor of the invention has the gate electrode, the source electrode, and the drain electrode each of which is connected in a loop shape, and has a channel portion having more uniform lengths in every direction than that formed by the conventional method.

In the invention, a length of a channel portion (a channel length) of a thin film transistor can be more uniformly formed in every direction as described above. Moreover, the channel length of the thin film transistor can be freely controlled (for example, a width b in FIG. 1B is controlled). Further, it is also possible to freely control a length of an overlapped region of a gate electrode and a film for electrically connecting a crystalline semiconductor film such as an impurity semiconductor film which exists adjacent to a channel portion of a thin film transistor to a source electrode and a drain electrode (for example, a semiconductor film imparted with p-type or n-type conductivity) with a gate insulating film interposed therebetween (for example, a width a in FIG. 1B is controlled). A channel length of a thin film transistor can be controlled by controlling the amount of droplet used for forming a liquid-repellent layer, an electrode, a mask, or the like.

A thin film transistor of the invention is formed by stacking a source electrode, a drain electrode, an interlayer insulating film, a gate electrode, a gate insulating film, a film (for example, a semiconductor film imparted with p-type or n-type conductivity) for electrically connecting the source electrode and the drain electrode to a crystalline semiconductor film such as an amorphous semiconductor film, a microcrystalline semiconductor film, and an impurity semiconductor film, and the like over a substrate. Further, a thin film transistor of the invention may employ either of a top gate structure or a bottom gate structure. Further, as a structure to etch the semiconductor layer, either of a channel etch type (a portion of an active layer is etched) or a channel stop type (an active layer is not etched by protecting the active layer by a protective film or the like) may be employed. However, each layer of the invention may be formed of either of an organic substance or an inorganic substance.

In accordance with one aspect of the present invention, the invention provides a manufacturing method of a semiconductor device including steps of forming a first layer on a first region of a surface, forming a first liquid-repellent layer comprising a first liquid-repellent material on the first layer, dropping a second liquid-repellent material on the first liquid-repellent layer so that a second liquid-repellent layer is formed on a side surface of the first layer and a side surface of the first liquid-repellent layer wherein a second region of the surface is covered by the second liquid-repellent layer, forming a second layer over a third region of the surface wherein the third region of the surface is adjacent to the second region of the surface, removing at least the second liquid-repellent layer after forming the second layer, forming a third layer in a gap between the first layer and the second layer.

For example, as shown in FIG. 2A-2D, the first insulating layer 302 is formed as the first layer, the second insulating layer 306 is formed as the second layer, and the second conductive layer 308 is formed as the third layer. By the foregoing method, it is advantageous to control the thickness (length) of the second conductive layer 308.

When a source electrode and a drain electrode which have concentric circular shapes are formed, the distances between the source electrode and the drain electrode are formed equal and the circumference of the electrodes are more smoothly formed independent of the mask precision. Therefore, a more uniform channel portion can be formed than that formed by a conventional process using a mask. As a result, mechanical characteristics typified by peeling off of a film due to a stress applied to a film edge portion, or the like can be suppressed as well as electrical characteristics such as a deterioration and variations of characteristics of a circular thin film transistor can be suppressed (An oval or the like is included in the concentric circular shape. That is, a shape of a channel portion which can be uniformly formed in the entire thin film transistor can be employed, including an electrode and a channel portion having an oval shape or the like).

Further, by forming an electrode of a thin film transistor in a circular shape (circular electrode), a wire can be lead out from all directions of the electrode. As a result, freedom of a wiring layout can be improved and various problems caused by leading wires (for example, electrical problems such as impedance (wire resistance, wire capacitance, wire inductance) and reflection (mainly for high frequency) generated when the wire is bent, and mechanical problems such as peeling off of a film due to the stress which rather concentrates at an edge portion of the film) can be improved. (The aforementioned circular electrode does not necessarily have a perfect circle shape. That is, the electrode may have an oval shape or the like).

By forming each electrode in a closed shape like a loop, a channel portion having a channel length (L) with uniform lengths in a direction from a source electrode to a drain electrode can be formed (it is difficult to form uniform channel lengths in an electrode shape of a thin film transistor formed by a conventional droplet discharge method since a landed droplet cannot form a straight line). Moreover, a channel width (W) can be formed with less error of the design value than the conventional method (a thin film transistor formed by the conventional method tends to have error of the design value due to an effect on its edge portions). Therefore, by forming a structure without edge portions where stress or electrical force concentrates (for example, static electricity or deterioration caused by the concentration of current at edge portions of a channel portion), peeling off of a thin film can be suppressed. (The aforementioned closed shape like a loop includes an oval and the like. That is, a shape of a channel portion which can be uniformly formed in the entire thin film transistor can be employed, including an electrode and a channel portion having an oval shape or the like.)

By forming a channel and each electrode in shapes that are spread in concentric circular shapes by a maskless process such as a droplet discharge method, channel lengths (L) can be formed more uniformly and a channel width (W) can be formed wider with the same area than those of a thin film transistor formed by using a mask. Therefore, the area of a thin film transistor can be efficiently used and variations in characteristics thereof can be suppressed. The aforementioned features are particularly important in integration.

A circular thin film transistor of the invention can reduce or eliminate the number of steps using a photo mask or the number of peeling steps, which leads to the simplification of the steps. Moreover, as various kinds of waste liquid generated in each step can be reduced, burden on the environment can be lightened. Furthermore, manufacturing time and cost can be reduced.

BRIEF DESCRIPTION OF DRAWINGS

FIGS. 6A to 6C are views showing structure of a circular thin film transistor of Embodiment Mode 2.

FIGS. 12A and 12B are views showing structures of a circular thin film transistor of Embodiment Mode 4.

FIGS. 18A and 18B are views showing a manufacturing method of a circular thin film transistor of Embodiment Mode 5.

DETAILED DESCRIPTION OF THE INVENTION

Figure 1A:
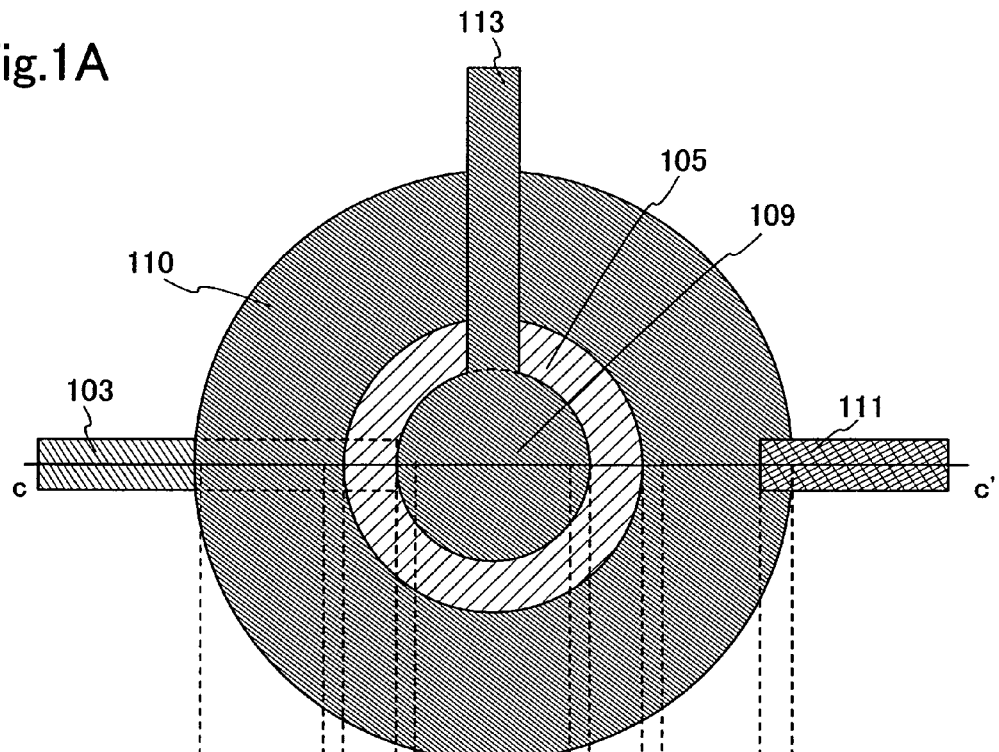
FIGS. 1A and 1B are views showing structures of a circular thin film transistor of Embodiment Mode 1.

Although the invention will be fully described by way of embodiment modes with reference to the accompanying drawings, it is to be understood that various changes and modifications will be apparent to those skilled in the art. Therefore, unless such changes and modifications depart from the scope of the invention, they should be construed as being included therein. Note that identical portions in embodiment modes are denoted by the same reference numerals in different drawings. Moreover, a substrate hereinafter described includes a substrate to which base treatment is applied, such as the one having a buffer layer.

Embodiment Mode 1

Description is made with reference to FIGS. 1A to 4C on structures and a manufacturing method of a circular thin film transistor of the invention.

Figure 1B:
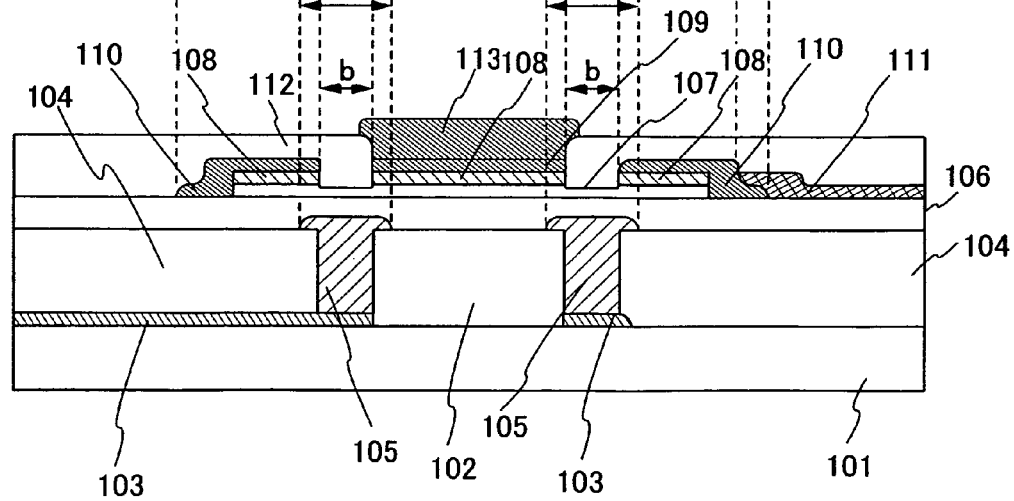

FIG. 1A is a top plan view of a circular thin film transistor of the invention and FIG. 1B is a cross sectional view thereof.

As shown in FIG. 1B, a first insulating layer 102 and a first conductive layer 103 are formed over a substrate 101, and then a second insulating layer 104 and a second conductive layer 105 are formed. It is to be noted that the first conductive layer 103 functions as a gate wire here and the second conductive layer 105 functions as a gate electrode. Note that the second conductive layer 105 is covered with a third insulating layer 106.

Further, semiconductor layers 107 and 108 are formed as active layers over the third insulating layer 106. A third conductive layer 109 which functions as a source electrode is formed over the semiconductor layer 108 provided at a center portion of the circular thin film transistor. A fourth conductive layer 110 which functions as a drain electrode is formed over the semiconductor layer 108 provided apart from the center portion of the circular thin film transistor. It is to be noted that a fifth conductive layer 111 which functions as a drain wire is formed in contact with the fourth conductive layer 110.

A fourth insulating layer 112 is formed so as to cover the third insulating layer 106, the fourth conductive layer 110, and the fifth conductive layer 111. Further, a sixth conductive layer 113 which functions as a source wire is formed in contact with the third conductive layer 109.

Alternatively, after forming a first liquid-repellent layer by a droplet discharge method, the first conductive layer 103 may be formed by a droplet discharge method. After forming the second conductive layer 105 by a droplet discharge method so as to be in contact with the first conductive layer 103 over a substrate, the first liquid-repellent layer may be removed. Then, the first insulating layer 102 may be formed and a second liquid-repellent layer may be formed by a droplet discharge method, thereafter the second insulating layer 104 may be formed.

It is to be noted that the aforementioned manufacturing method of a circular thin film transistor will be hereinafter described in details.

Figure 2A:
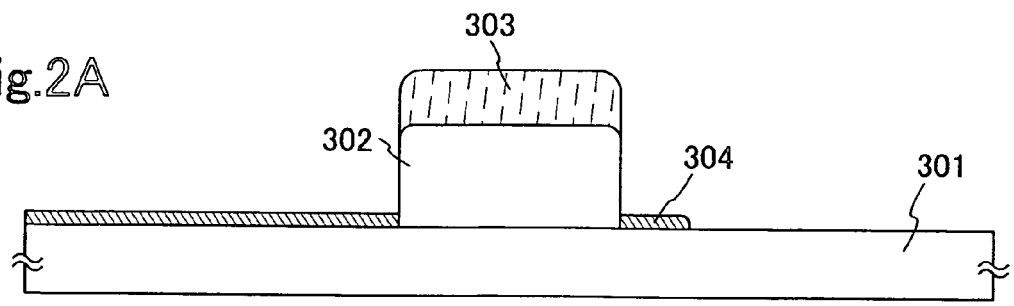
FIGS. 2A to 2D are views showing a manufacturing method of a circular thin film transistor of Embodiment Mode 1.
Figure 2B:
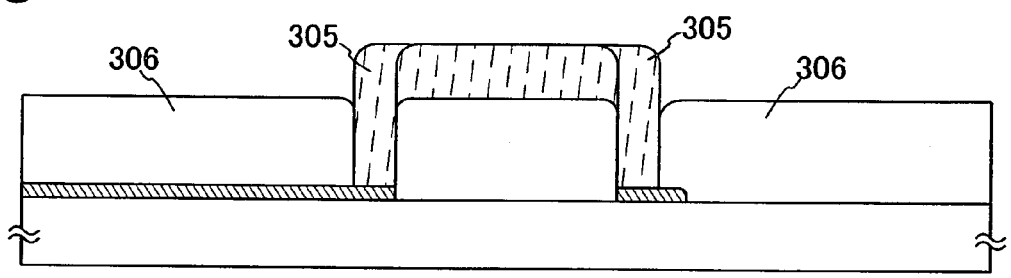

As shown in FIG. 2A, a first insulating layer 302 is formed over a substrate 301 by a droplet discharge method and a first liquid-repellent layer 303 is formed over the first insulating layer 302 by a droplet discharge method. Then, a first conductive layer 304 is formed over the substrate 301 by a droplet discharge method. Note that a glass substrate formed of barium borosilicate glass, alumino borosilicate glass, or the like, a quartz substrate, a silicon substrate, a metal substrate, a stainless steel substrate, or a plastic substrate having heat resistance against a processing temperature of manufacturing steps can be used as the substrate 301.

It is preferable that the diameter of a nozzle used for a droplet discharge method be set 0.02 to 100 μm (more preferably 30 μm or narrower) and the amount of a composition discharged from the nozzle be set 0.001 to 100 pl (more preferably 10 pl or less). This amount increases in proportion to the diameter of the nozzle. However, the diameter of the nozzle may be appropriately changed in accordance with a shape and a size of a pattern to be formed. It is preferable that the distance between the object being processed and a discharge opening of the nozzle be as close to each other as possible in order to drop the composition at a desired place, which is preferably about 0.1 to 3 mm (more preferably 1 mm or closer). The nozzle or the object being processed moves while keeping a relative distance therebetween, thereby a desired pattern is drawn.

In the case of forming insulating layers (including the first to fourth insulating layers in Embodiment Mode 1) by a droplet discharge method, an insulating material dissolved or dispersed in a solvent is used as a composition discharged from the discharge opening. As the insulating material, a resin material such as an epoxy resin, an acrylic resin, a phenol resin, a novolac resin, a melamine resin, and a urethane resin is used. In the case of using these resin materials, the viscosity thereof is preferably controlled by using a solvent for dissolving or dispersing the aforementioned material.

As a material used for forming a liquid-repellent layer (including the first to fifth liquid-repellent layers in Embodiment Mode 1), a resin containing a fluorine atom or a resin formed only of hydrocarbon can be used. More specifically, a resin containing a monomer having a fluorine atom in its molecule, or a resin containing a monomer formed only of a carbon atom and a hydrogen atom can be used. Moreover, an organic material such as acrylic, benzocyclobutene, parylene, fluorinated arylene ether, and light-transmissive polyimide, a compound material formed by polymerization of such as a siloxane-based polymer, and a composition containing a water-soluble homo-polymer and a water-soluble co-polymer resin and the like can be used.

It is preferable to use an organic material since its superior planarity can prevent that a film thickness becomes extremely thin or a wire breaks at a step portion when forming a conductive layer later. However, it is preferable to form thin films using an inorganic material containing silicon as a lower layer and an upper layer of the organic material in order to prevent degasification. In specific, a silicon nitride oxide film or a silicon nitride film is preferably formed by a plasma CVD method or a sputtering method. A siloxane-based polymer is suggested as a representative example of a material which has a skeleton formed of bond of silicon and oxygen and contains at least hydrogen as a substituent, or a material containing at least one of fluoride, an alkyl group, or aromatic hydrocarbon as a substituent. Alternatively, various materials with the aforementioned conditions can be used. The siloxane-based polymer has advantages of having superior planarity, light transmittance, and heat resistance and being resistant to heat treatment at 300 to 600° C. after forming an insulator formed of a siloxane polymer. By this heat treatment, for example, hydrogenation and baking can be performed at the same time.

Further, a commercially available resist material containing a photosensitive material may also be used. For example, a positive type resist such as a novolac resin and a naphthoquinonediazide compound as a photosensitive material dissolved or dispersed in a solvent, or a negative type resist such as a base resin, diphenylsilanediol, an acid-generator, and the like dissolved or dispersed in a solvent may be used. The viscosity thereof may be controlled by using a solvent for dissolving or dispersing the aforementioned material.

Furthermore, in the case of forming conductive layers (including the first to sixth conductive layers in Embodiment Mode 1) by a droplet discharge method, a conductive material dissolved or dispersed in a solvent is used as a composition discharged from the discharge opening. As the conductive material, a metal such as Ag (silver), Au (gold), Cu (copper), Ni (nickel), Pt (platinum), Pb (lead), Ir (iridium), Rh (rhodium), W (tungsten), and Al (aluminum), micro-particles or dispersive nano-particles of Cd (cadmium), Zn (zinc), Fe (iron), Ti (titanium), Si (silicon), Ge (germanium), Zr (zirconium), Ba (barium), and silver halide can be used. Further, indium tin oxide (ITO), ITSO formed of indium tin oxide and silicon oxide, organic indium, organotin, zinc oxide, titanium nitride, or the like used for a light-transmissive conductive film can also be used. However, any one of gold, silver, and copper dissolved or dispersed in a solvent is preferably used as a composition to be discharged from a discharge opening in consideration of a resistance value. More preferably, silver or copper Which is low in resistance may be used. When silver or copper is used, however, a barrier film is preferably provided in combination as a protection from impurities.

As for such solvents, esters such as butyl acetate and ethyl acetate, alcohols such as isopropyl alcohol and ethyl alcohol, organic solvents such as methyl ethyl ketone and acetone, or the like may be used. The viscosity of the composition is preferably 50 cp or lower. This is because the composition is prevented from drying or the composition is smoothly discharged from the discharging opening. The surface tension of the composition is preferably 40 mN/m or lower. However, the viscosity of the composition and the like may be appropriately adjusted in accordance with a solvent to be used and application. For example, the viscosity of a composition in which ITO, organic indium, organotin, silver, or gold is dissolved or dispersed in the solvent is 5 to 20 mPa·S.

Plasma treatment may be carried out to a surface of the object being processed. This is because the surface of the object becomes lyophilic or lyophobic when the plasma treatment is carried out. For example, it becomes hydrophilic to purified water and it becomes lyophobic to a paste dissolved with alcohol.

As for a step of discharging the composition under reduced pressure, subsequent steps of drying and baking can be omitted or shortened, since the solvent of the composition is volatilized while the composition is discharged and reaches the object being processed. Therefore, it is preferable to carry out the step under reduced pressure. Moreover, one or both steps of drying and baking are carried out after the insulating layer is formed by discharging the composition. The drying step and the baking step are steps of heating treatment; however, the purpose, temperature, and time of the each step are different. For example, the drying step is carried out at a temperature of 100° C. for three minutes, and the baking step is carried out at a temperature of 200 to 350° C. for 15 to 120 minutes. The drying step and the baking step are carried out under normal pressure or reduced pressure by laser light irradiation, rapid thermal annealing, and by using a heating furnace, and the like. Note that the timing of carrying out the heat treatment is not particularly limited. To carry out the drying step and the baking step preferably, the substrate may be heated in advance, and the temperature at that time is generally set at 100 to 800° C. (preferably 200 to 350° C.), though it depends on the material of the substrate and the like. According to the steps, fusion and welding are accelerated by volatilizing a solvent in the composition or chemically eliminating the dispersing agent in order that resin in the periphery to cure and shrink.

A continuous wave or pulsed wave gas laser or solid state laser may be used for laser light irradiation. An excimer laser, an Ar laser, or the like can be given as the former gas laser, while lasers using crystals such as YAG or YVO$_4$ doped with Cr, Nd, or the like, can be given as the latter solid state laser.

The continuous wave laser is preferably used in consideration of the absorptance of laser light. Alternatively, a so-called hybrid laser irradiation method combining pulsed laser and continuous-wave oscillation is preferably employed. Note that heat treatment irradiation with the laser light may be instantaneously performed for several microseconds to several tens of seconds so as not to destroy the substrate 101 depending on the heat resistance of the substrate 101. Rapid thermal annealing (RTA) is carried out by instantaneously heating the substrate for from several microseconds to several minutes while rapidly raising the temperature by using an infrared lamp, a halogen lamp, or the like, which emits ultraviolet light to infrared light in an inert gas atmosphere. This treatment is carried out instantaneously, therefore, only the top surface of a thin film is substantially heated not to adversely affect lower films. That is, a substrate that has low heat resistance such as a plastic substrate is not affected by the heat treatment.

It is to be noted that there are two methods as a droplet discharge method, which are an on-demand type and a continuous type, and either of them may be used here. Further, there are roughly piezoelectric type and heating type heads used for a droplet discharge method, and either of them may be used here. A piezoelectric type head utilizes a property that a piezoelectric substance deforms by voltage and a heating type head discharges the composition by bringing the composition to boil by a heater provided in the nozzle.

Next, a second liquid-repellent layer 305 is formed by a droplet discharge method so as to cover a portion of the first conductive layer 304. Moreover, a second insulating layer 306 is formed by a droplet discharge method over the substrate 301 and the first conductive layer 304 (see FIG. 2B).

Figure 2C:
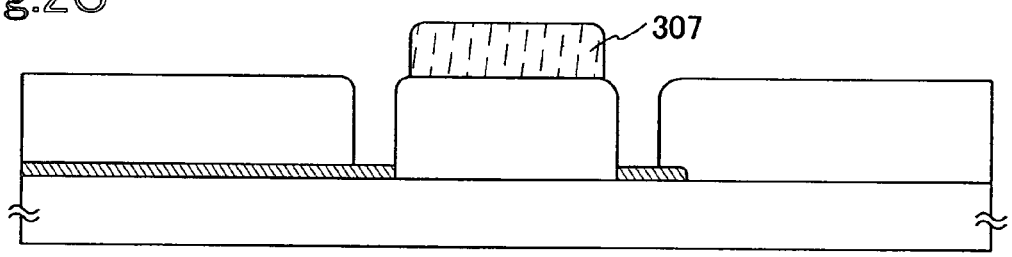

The first liquid-repellent layer 303 and the second liquid-repellent layer 305 are removed and a third liquid-repellent layer 307 is formed over the first insulating layer 302 (see FIG. 2C).

Figure 2D:
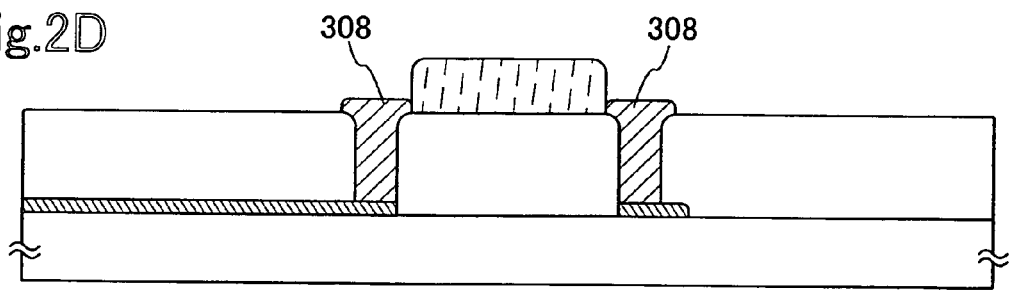

A second conductive layer 308 is formed in contact with the first conductive layer 304, the first insulating layer 302, and the second insulating layer 306 (see FIG. 2D). It is to be noted that the second conductive layer 308 functions as a gate electrode.

Figure 3A:
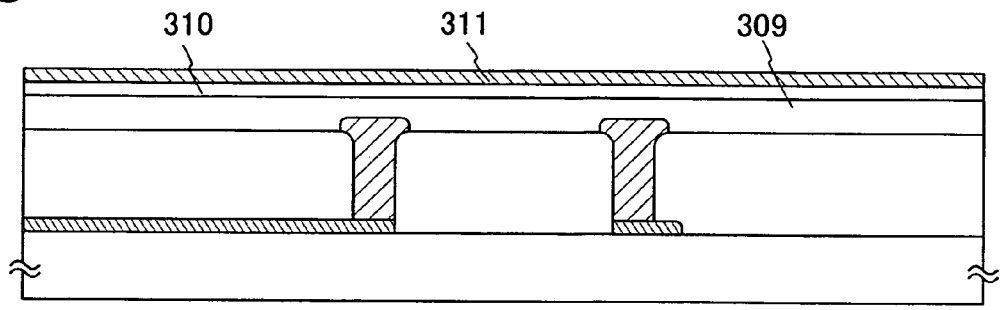
FIGS. 3A to 3D are views showing a manufacturing method of a circular thin film transistor of Embodiment Mode 1.

As shown in FIG. 3A, the third liquid-repellent layer 307 is removed and a third insulating layer 309 is formed over the second conductive layer 308, the first insulating layer 302, and the second insulating layer 306 by a droplet discharge method. Note that the third insulating layer 309 functions as a gate insulating film. Moreover, a first semiconductor film 310 and a second semiconductor layer 311 imparted with p-type or n-type conductivity are stacked over the third insulating layer 309.

A first mask 312 is formed over a portion of the second semiconductor layer 311 by a droplet discharge method. The first semiconductor layer 310 and the second semiconductor layer 311 are simultaneously etched by using the first mask 312, and then a third semiconductor layer 313 and a fourth semiconductor layer 314 imparted with p-type or n-type conductivity are formed. It is to be noted that the third semiconductor layer 313 functions as an active layer (see FIG. 3B).

The first mask 312 is removed and a third conductive layer 315 is formed over the fourth semiconductor layer 314 by a droplet discharge method. It is to be noted that the third conductive layer 315 functions as a source electrode or a drain electrode (see FIG. 3C).

Figure 3B:
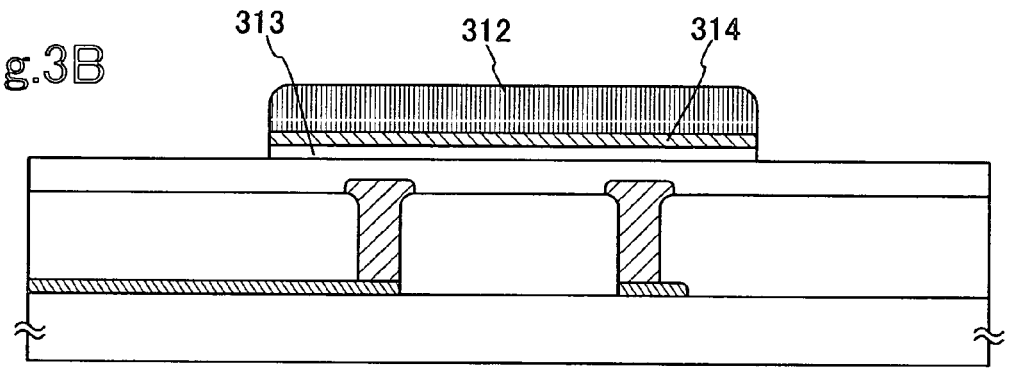

A fourth liquid-repellent layer 316 is formed over the fourth semiconductor layer 314 and the third conductive layer 315 by a droplet discharge method. A fourth conductive layer 317 is formed over a portion of the fourth semiconductor layer 314 and a portion of the third insulating layer 309 by a droplet discharge method. A fifth conductive layer 318 is formed over a portion of the fourth conductive layer 317 and a portion of the third insulating layer 309 by a droplet discharge method. Note that the fourth conductive layer 317 functions as a source electrode or a drain electrode and the fifth conductive layer 318 functions as a lead out wire for the source electrode or a lead out wire for the drain electrode (FIG. 3D).

Figure 4A:
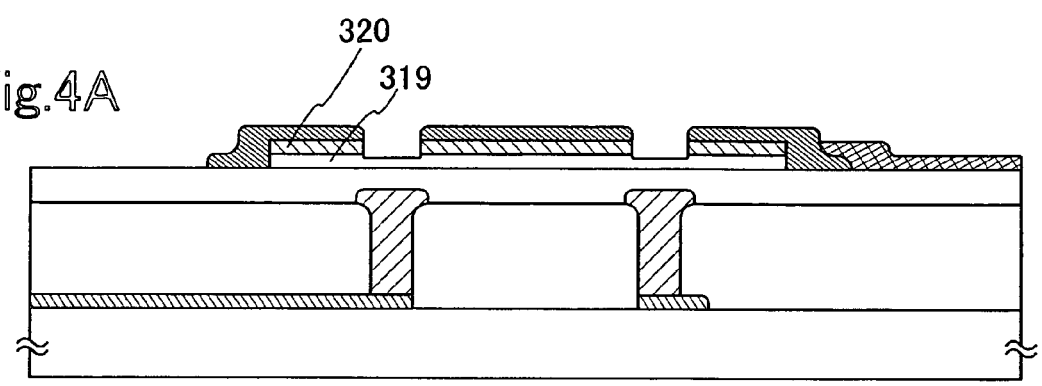
FIGS. 4A to 4C are views showing a manufacturing method of a circular thin film transistor of Embodiment Mode 1.

As shown in FIG. 4A, the fourth liquid-repellent layer 316 is removed and a portion of the third semiconductor layer 313 and the fourth semiconductor layer 314 are simultaneously etched using the third conductive layer 315 and the fourth conductive layer 317 as masks, thereby a fifth semiconductor layer 319 and a sixth semiconductor layer 320 are formed. Note that the fifth semiconductor layer 319 functions as an active layer. The sixth semiconductor layer 320 has a function to electrically connect the fifth semiconductor layer 319 which functions as an active layer to the third conductive layer 315 or the fourth conductive layer 317 each of which functions as a source electrode or a drain electrode.

Figure 4B:
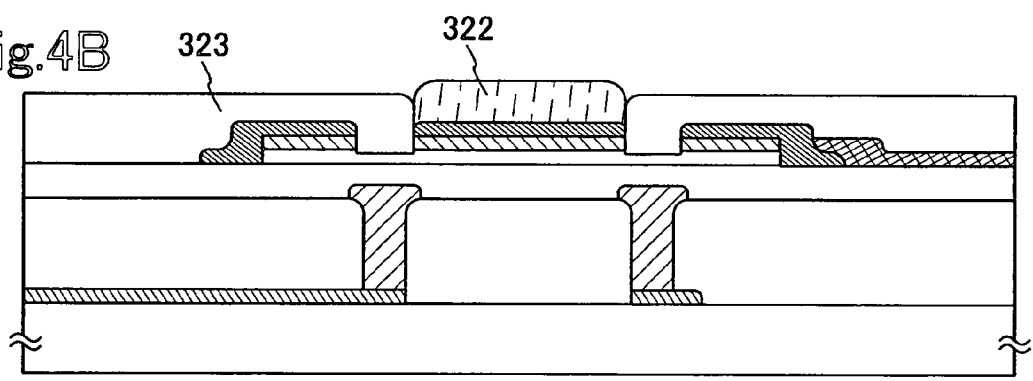
Figure 4C:
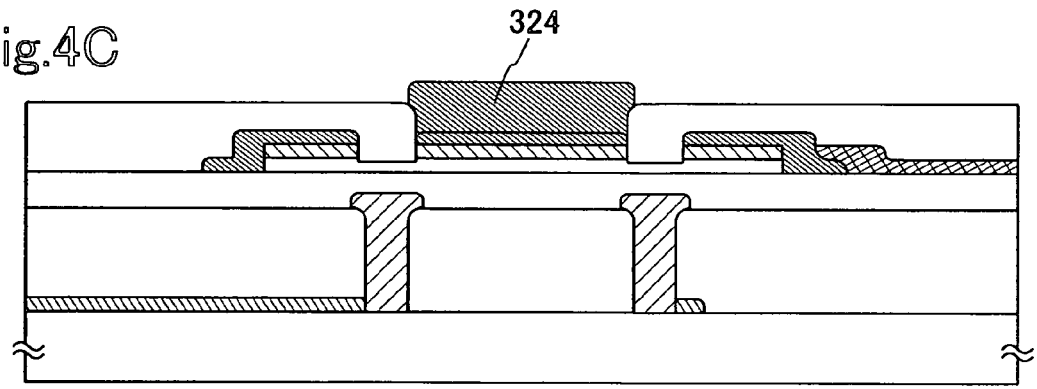

A fifth liquid-repellent layer 322 is formed over the third conductive layer by a droplet discharge method. A fourth insulating layer 323 is formed over the fifth semiconductor layer 319, the fourth conductive layer 317, and the fifth conductive layer 318 by a droplet discharge method. Note that the fourth insulating layer 323 functions as an interlayer insulating film (FIG. 4B).

The fifth liquid-repellent layer 322 is removed and a sixth conductive layer 324 is formed over the third conductive layer 315 and the fourth insulating layer 323 by a droplet discharge method. Note that the sixth conductive layer 324 has a function as a lead out wire for the source electrode or a lead out wire for the drain electrode.

The function of the third conductive layer 315 can be realized by forming the sixth conductive layer 324 instead of forming the third conductive layer 315 formed in the aforementioned manufacturing step. In that case, a mask for forming the fourth semiconductor layer is formed over the fourth semiconductor layer by a droplet discharge method, and then the fourth semiconductor layer is etched using the aforementioned mask and the sixth conductive layer as a mask, thereby a fifth semiconductor layer and a sixth semiconductor layer are formed.

After that, the aforementioned mask is removed and liquid-repellent treatment is applied so that other elements than an electrode are not formed over the fourth semiconductor layer 314 instead of forming the third conductive layer 315. By applying the liquid-repellent treatment which was applied to the third conductive layer 315 to the fourth semiconductor layer 314, the sixth conductive layer 324 having a function as the third conductive layer can be formed.

The film formed by a droplet discharge method by the aforementioned process may be formed by stacking a thin film by a known method such as a sputtering method and an evaporation method. In that case, a thin film transistor having a desired shape can be formed by forming a mask by a droplet discharge method.

However, in the case where a thin film is formed by a known method such as a sputtering method and an evaporation method and thus it is difficult to form the thin film at normal temperatures, it is required that a heat resistant substrate be used and a measure against heat be provided when stacking thin films.

The third liquid-repellent layer 307 is formed into an arbitrary size over the first insulating layer 302 (FIG. 2C), and then the second conductive layer 308 is formed into an arbitrary size so as to be in contact with the first conductive layer 304, the first insulating layer 302, and the second insulating layer 306 (FIG. 2D). Accordingly, the length of a gate electrode in a channel direction can be controlled.

Figure 3C:
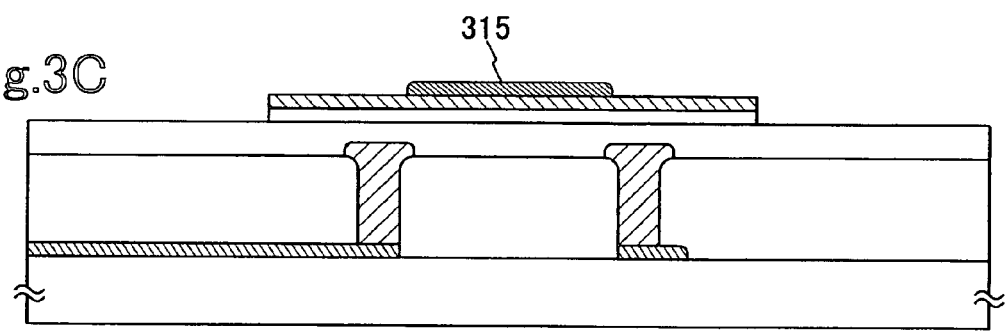
Figure 3D:
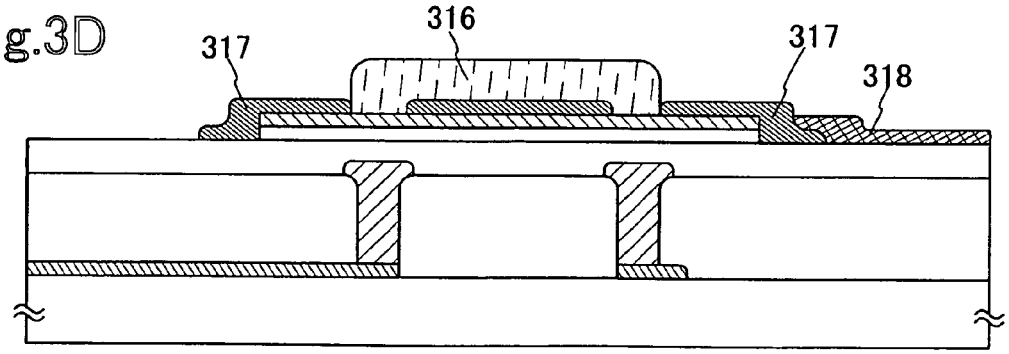

The third conductive layer 315 is formed into an arbitrary size over the fourth semiconductor layer 314 by a droplet discharge method (FIG. 3C). Subsequently, the fourth liquid-repellent layer 316 is formed into an arbitrary size over the fourth semiconductor layer 314 and the third conductive layer 315 by a droplet discharge method. The fourth conductive layer 317 is formed over a portion of the fourth semiconductor layer 314 and a portion of the third insulating layer 309 by a droplet discharge method. Further, the fifth conductive layer 318 is formed over a portion of the fourth conductive layer 317 and a portion of the third insulating layer 309 by a droplet discharge method (FIG. 3D).

Next, as shown in FIG. 4A, the fourth liquid-repellent layer 316 is removed. A portion of the third semiconductor layer 313 and the fourth semiconductor layer 314 are simultaneously etched using the third conductive layer 315 and the fourth conductive layer 317 as masks, thereby the fifth semiconductor layer 319 and the sixth semiconductor layer 320 are formed. As a result, the channel length of the thin film transistor can be freely controlled.

By performing one or both of the aforementioned methods, it becomes possible to freely control one or both of the channel length and the length of an overlapped region of a gate electrode and a film for electrically connecting a crystalline semiconductor film such as an impurity semiconductor film which exists adjacent to a channel portion of a circular thin film transistor to a source electrode and a drain electrode.

Embodiment Mode 2

A structure and a manufacturing method of a circular thin film transistor of the invention are described with reference to FIGS. 5A to 7B. It is to be noted in Embodiment Mode 2 that the method described in Embodiment Mode 1 can be used in the case of using a liquid-repellent application method. Further, the materials described in Embodiment Mode 1 can be used as materials used for forming insulating layers (including first to fourth insulating layers in Embodiment Mode 2), liquid-repellent layers (including first to fifth liquid-repellent layers in Embodiment Mode 2), and conductive layers (including first to fifth conductive layers in Embodiment Mode 2).

Figure 5A:
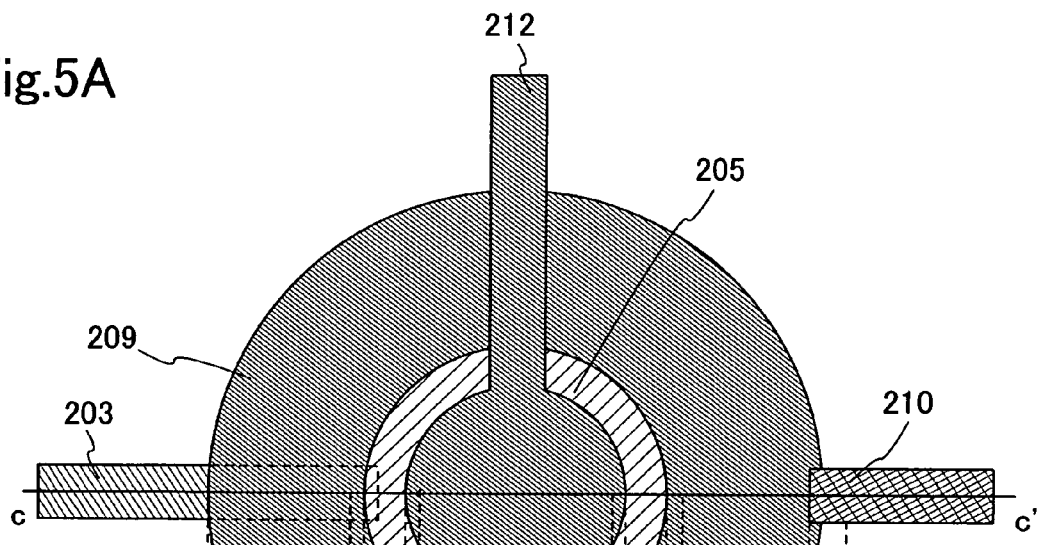
FIGS. 5A and 5B are views showing structure of a circular thin film transistor of Embodiment Mode 2.
Figure 5B:
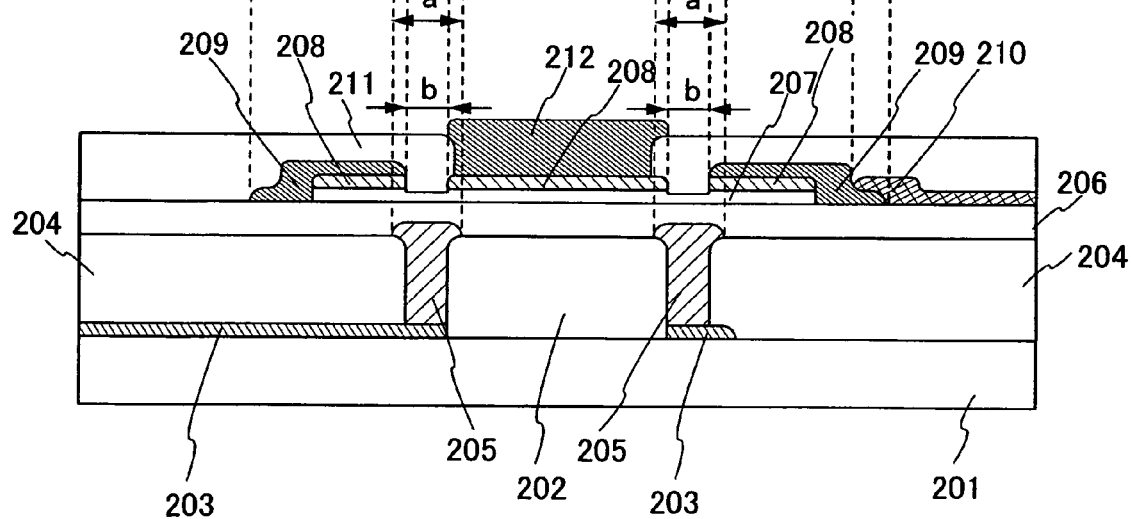

FIG. 5A is a top plan view of a circular thin film transistor of the invention and FIG. 5B is a cross sectional view thereof.

As shown in FIG. 5B, a first insulating layer 202 and a first conductive layer 203 are formed over a substrate 201, and a second insulating layer 204 and a second conductive layer 205 are formed. It is to be noted that the first conductive layer 203 functions as a gate wire here and the second conductive layer 205 functions as a gate electrode here. Note that the second conductive layer 205 is covered with a third insulating layer 206.

Further, semiconductor layers 207 and 208 as active layers are formed over the third insulating layer 206. A third conductive layer 209 which functions as a drain electrode is formed over the semiconductor layer 208 provided apart from a center portion of the circular thin film transistor. It is to be noted that a fourth conductive layer 210 which functions as a drain wire is formed in contact with the third conductive layer 209.

A fourth insulating layer 211 is formed so as to cover the third insulating layer 206, the third conductive layer 209, and the fourth conductive layer 210. A fifth conductive layer 212 which functions as a source electrode and a source wire is formed over the semiconductor layer 208 provided at the center portion of the circular thin film transistor.

It is to be noted that a manufacturing method of the aforementioned circular thin film transistor will be hereinafter described in details.

In Embodiment Mode 2, the third conductive layer 315 and the sixth conductive layer 324 formed in the different steps in Embodiment Mode 1 are formed in the same step. Note that the same steps as those in Embodiment Mode 1 will be described with the same reference numerals in the same drawings, and the description thereof will be omitted here. That is, with reference to FIGS. 6A to 7B, Embodiment Mode 2 will describe the steps after the steps of forming the third semiconductor layer 313 and the fourth semiconductor layer 314 in FIG. 3B in Embodiment Mode 1.

The first mask 312 formed in FIG. 3B is removed and a second mask 340 is formed over the fourth semiconductor layer 314 by a droplet discharge method as shown in FIG. 6A. A fourth liquid-repellent layer 341 is formed over the fourth semiconductor layer 314 and the second mask 340 by a droplet discharge method.

A third conductive layer 342 is formed over a portion of the fourth semiconductor layer 314 and a portion of the third insulating layer 309 by a droplet discharge method. A fourth conductive layer 343 is formed over a portion of the third conductive layer 342 and a portion of the third insulating layer 309 by a droplet discharge method. It is to be noted that the third conductive layer 342 functions as a source electrode or a drain electrode. The fourth conductive layer 343 functions as a lead out wire for the source electrode or a lead out wire for the drain electrode (FIG. 6B).

The fourth liquid-repellent layer 341 is removed and a portion of the third semiconductor layer 313 and the fourth semiconductor layer 314 are simultaneously etched using the second mask 340 and the third conductive layer 342 as masks, thereby a fifth semiconductor layer 344 and a sixth semiconductor layer 345 imparted with p-type or n-type conductivity are formed. It is to be noted that the fifth semiconductor layer 344 functions as an active layer and the sixth semiconductor layer 345 has a function to electrically connect the fifth semiconductor layer 344 which functions as an active layer to a source electrode or a drain electrode formed in a subsequent step (FIG. 6C).

Figure 7A:
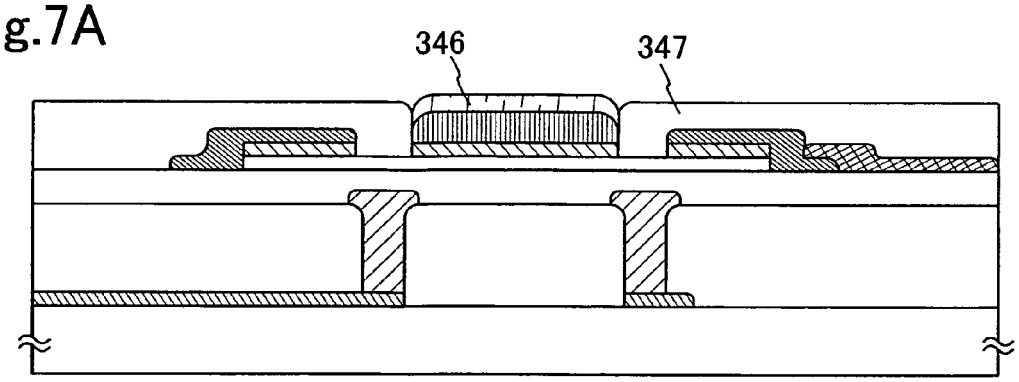
FIGS. 7A and 7B are views showing structure of a circular thin film transistor of Embodiment Mode 2.
Figure 7B:
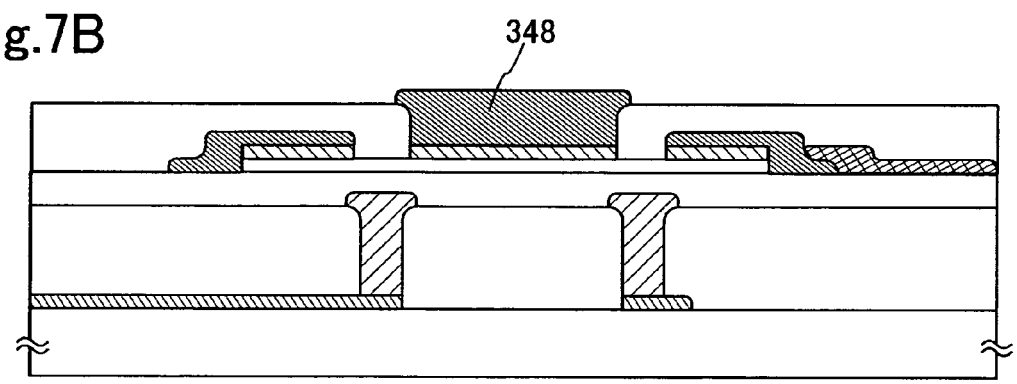

A fifth liquid-repellent layer 346 is formed over the second mask 340 by a droplet discharge method and a fourth insulating layer 347 is formed over the third insulating layer 309, the fifth semiconductor layer 344, the sixth semiconductor layer 345, the third conductive layer 342, and the fourth conductive layer 343 by a droplet discharge method. It is to be noted that the fourth insulating layer 347 functions as an interlayer insulating film (FIG. 7A).

The fifth liquid-repellent layer 346 and the second mask 340 are removed and a fifth conductive layer 348 is formed over the sixth semiconductor layer 345 and the fourth insulating layer 347 by a droplet discharge method. It is to be noted that the fifth conductive layer 348 functions as a source electrode and a lead out wire for the source electrode, or a drain electrode and a lead out wire for the drain electrode.

The film formed by a droplet discharge method by the aforementioned process may be formed by stacking a thin film by a known method such as a sputtering method and an evaporation method. In that case, a thin film transistor having a desired shape can be formed by forming a mask by a droplet discharge method.

However, in the case where a thin film is formed by a known method such as a sputtering method and an evaporation method and thus it is difficult to form the thin film at normal temperatures, it is required that a heat resistant substrate be used and a measure against heat be provided when stacking thin films.

As shown in FIG. 6A, the second mask 340 is formed into an arbitrary size over the fourth semiconductor layer 314 by a droplet discharge method, and the fourth liquid-repellent layer 341 is formed into an arbitrary size over the fourth semiconductor layer 314 and the second mask 340 by a droplet discharge method. Next, the third conductive layer 342 is formed over a portion of the fourth semiconductor layer 314 and a portion of the third insulating layer 309 by a droplet discharge method. Further, the fourth conductive layer 343 is formed over a portion of the third conductive layer 342 and a portion of the third insulating layer 309 by a droplet discharge method. It is to be noted that the third conductive layer 342 functions as a source electrode or a drain electrode. The fourth conductive layer 343 functions as a lead out wire for the source electrode or a lead out wire for the drain electrode (FIG. 6B).

The fourth liquid-repellent layer 341 is removed and a portion of the third semiconductor layer 313 and the fourth semiconductor layer 314 are simultaneously etched using the second mask 340 and the third conductive layer 342 as masks, thereby the fifth semiconductor layer 344 and the sixth semiconductor layer 345 imparted with p-type or n-type conductivity are formed. As a result, the channel length of the thin film transistor can be freely controlled.

By performing one or both of the aforementioned methods, it becomes possible to freely control one or both of the channel length and the length of an overlapped region of a gate electrode and a film for electrically connecting a crystalline semiconductor film such as an impurity semiconductor film which exists adjacent to a channel portion of a circular thin film transistor to a source electrode and a drain electrode.

Embodiment Mode 3

A structure and a manufacturing method of a circular thin film transistor of the invention will be described with reference to FIGS. 8A to 11B. It is to be noted in Embodiment Mode 3 that the method described in Embodiment Mode 1 can be used in the case of using a liquid-repellent application method. Further, the materials described in Embodiment Mode 1 can be used as materials used for forming insulating layers (including first to fourth insulating layers in Embodiment Mode 3), liquid-repellent layers (including first to sixth liquid-repellent layers in Embodiment Mode 3), and conductive layers (including first to sixth conductive layers in Embodiment Mode 3).

Figure 8A:
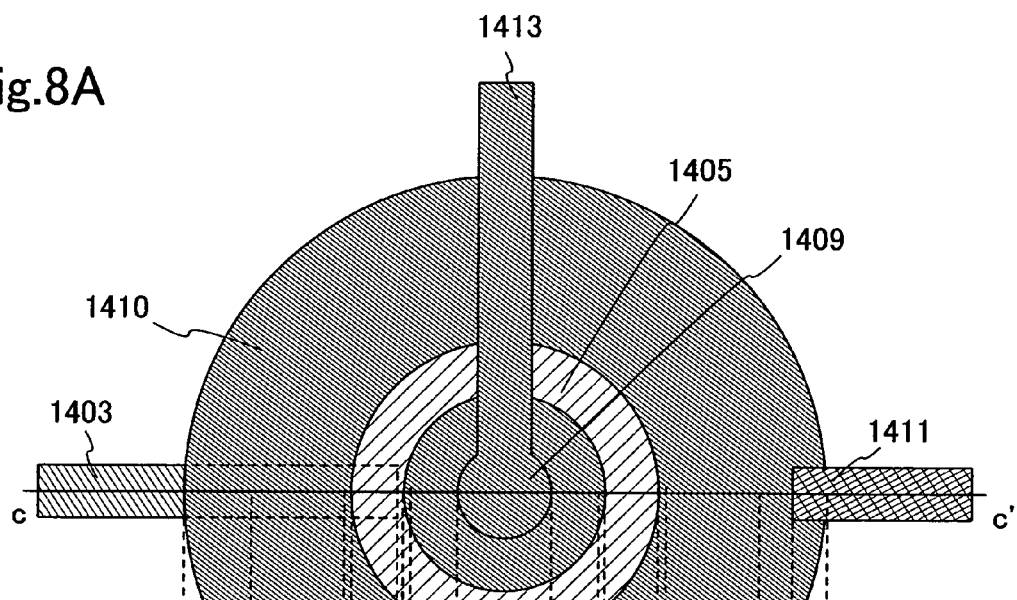
FIGS. 8A and 8B are views showing structure of a circular thin film transistor of Embodiment Mode 3.
Figure 8B:
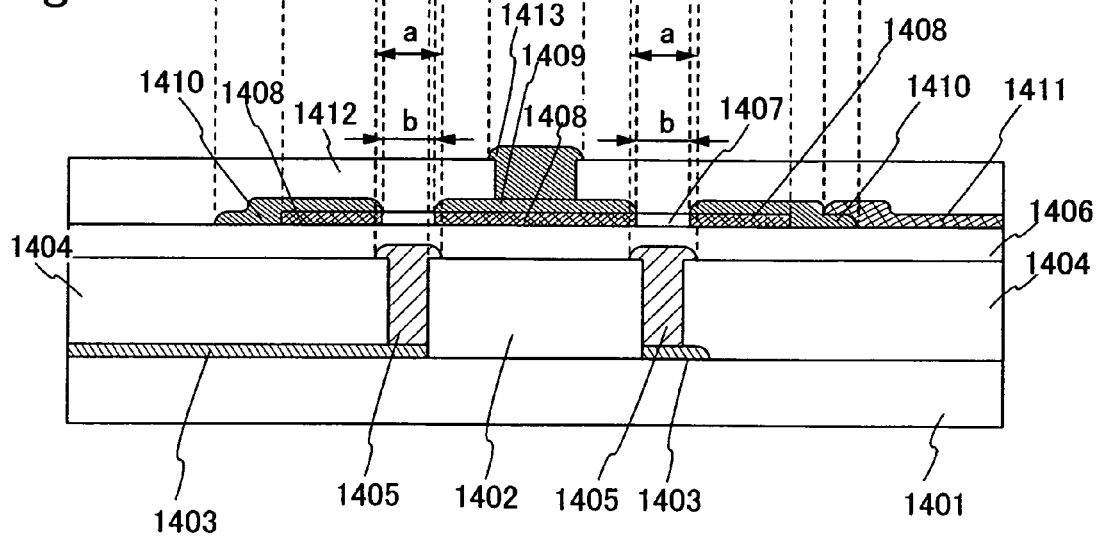

FIG. 8A is a top plan view of a circular thin film transistor of the invention and FIG. 8B is a cross sectional view thereof.

As shown in FIG. 8B, a first insulating layer 1402 and a first conductive layer 1403 are formed over a substrate 1401, and a second insulating layer 1404 and a second conductive layer 1405 are formed. It is to be noted that the first conductive layer 1403 functions as a gate wire here and the second conductive layer 1405 functions as a gate electrode here. Note that the second conductive layer 1405 is covered with a third insulating layer 1406.

Further, semiconductor layers 1407 and 1408 as active layers are formed over the third insulating layer 1406. The semiconductor layers 1408 are formed by adding impurities which impart p-type or n-type conductivity to a portion of the semiconductor layer 1407. A third conductive layer 1409 which functions as a source electrode is formed over the semiconductor layer 1408 provided at a center portion of the circular thin film transistor. A fourth conductive layer 1410 which functions as a drain electrode is formed over the semiconductor layer 1408 provided apart from the center portion of the circular thin film transistor. It is to be noted that a fifth conductive layer 1411 which functions as a drain wire is formed in contact with the fourth conductive layer 1410.

A fourth insulating layer 1412 is formed so as to cover the third insulating layer 1406, the fourth conductive layer 1410, and the fifth conductive layer 1411. A sixth conductive layer 1413 which functions as a source wire is formed in contact with the third conductive layer 1409.

A manufacturing method of the aforementioned circular thin film transistor will be hereinafter described in details.

Embodiment Mode 3 will describe a manufacturing method of the case where a structure of semiconductor layers is different from that in Embodiment Mode 1 or 2. Note that the same steps as those in Embodiment Mode 1 will be described with the same reference numerals in the same drawings, and the description thereof will be omitted here. That is, with reference to FIGS. 9A to 11B, Embodiment Mode 3 will describe the steps after the steps of forming the second conductive layer 308 in FIG. 2D in Embodiment Mode 1.

Figure 9A:
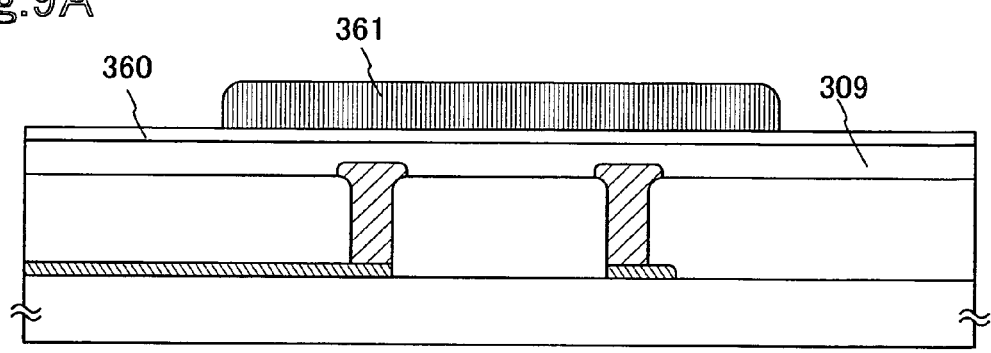
FIGS. 9A to 9D are views showing a manufacturing method of a circular thin film transistor of Embodiment Mode 3.
Figure 9B:
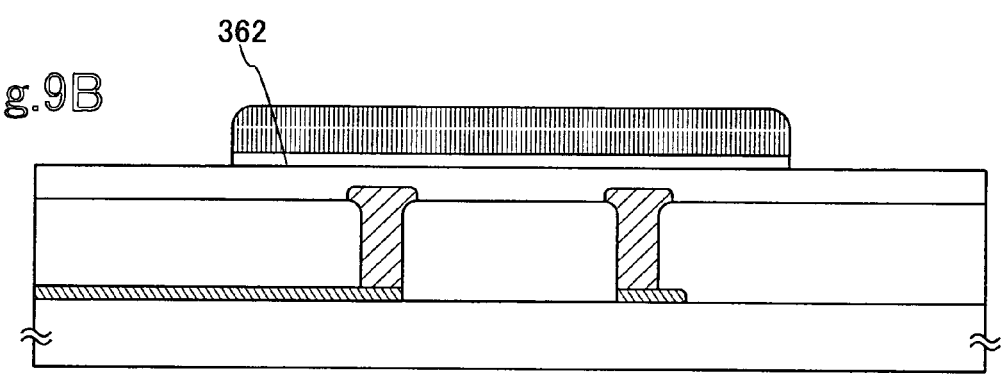

As shown in FIG. 9A, the third liquid-repellent layer 307 is removed and the third insulating layer 309 is formed over the second conductive layer 308, the first insulating layer 302, and the second insulating layer 306. It is to be noted that the third insulating layer 309 functions as a gate insulating film. Next, a first semiconductor layer 360 is formed over the third insulating layer 309 and a first mask 361 is formed over the first semiconductor layer 360 by a droplet discharge method. The first semiconductor layer 360 is etched using the first mask 361, thereby a second semiconductor layer 362 is formed. It is to be noted that the second semiconductor layer 362 functions as an active layer (FIG. 9B).

Figure 9C:
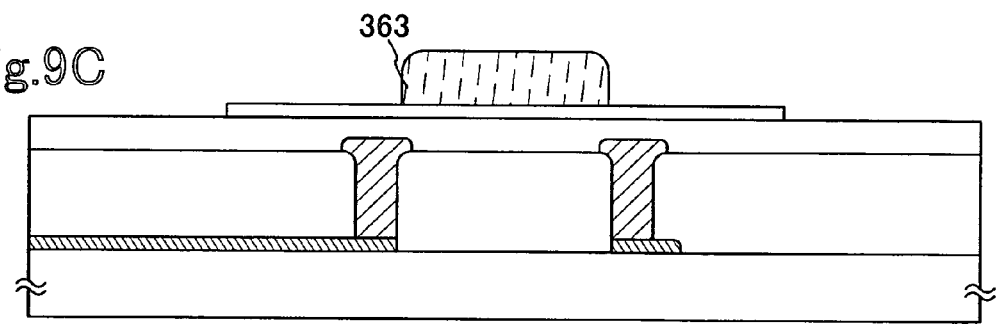
Figure 9D:
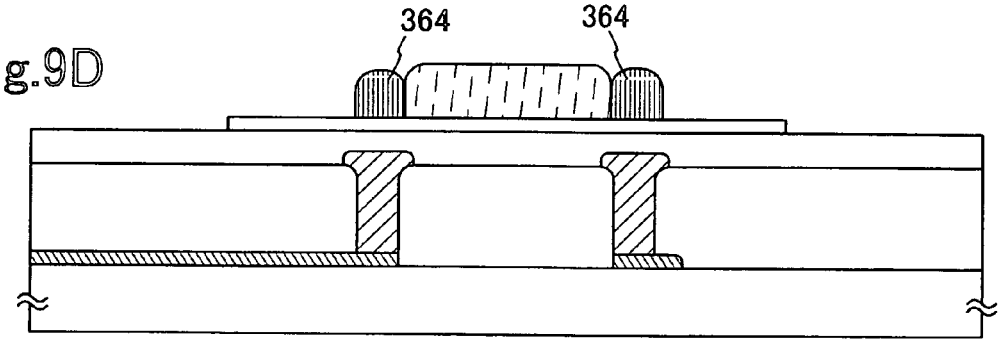

The first mask 361 is removed and a fourth liquid-repellent layer 363 is formed over the second semiconductor layer 362 by a droplet discharge method. A second mask 364 is formed over the second semiconductor layer 362 by a droplet discharge method (FIGS. 9C and 9D).

Figure 10A:
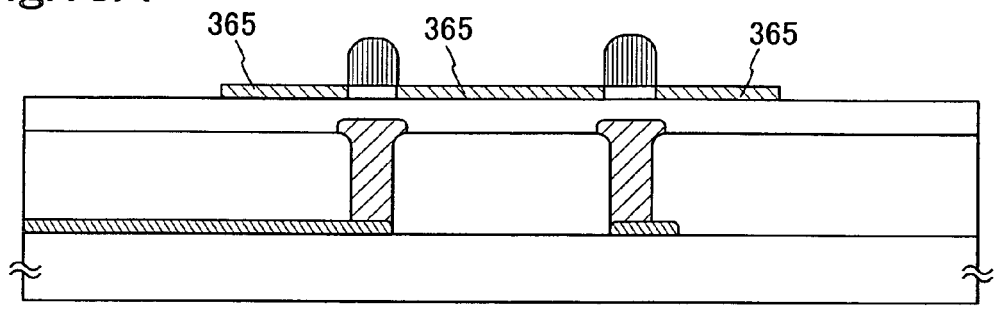
FIGS. 10A to 10D are views showing a manufacturing method of a circular thin film transistor of Embodiment Mode 3.

The fourth liquid-repellent layer 363 is removed and high or low concentration impurities which impart p-type or n-type conductivity are added to the second semiconductor layer 362 using the second mask 364, thereby a third semiconductor layer 365 is formed over a portion of the second semiconductor layer 362. It is to be noted that the third semiconductor layer 365 is imparted with p-type or n-type conductivity and has a function to electrically connect an active layer and an electrode (FIG. 10A).

Figure 10B:
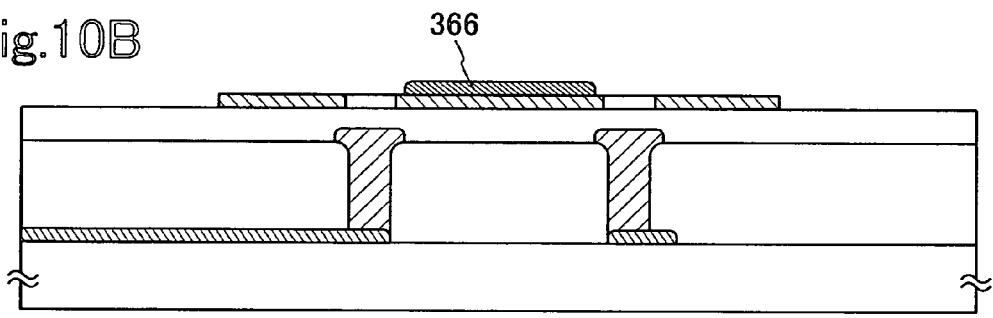

The second mask 364 is removed and a third conductive layer 366 is formed over the third semiconductor layer 365 by a droplet discharge method. It is to be noted that the third conductive layer 366 functions as a source electrode or a drain electrode (FIG. 10B).

Figure 10C:
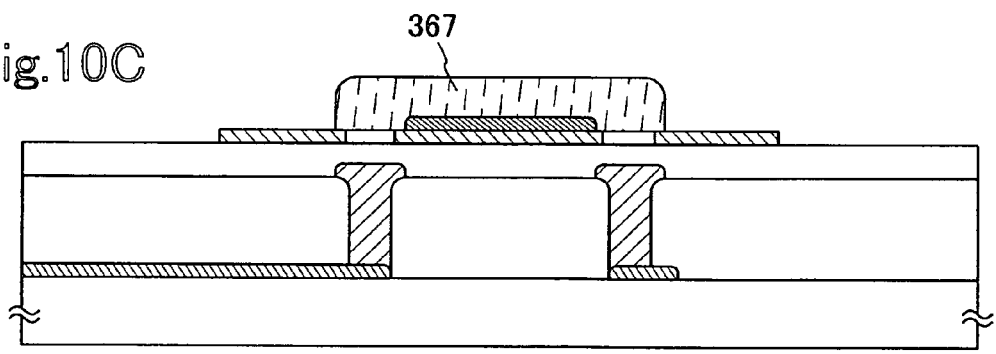

A fifth liquid-repellent layer 367 is formed over the second semiconductor layer 362 and the third conductive layer 366 by a droplet discharge method (FIG. 10C).

Figure 10D:
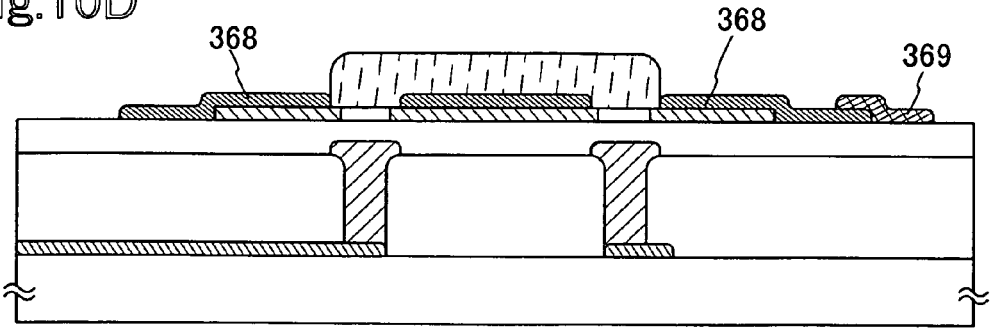

A fourth conductive layer 368 is formed so as to be in contact with the third semiconductor layer 365 by a droplet discharge method. Further, a fifth conductive layer 369 is formed so as to be in contact with the fourth conductive layer 368 by a droplet discharge method. It is to be noted that the fourth conductive layer 368 functions as a drain electrode or a source electrode. The fifth conductive layer 369 functions as a lead out wire for the drain electrode or a lead out wire for the source electrode (FIG. 10D).

Figure 11A:
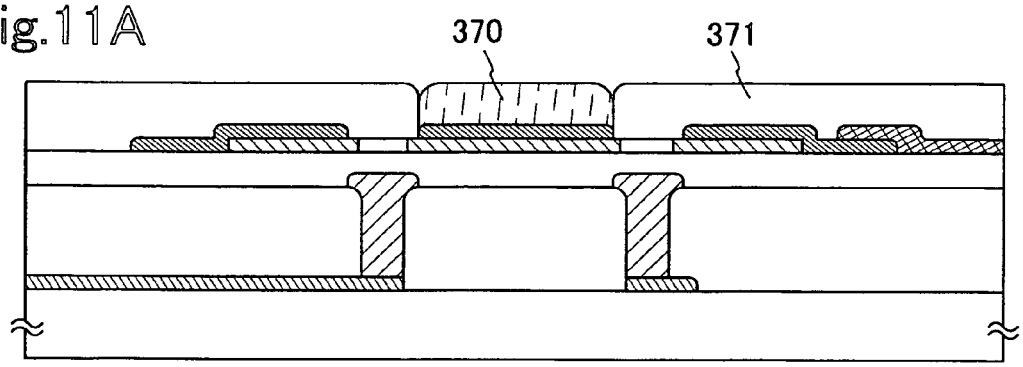
FIGS. 11A and 11B are views showing a manufacturing method of a circular thin film transistor of Embodiment Mode 3.
Figure 11B:
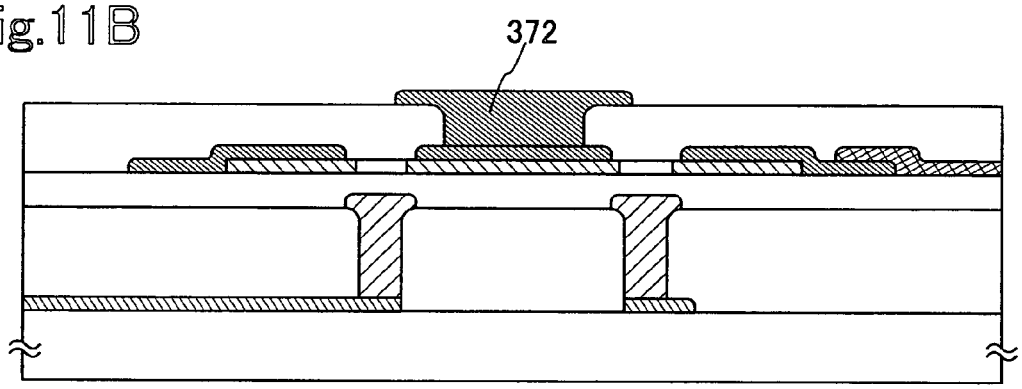

The fifth liquid-repellent layer 367 is removed and a sixth liquid-repellent layer 370 is formed over the third conductive layer 366 by a droplet discharge method. A fourth insulating layer 371 is formed over the third insulating layer 309, the second semiconductor layer 362, the fourth conductive layer 368, and the fifth conductive layer 369. It is to be noted that the fourth insulating layer 371 functions as an interlayer insulating film (FIG. 11A).

The sixth liquid-repellent layer 370 is removed and a sixth conductive layer 372 is formed so as to be in contact with the third conductive layer 366 by a droplet discharge method. It is to be noted that the sixth conductive layer 372 functions as a source electrode and a lead out wire for the source electrode, or a drain electrode and a lead out wire for the drain electrode.

The function of the third conductive layer 366 can be realized by forming the sixth conductive layer 372 instead of forming the third conductive layer 366 formed in the aforementioned manufacturing step. In that case, liquid-repellent treatment is applied so that other elements than an electrode are not formed over the third semiconductor layer 365 instead of forming the third conductive layer 366. In other words, the liquid-repellent treatment which is applied to the third conductive layer 366 is applied to the third semiconductor layer 365, the steps shown in FIGS. 10D and 11A are performed, and the liquid-repellent treatment applied to the third semiconductor layer 365 instead of forming the third conductive layer 366 so that other elements than an electrode are not formed is removed, thereby the sixth conductive layer 372 having a function as the third conductive layer 366 can be formed.

In Embodiment Mode 3, a conductive layer which functions as a source electrode or a drain electrode can be completed by forming the third conducive layer 366 and the fourth conductive layer 368 over the third semiconductor layer 365 by a droplet discharge method without removing the second mask 364. In this case, the second mask 364 is required to be formed of a substance which does not have an adverse effect on subsequent steps, such as an insulating material. Leaving the second mask 364 as described above is effective in reducing manufacturing time and cost and further planarizing the film.

The film formed by a droplet discharge method by the aforementioned process may be formed by stacking a thin film by a known method such as a sputtering method and an evaporation method. In that case, a thin film transistor having a desired shape can be formed by forming a mask by a droplet discharge method.

However, in the case where a thin film is formed by a known method such as a sputtering method and an evaporation method and thus it is difficult to form the thin film at normal temperatures, it is required that a heat resistant substrate be used and a measure against heat be provided when stacking thin films.

The fourth liquid-repellent layer 363 is formed into an arbitrary size over the second semiconductor layer 362 by a droplet discharge method. The second mask 364 is formed into an arbitrary size over the semiconductor layer 362 by a droplet discharge method (FIGS. 9C and 9D). The fourth liquid-repellent layer 363 is removed and high or low concentration impurities which impart p-type or n-type conductivity are added to the second semiconductor layer 362 using the second mask 364, thereby the third semiconductor layer 365 is formed in a portion of the second semiconductor layer 362. As a result, the channel length of the thin film transistor can be freely controlled.

By performing one or both of the aforementioned methods, it becomes possible to freely control one or both of the channel length and the length of an overlapped region of a gate electrode and a film (for example, a semiconductor film imparted with p-type or n-type conductivity) for electrically connecting a crystalline semiconductor film such as an impurity semiconductor film which exists adjacent to a channel portion of a circular thin film transistor to a source electrode and a drain electrode.

Embodiment Mode 4

A structure and a manufacturing method of a circular thin film transistor of the invention will be described with reference to FIGS. 12A to 14B. It is to be noted in Embodiment Mode 4 that the method described in Embodiment Mode 1 can be used in the case of using a liquid-repellent application method. Further, the materials described in Embodiment Mode 1 can be used as materials used for forming insulating layers (including first to fourth insulating layers in Embodiment Mode 4), liquid-repellent layers (including first to sixth liquid-repellent layers in Embodiment Mode 4), and conductive layers (including first to sixth conductive layers in Embodiment Mode 4).

FIG. 12A is a top plan view of a circular thin film transistor of the invention and FIG. 12B is a cross sectional view thereof.

As shown in FIG. 12B, a first insulating layer 502 and a first conductive layer 503 are formed over a substrate 501, and a second insulating layer 504 and a second conductive layer 505 are formed. It is to be noted that the first conductive layer 503 functions as a gate wire here and the second conductive layer 505 functions as a gate electrode. Note that the second conductive layer 505 is covered with a third insulating layer 506.

Further, semiconductor layers 507 and 508 as active layers are formed over the third insulating layer 506. The semiconductor layers 508 are formed by adding impurities which impart p-type or n-type conductivity to a portion of the semiconductor layer 507. A third conductive layer 509 which functions as a drain electrode is formed over the semiconductor layer 508 provided apart from a center portion of the circular thin film transistor. It is to be noted that a fourth conductive layer 510 which functions as a drain wire is formed in contact with the third conductive layer 509.

A fourth insulating layer 511 is formed so as to cover the third insulating layer 506, the third conductive layer 509, and the fourth conductive layer 510. A fifth conductive layer 512 which functions as a source electrode and a source wire is formed over the semiconductor layer 508 provided at the center portion of the circular thin film transistor.

A manufacturing method of the aforementioned circular thin film transistor will be hereinafter described in details.

In Embodiment Mode 4, the third conductive layer 366 and the sixth conductive layer 372 formed in the different steps in Embodiment Mode 3 are formed in the same step. Note that the same steps as those in Embodiment Modes 1 and 3 will be described with the same reference numerals in the same drawings, and the description thereof will be omitted here. That is, with reference to FIGS. 13 to 14B, Embodiment Mode 4 will describe the steps after the steps of forming the third semiconductor layer 365 in FIG. 10A in Embodiment Mode 3.

Figure 13:
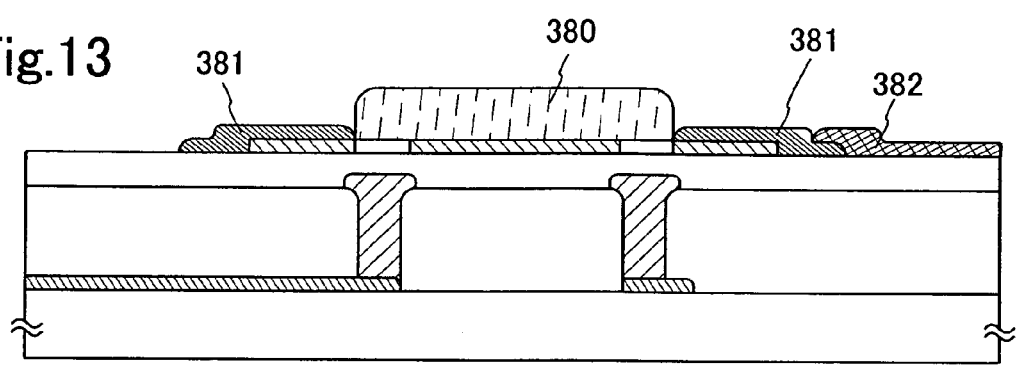
FIG. 13 is a view showing a manufacturing method of a circular thin film transistor of Embodiment Mode 4.

As shown in FIG. 13, the second mask 364 is removed and a third conductive layer 381 is formed over the third semiconductor layer 365 and the third insulating layer 309 and a fourth conductive layer 382 is formed over the third conductive layer 381 and the third insulating layer 309 by a droplet discharge method. As a result, a third conductive layer which functions as a source electrode or a drain electrode and a fourth conductive layer which functions as a source electrode or a drain electrode are completed.

By forming a third conductive layer over the third semiconductor layer by a droplet discharge method without removing the second mask, a conductive layer which functions as a source electrode or a drain electrode can be formed. The second mask can be used as an insulating layer as it is, therefore, a substance which does not have an adverse effect on subsequent steps is required to be used.

Figure 14A:
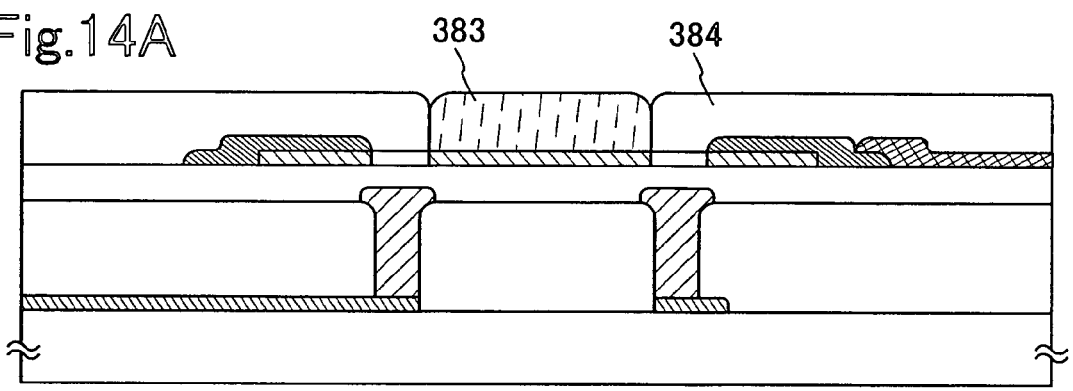
FIGS. 14A and 14B are views showing a manufacturing method of a circular thin film transistor of Embodiment Mode 4.

The fifth liquid-repellent layer is removed and a sixth liquid-repellent layer is formed over the third semiconductor layer by a droplet discharge method. By forming a fourth insulating layer over a portion of the fourth conductive layer, the third insulating layer, the second semiconductor layer, and the third conductive layer by a droplet discharge method, an insulating film which functions as an interlayer insulating film can be formed (FIG. 14A).

Figure 14B:
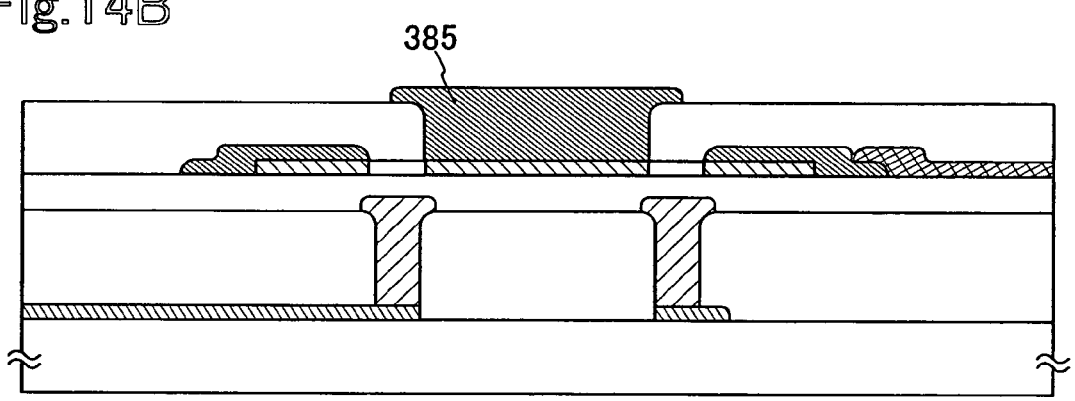

The sixth liquid-repellent layer is removed and a sixth conductive layer 385 is formed in contact with the third semiconductor layer by a droplet discharge method. As a result, a conductive layer which functions as a source electrode and a lead out wire for the source electrode, or a drain electrode and a lead out wire for the drain electrode is completed (FIG. 14B).

In Embodiment Mode 4, the second mask 364 is removed, however, it is not necessarily removed. In this case, the second mask 364 is required to be formed of a substance which does not have an adverse effect, such as an insulator. Leaving the second mask 346 as described above is effective in reducing manufacturing time and cost and further planarizing the film.

The film formed by a droplet discharge method by the aforementioned process may be formed by stacking a thin film by a known method such as a sputtering method and an evaporation method. In that case, a thin film transistor having a desired shape can be formed by forming a mask by a droplet discharge method.

However, in the case where a thin film is formed by a known method such as a sputtering method and an evaporation method and thus it is difficult to form the thin film at normal temperatures, it is required that a heat resistant substrate be used and a measure against heat be provided when stacking thin films.

By performing one or both of the aforementioned methods, it becomes possible to freely control one or both of the channel length and the length of an overlapped region of a gate electrode and a film (for example, a semiconductor film imparted with p-type or n-type conductivity) for electrically connecting a crystalline semiconductor film such as an impurity semiconductor film which exists adjacent to a channel portion of a circular thin film transistor to a source electrode and a drain electrode.

Embodiment Mode 5

A structure and a manufacturing method of a circular thin film transistor of the invention will be described with reference to FIGS. 15A to 18B. It is to be noted in Embodiment Mode 5 that the method described in Embodiment Mode 1 can be used in the case of using a liquid-repellent application method. Further, the materials described in Embodiment Mode 1 can be used as materials used for forming insulating layers (including first and second insulating layers in Embodiment Mode 5), liquid-repellent layers (including first to sixth liquid-repellent layers in Embodiment Mode 5), and conductive layers (including first to sixth conductive layers in Embodiment Mode 5).

Figure 15A:
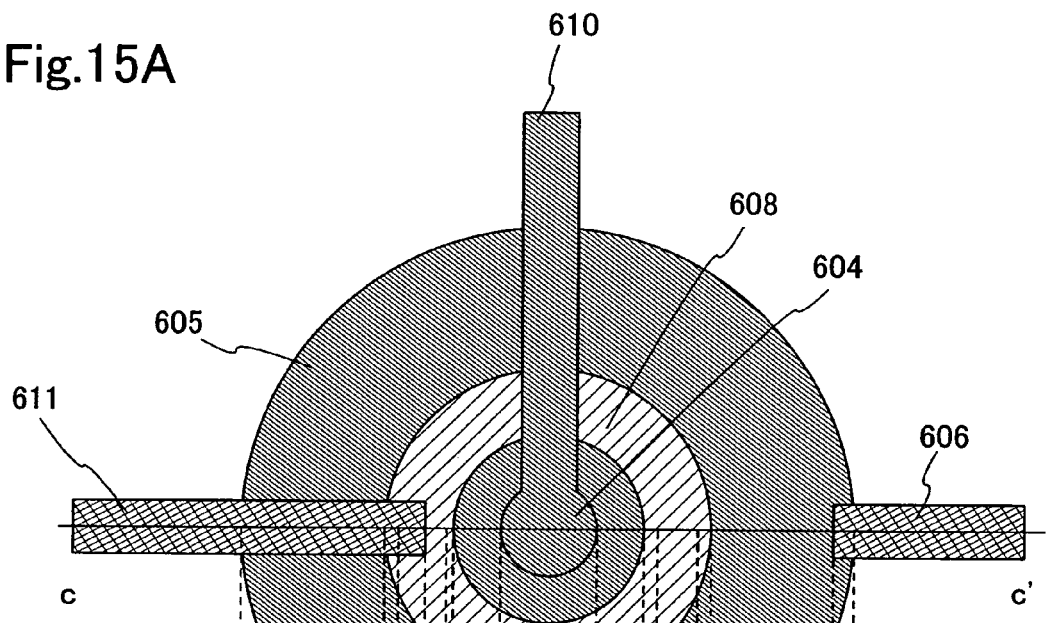
FIGS. 15A and 15B are views showing structures of a circular thin film transistor of Embodiment Mode 5.
Figure 15B:
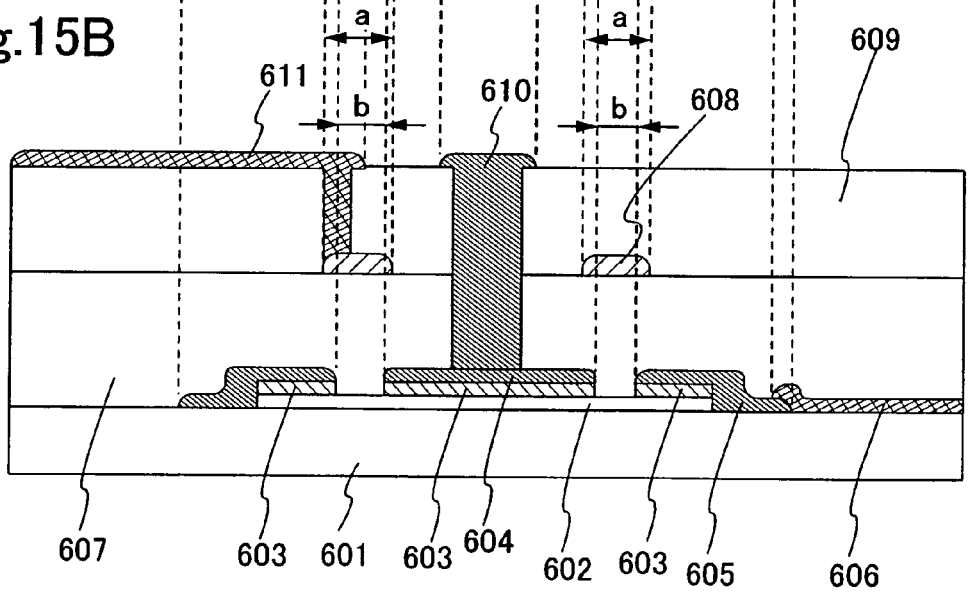

FIG. 15A is a top plan view of a circular thin film transistor of the invention and FIG. 15B is a cross sectional view thereof.

As shown in FIG. 15B, semiconductor layers 602 and 603 as active layers are formed over a substrate 601. A first conductive layer 604 which functions as a source electrode is formed over the semiconductor layer 603 provided at a center portion of the circular thin film transistor. A second conductive layer 605 which functions as a drain electrode is formed over the semiconductor layer 603 provided apart from the center portion of the circular thin film transistor. It is to be noted that a third conductive layer 606 which functions as a drain wire is formed in contact with the second conductive layer 605.

A first insulating layer 607 is formed so as to cover the substrate 601, the second conductive layer 605, and the third conductive layer 606. A fourth conductive layer 608 which functions as a gate electrode is formed over the first insulating layer 607 and a second insulating layer 609 is formed over the first insulating layer 607 and the fourth conductive layer 608. A fifth conductive layer 610 which functions as a source wire is formed in contact with the first conductive layer 604 and a sixth conductive layer 611 which functions as a gate wire is formed in contact with the fourth conductive layer 608 over the second insulating layer 609.

A manufacturing method of a thin film transistor of the invention is described with reference to FIGS. 16A to 18B.

Figure 16A:
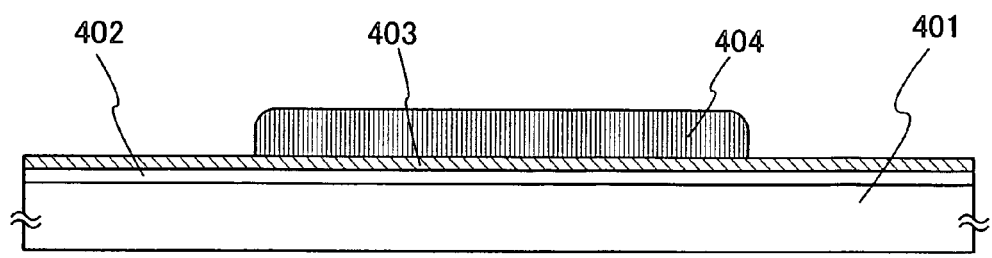
FIGS. 16A to 16D are views showing a manufacturing method of a circular thin film transistor of Embodiment Mode 5.
Figure 16B:
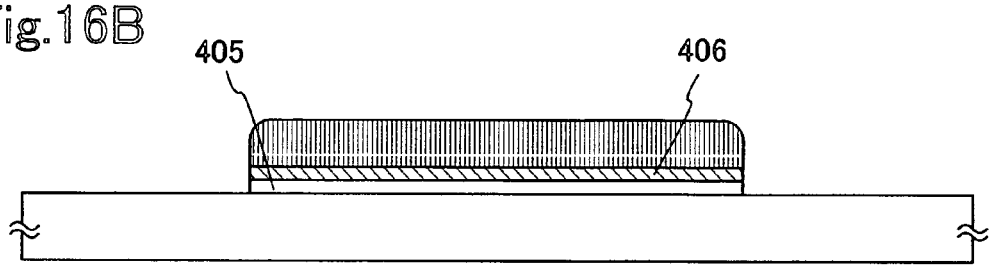

A first semiconductor layer 402 is stacked over a substrate 401 and a second semiconductor layer 403 imparted with p-type or n-type conductivity is stacked over the first semiconductor layer 402. A first mask 404 is formed over the second semiconductor layer 403 by a droplet discharge method. A portion of the first semiconductor layer 402 and the second semiconductor layer 403 are etched using the first mask 404, thereby a third semiconductor layer 405 and a fourth semiconductor layer 406 are formed (FIGS. 16A and 16B).

Figure 16C:
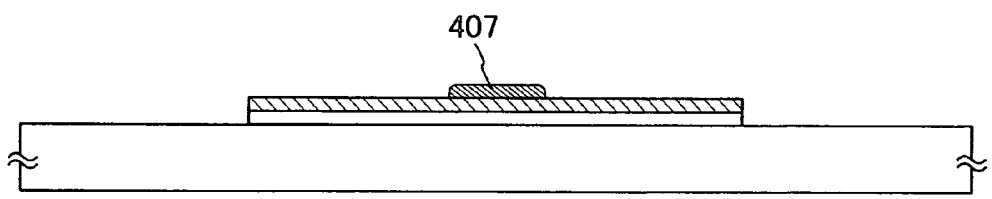

The first mask 404 is removed and a first conductive layer 407 is formed over the second semiconductor layer 403 by a droplet discharge method. It is to be noted that the first conductive layer 407 functions as a source electrode or a drain electrode (FIG. 16C).

Figure 16D:
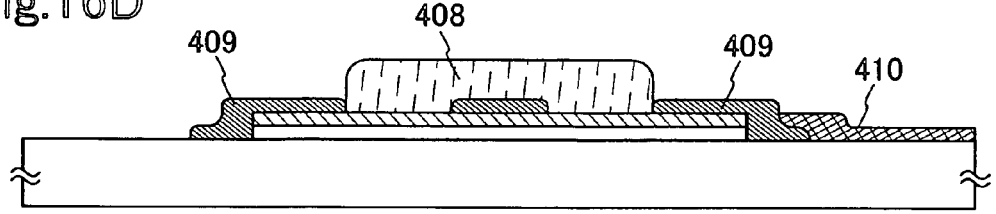

A first liquid-repellent layer 408 is formed over the first conductive layer 407 and a portion of the fourth semiconductor layer 406. A second conductive layer 409 is formed over the substrate 401 and the fourth semiconductor layer 406 which is not covered with the first liquid-repellent layer 408 by a droplet discharge method. A third conductive layer 410 is formed so as to be in contact with the second conductive layer 409 over the substrate 401 and the second semiconductor layer 403. It is to be noted that the second conductive layer 409 functions as a source electrode or a drain electrode. The third conductive layer 410 functions as a lead out wire for the source electrode or a lead out wire for the drain electrode (FIG. 16D).

Figure 17A:
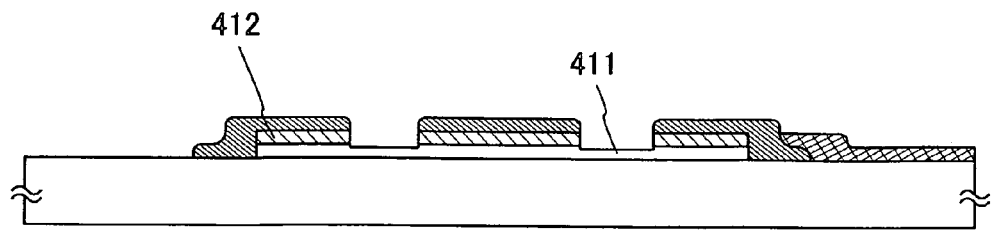
FIGS. 17A to 17D are views showing a manufacturing method of a circular thin film transistor of Embodiment Mode 5.

The first liquid-repellent layer 408 is removed and a portion of the third semiconductor layer 405 and the fourth semiconductor layer 406 imparted with p-type or n-type conductivity are etched using the first conductive layer 407 and the second conductive layer 409 as masks, thereby a fifth semiconductor layer 411 and a sixth semiconductor layer 412 are formed. It is to be noted that the fifth semiconductor layer 411 functions as an active layer. The sixth semiconductor layer 412 has a function to electrically connect the fifth semiconductor layer 411 which functions as an active layer to the first conductive layer 407 or the second conductive layer 409 which functions as a source electrode or a drain electrode (FIG. 17A).

Figure 17B:
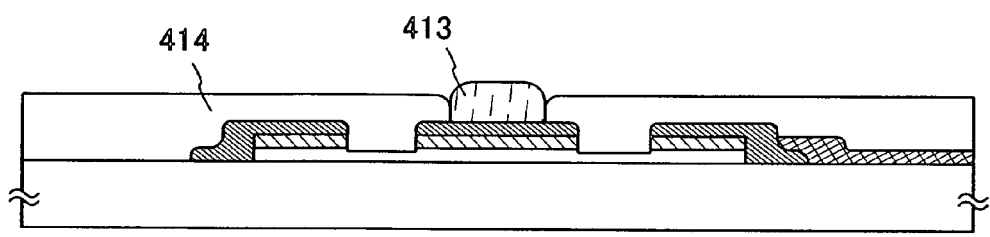

The second liquid-repellent layer 413 is formed over the first conductive layer 407 by a droplet discharge method. A first insulating layer 414 is formed over the substrate 401, the second conductive layer 409, the third conductive layer 410, and the fifth semiconductor layer 411 by a droplet discharge method. It is to be noted that the first insulating layer 414 functions as a gate insulating film (FIG. 17B).

Figure 17C:
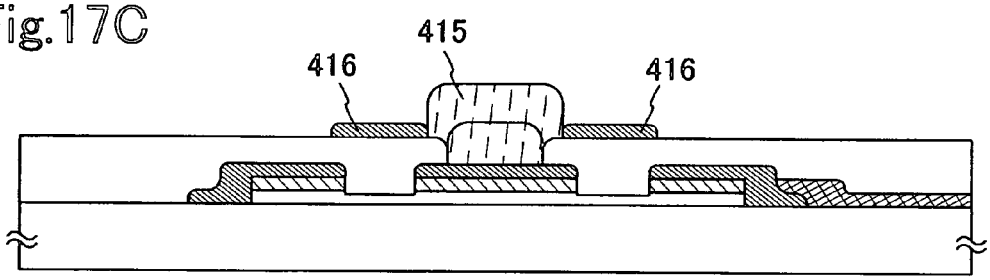

A third liquid-repellent layer 415 is formed over the second liquid-repellent layer 413 and the first insulating layer 414 by a droplet discharge method. A fourth conductive layer 416 is formed over the first insulating layer 414 by a droplet discharge method. It is to be noted that the fourth conductive layer 416 functions as a gate electrode (FIG. 17C).

Figure 17D:
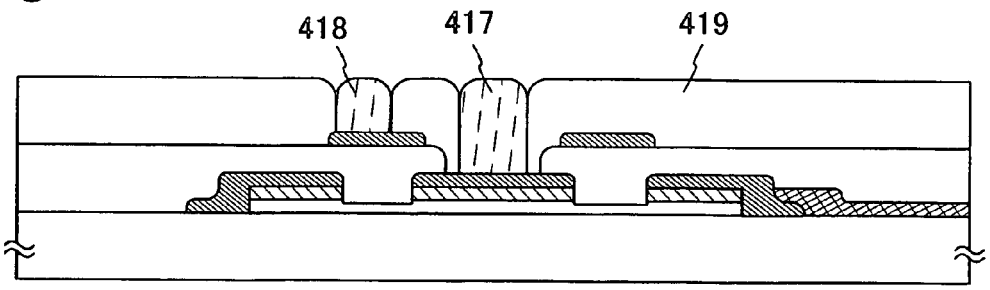

The second liquid-repellent layer 413 and the third liquid-repellent layer 415 are removed and a fourth liquid-repellent layer 417 is formed over the first conductive layer 407 by a droplet discharge method and a fifth liquid-repellent layer 418 is formed over the fourth conductive layer 416 by a droplet discharge method. A second insulating layer 419 is formed over the first insulating layer 414 by a droplet discharge method. It is to be noted that the second insulating layer 419 functions as an interlayer insulating film (FIG. 17D).

The fourth liquid-repellent layer 417 and the fifth liquid-repellent layer 418 are removed. A fifth conductive layer 420 and a sixth conductive layer 421 are independently formed so as to be in contact with the first conductive layer 407 and the fourth conductive layer 416 over the second insulating layer 419 respectively by a droplet discharge method. The fifth conductive layer 420 functions as a lead out wire for the source electrode or the drain electrode and the sixth conductive layer 421 functions as a lead out wire for the gate electrode (FIG. 18A).

As shown in FIG. 18B, the fourth liquid-repellent layer and the fifth liquid-repellent layer may be removed. A sixth liquid-repellent layer 422 may be formed over the second insulating layer by a droplet discharge method. The fifth conductive layer 420 and the sixth conductive layer 421 may be simultaneously formed by a droplet discharge method so as to be in contact with the first conductive layer 407 and the fourth conductive layer 416 respectively over the second insulating layer 419. By removing the sixth liquid-repellent layer 422, the sixth conductive layer 421 which functions as a lead out wire for a gate electrode and the fifth conductive layer 420 which functions as a lead out wire for the source electrode or the drain electrode may be formed.

The film formed by a droplet discharge method by the aforementioned process may be formed by stacking a thin film by a known method such as a sputtering method and an evaporation method. In that case, a thin film transistor having a desired shape can be formed by forming a mask by a droplet discharge method.

However, in the case where a thin film is formed by a known method such as a sputtering method and an evaporation method and thus it is difficult to form the thin film at normal temperatures, it is required that a heat resistant substrate be used and a measure against heat be provided when stacking thin films.

The first conductive layer 407 is formed into an arbitrary size over the second semiconductor layer 403 by a droplet discharge method. It is to be noted that the first conductive layer 407 functions as a source electrode or a drain electrode (FIG. 16C). The first liquid-repellent layer 408 is formed into an arbitrary size over the first conductive layer 407 and a portion of the fourth semiconductor layer 406 by a droplet discharge method. The second conductive layer 409 is formed over the substrate 401 and the fourth semiconductor layer 406 which is not covered with the first liquid-repellent layer 408 by a droplet discharge method. The third conductive layer 410 is formed so as to be in contact with the second conductive layer 409 over the substrate 401. It is to be noted that the second conductive layer 409 functions as a source electrode or a drain electrode while the third conductive layer 410 functions as a lead out wire for the source electrode or a lead out wire for the drain electrode (FIG. 16D).

The first liquid-repellent layer 408 is removed and a portion of the third semiconductor layer 405 and the fourth semiconductor layer 406 imparted with p-type or n-type conductivity are etched using the first conductive layer 407 and the second conductive layer 409 as masks, thereby the fifth semiconductor layer 411 and the sixth semiconductor layer 412 are formed. It is to be noted that the fifth semiconductor layer 411 functions as an active layer while the sixth semiconductor layer 412 has a function to electrically connect the fifth semiconductor layer 411 which functions as an active layer to the first conductive layer 407 or the second conductive layer 409 which functions as a source electrode or a drain electrode (FIG. 17A). As a result, the channel length of the thin film transistor can be freely controlled.

The third liquid-repellent layer 415 is formed into an arbitrary size over the second liquid-repellent layer 413 and the first insulating layer 414. A fourth conductive layer 416 is formed into an arbitrary size over the first insulating layer 414 by a droplet discharge method (FIG. 17C). As a result, the length of a gate electrode in a channel direction can be controlled.

By performing one or both of the aforementioned methods, it becomes possible to freely control one or both of the channel length and the length of an overlapped region which is formed, interposing a gate insulating film, of a gate electrode and a film (for example, a semiconductor film imparted with p-type or n-type conductivity) for electrically connecting a crystalline semiconductor film such as an impurity semiconductor film which exists adjacent to a channel portion of a circular thin film transistor to a source electrode and a drain electrode.

Embodiment Mode 6

A structure and a manufacturing method of a circular thin film transistor of the invention will be described with reference to FIGS. 19A to 21D. It is to be noted in Embodiment Mode 6 that the method described in Embodiment Mode 1 can be used in the case of using a liquid-repellent application method. Further, the materials described in Embodiment Mode 1 can be used as materials used for forming insulating layers (including first and second insulating layers in Embodiment Mode 6), liquid-repellent layers (including first to sixth liquid-repellent layers in Embodiment Mode 6), and conductive layers (including first to fifth conductive layers in Embodiment Mode 6).

Figure 19A:
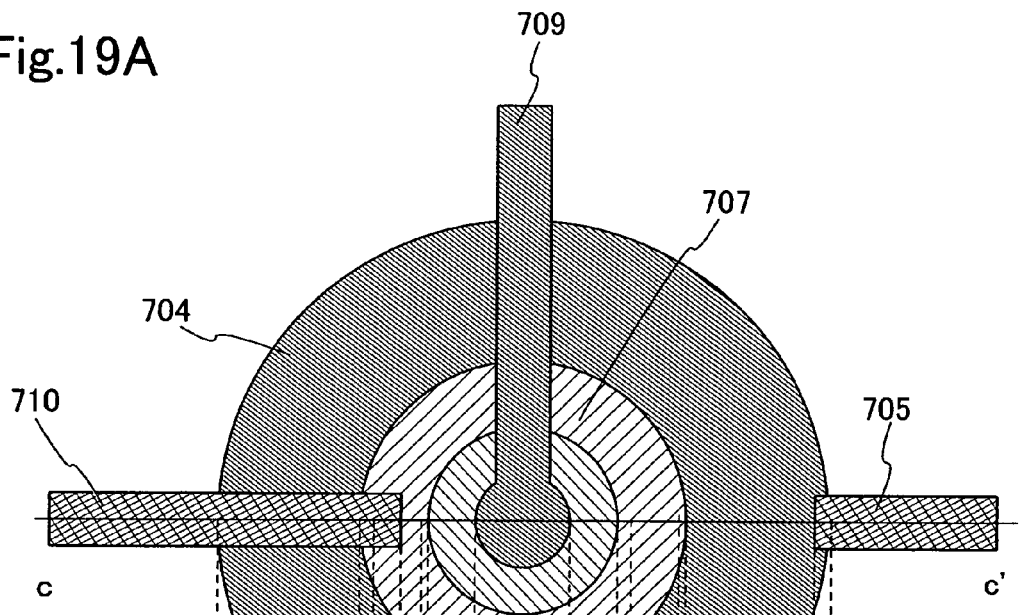
FIGS. 19A and 19B are views showing structures of a circular thin film transistor of Embodiment Mode 6.
Figure 19B:
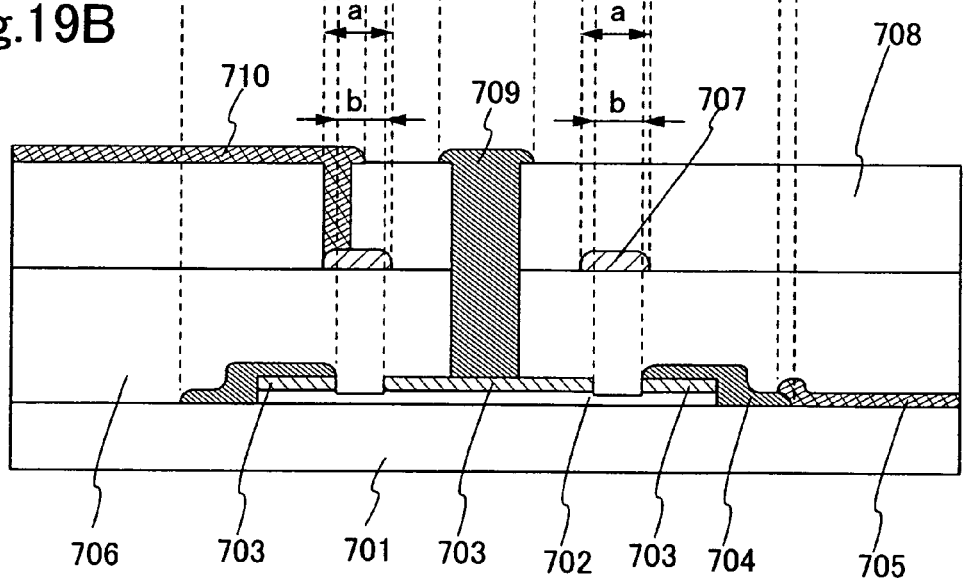

FIG. 19A is a top plan view of a circular thin film transistor of the invention and FIG. 19B is a cross sectional view thereof.

As shown in FIG. 19B, semiconductor layers 702 and 703 as active layers are formed over a substrate 701 and a first conductive layer 704 which functions as a drain electrode is formed over the semiconductor layer 703 provided apart from a center portion of the circular thin film transistor. It is to be noted that a second conductive layer 705 which functions as a drain wire is formed in contact with the first conductive layer 704.

A first insulating layer 706 is formed so as to cover the substrate 701, the first conductive layer 704, and the second conductive layer 705. A third conductive layer 707 which functions as a gate electrode is formed over the first insulating layer 706 and a second insulating layer 708 is formed over the first insulating layer 706 and the third conductive layer 707. A fourth conductive layer 709 which functions as a source electrode and a source wire and a fifth conductive layer 710 which functions as a gate wire are formed in contact with the semiconductor layer 703 provided at a center portion of the circular thin film transistor and the third conductive layer 707 and the fourth conductive layer 709 which functions as a source electrode and a source wire respectively over the second insulating layer 708.

A manufacturing method of the aforementioned circular thin film transistor will be hereinafter described in details.

In Embodiment Mode 6, the first conductive layer 407 and the fifth conductive layer 420 formed in the different steps in Embodiment Mode 5 are formed in the same step. Note that the same steps as those in Embodiment Modes 5 will be described with the same reference numerals in the same drawings, and the description thereof will be omitted here. That is, with reference to FIGS. 20A to 21D, Embodiment Mode 6 will describe the steps after the steps of forming the third semiconductor layer 405 and the fourth semiconductor layer 406 in FIG. 16B in Embodiment Mode 5.

Figure 20A:
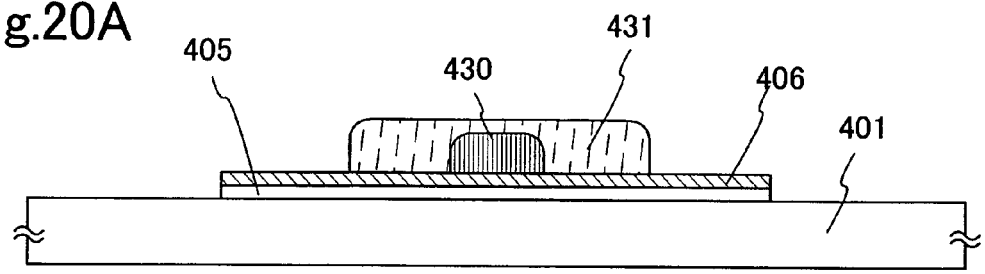
FIGS. 20A to 20D are views showing a manufacturing method of a circular thin film transistor of Embodiment Mode 6.

The first mask 404 formed in FIG. 16B is removed and a second mask 430 is formed over the fourth semiconductor layer 406 by a droplet discharge method as shown in FIG. 20A. A first liquid-repellent layer 431 is formed over the fourth semiconductor layer 406 and the second mask 430 by a droplet discharge method.

Figure 20B:
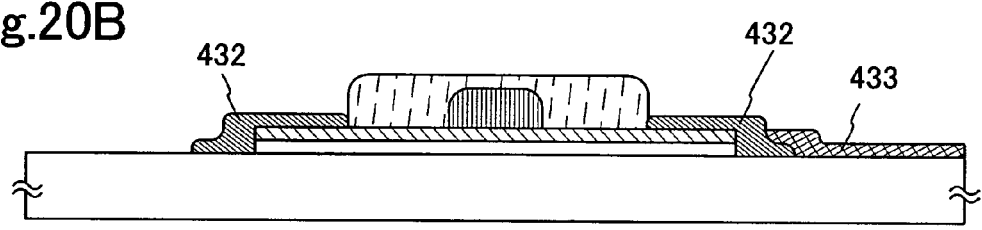

A first conductive layer 432 is formed over the fourth semiconductor layer 406 and the substrate 401 by a droplet discharge method. A second conductive layer 433 is formed in contact with the first conductive layer 432 over the substrate 401 by a droplet discharge method. It is to be noted that the first conductive layer 432 functions as a source electrode or a drain electrode. The second conductive layer 433 functions as a lead out wire for the source electrode or a lead out wire for the drain electrode (FIG. 20B).

Figure 20C:
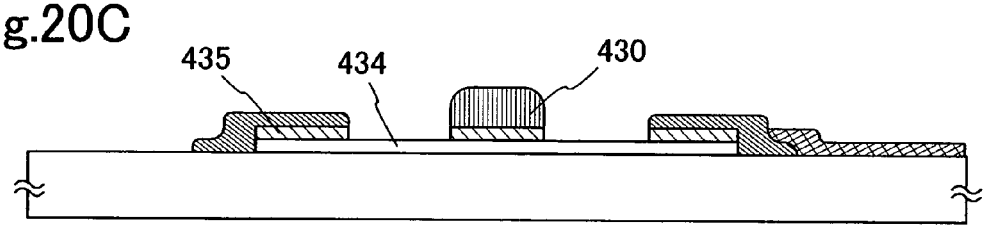

The first liquid-repellent layer 431 is removed and a portion of the third semiconductor layer 405 and the fourth semiconductor layer 406 are simultaneously etched using the second mask 430 and the first conductive layer 432 as masks, thereby a fifth semiconductor layer 434 and a sixth semiconductor layer 435 are formed. The fifth semiconductor layer 434 functions as an active layer. The sixth semiconductor layer 435 has a function to electrically connect the fifth semiconductor layer 434 which functions as an active layer to a source electrode or a drain electrode formed in subsequent steps (FIG. 20C).

Figure 20D:
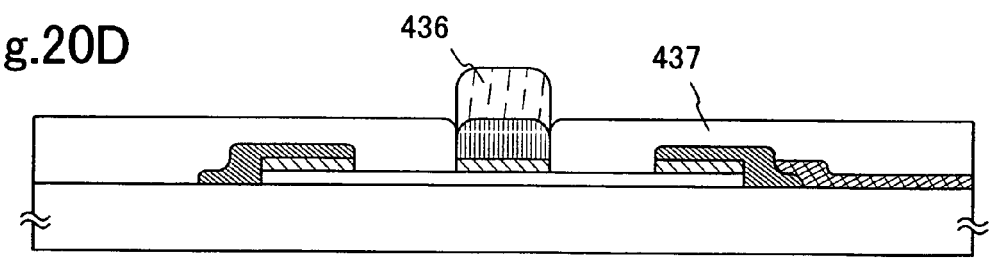

A second liquid-repellent layer 436 is formed over the second mask 430 by a droplet discharge method. A first insulating layer 437 is formed over the substrate 401, a portion of the third semiconductor layer 405, the first conductive layer 432, and the second conductive layer 433 by a droplet discharge method. It is to be noted that the first insulating layer 437 functions as a gate insulating film (FIG. 20D).

Here, the second mask 430 may be removed. In that case, the second liquid-repellent layer is formed over the sixth semiconductor layer by a droplet discharge method, which can also be used in subsequent steps.

Figure 21A:
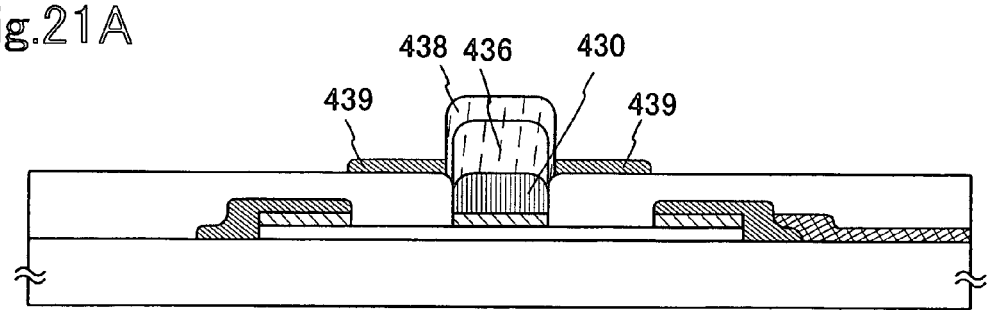
FIGS. 21A to 21D are views showing a manufacturing method of a circular thin film transistor of Embodiment Mode 6.

A third liquid-repellent layer 438 is formed over the first insulating layer 437 by a droplet discharge method and a third conductive layer 439 is formed over the first insulating layer 437 by a droplet discharge method. It is to be noted that the third conductive layer 439 functions as a gate electrode (FIG. 21A).

Figure 21B:
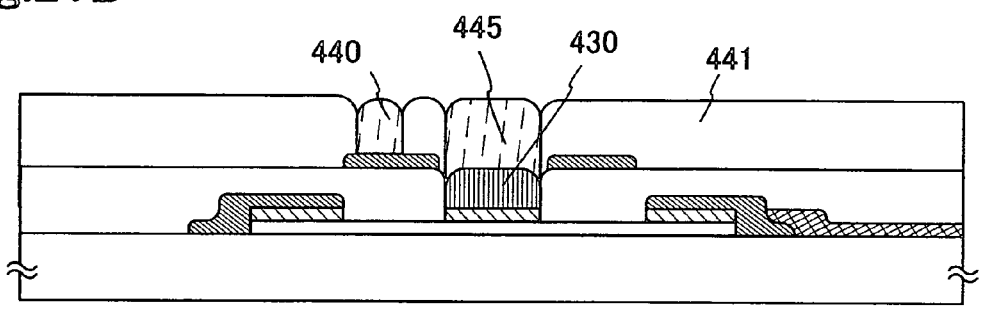

The second liquid-repellent layer 436 and the third liquid-repellent layer 438 are removed and a fourth liquid-repellent layer 445 is formed over the second mask 430 and a fifth liquid-repellent layer 440 is formed over the third conductive layer 439 by a droplet discharge method, and then a second insulating layer 441 is formed over the first insulating layer 437 by a droplet discharge method. It is to be noted that the second insulating layer 441 functions as an interlayer insulating film (FIG. 21B).

Figure 21C:
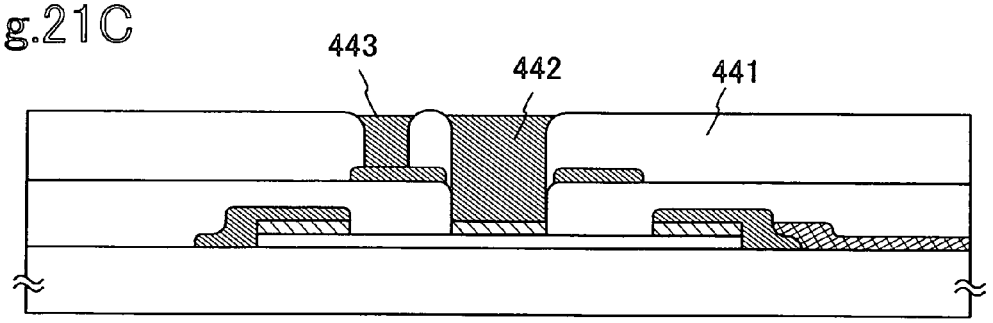

The second mask 430, the fourth liquid-repellent layer 445, and the fifth liquid-repellent layer 440 are removed. A fourth conductive layer 442 is formed so as to be in contact with the sixth semiconductor layer 435 over the second insulating layer 441 by a droplet discharge method. A fifth conductive layer 443 is formed so as to be in contact with the third conductive layer 439 over the second insulating layer 441 by a droplet discharge method. It is to be noted that the fourth conductive layer 442 functions as a lead out wire for a source electrode and the fifth conductive layer 443 functions as a gate electrode and a lead out wire for the gate electrode, or a drain electrode and a lead out wire for the drain electrode (FIG. 21C).

Figure 21D:
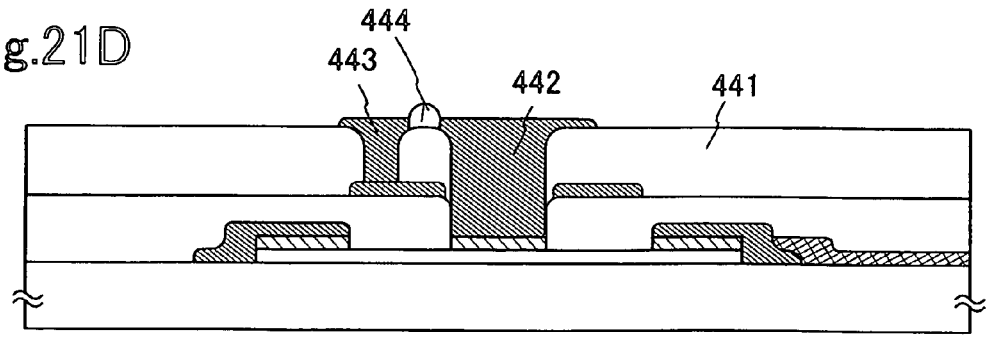

In Embodiment Mode 6, the fourth liquid-repellent layer 445 and the fifth liquid-repellent layer 440 are removed as shown in FIG. 21D. A sixth liquid-repellent layer 444 is formed over the second insulating layer 441 by a droplet discharge method. The fourth conductive layer 442 and the fifth conductive layer 443 may be simultaneously formed by a droplet discharge method so as to be in contact with the sixth semiconductor layer 435 and the third conductive layer 439 respectively over the second insulating layer 441. By removing the sixth liquid-repellent layer 444, the fourth conductive layer 442 which functions as a lead out wire for the gate electrode and the fifth conductive layer 443 which functions as the source electrode and a lead out wire for the source electrode or the drain electrode and a lead out wire for the drain electrode can be formed.

The film formed by a droplet discharge method by the aforementioned process may be formed by stacking a thin film by a known method such as a sputtering method and an evaporation method. In that case, a thin film transistor having a desired shape can be formed by forming a mask by a droplet discharge method.

However, in the case where a thin film is formed by a known method such as a sputtering method and an evaporation method and thus it is difficult to form the thin film at normal temperatures, it is required that a heat resistant substrate be used and a measure against heat be provided when stacking thin films.

As shown in FIG. 20A, the second mask 430 is formed into an arbitrary size over the fourth semiconductor layer 406 by a droplet discharge method. The first liquid-repellent layer 431 is formed into an arbitrary size over the fourth semiconductor layer 406 and the second mask 430 by a droplet discharge method. The first conductive layer 432 is formed over the fourth semiconductor layer 406 and the substrate 401 by a droplet discharge method. The second conductive layer 433 is formed in contact with the first conductive layer 432 over the substrate 401 by a droplet discharge method (FIG. 20B). The first liquid-repellent layer 431 is removed and a portion of the third semiconductor layer 405 and the fourth semiconductor layer 406 are simultaneously etched using the second mask 430 and the first conductive layer 432 as masks, thereby the fifth semiconductor layer 434 and the sixth semiconductor layer 435 are formed. As a result, the channel length of a thin film transistor can be freely controlled.

The third liquid-repellent layer 438 is formed into an arbitrary size over the first insulating layer 437 by a droplet discharge method. The third conductive layer 439 is formed into an arbitrary size over the first insulating layer 437 by a droplet discharge method (FIG. 21A). As a result, the length of a gate electrode in a channel direction can be controlled.

By performing one or both of the aforementioned methods, it becomes possible to freely control one or both of the channel length and the length of an overlapped region of a gate electrode and a film (for example, a semiconductor film imparted with p-type or n-type conductivity) for electrically connecting a crystalline semiconductor film such as an impurity semiconductor film which exists adjacent to a channel portion of a circular thin film transistor to a source electrode and a drain electrode.

Embodiment Mode 7

A structure and a manufacturing method of a circular thin film transistor of the invention will be described with reference to FIGS. 22A to 26B. It is to be noted in Embodiment Mode 7 that the method described in Embodiment Mode 1 can be used in the case of using a liquid-repellent application method. Further, the materials described in Embodiment Mode 1 can be used as materials used for forming insulating layers (including first and second insulating layers in Embodiment Mode 7), liquid-repellent layers (including first to seventh liquid-repellent layers in Embodiment Mode 7), and conductive layers (including first to sixth conductive layers in Embodiment Mode 7).

Figure 22A:
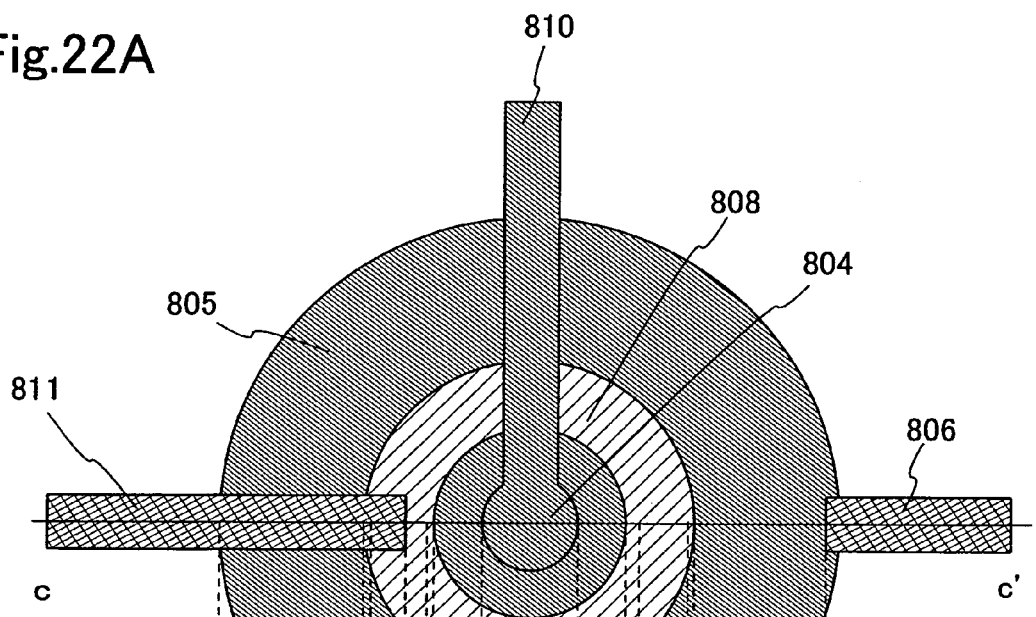
FIGS. 22A and 22B are views showing structures of a circular thin film transistor of Embodiment Mode 7.
Figure 22B:
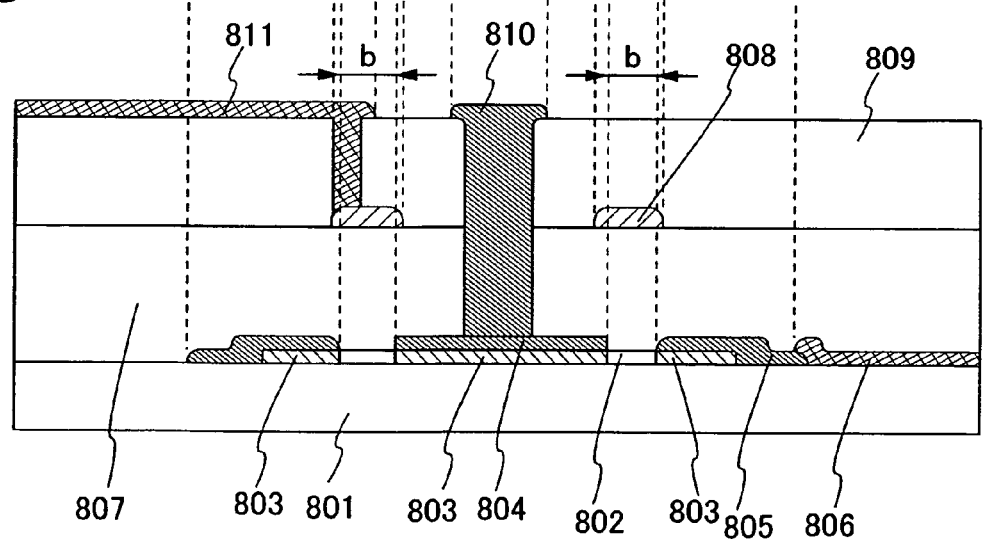

FIG. 22A is a top plan view of a circular thin film transistor of the invention and FIG. 22B is a cross sectional view thereof.

As shown in FIG. 22B, semiconductor layers 802 and 803 as active layers are formed over a substrate 801. The semiconductor layers 803 are formed by adding impurities which impart p-type or n-type conductivity to a portion of the semiconductor layer 802. A first conductive layer 804 which functions as a source electrode is formed over the semiconductor layer 803 provided at a center portion of the circular thin film transistor and a second conductive layer 805 which functions as a drain electrode is formed over the semiconductor layer 803 provided apart from the center portion of the circular thin film transistor. It is to be noted that a third conductive layer 806 which functions as a drain wire is formed in contact with the second conductive layer 805.

A first insulating layer 807 is formed so as to cover the substrate 801, the second conductive layer 805, and the third conductive layer 806. A fourth conductive layer 808 which functions as a gate electrode is formed over the first insulating layer 807 and a second insulating layer 809 is formed over the first insulating layer 807 and the fourth conductive layer 808. A fifth conductive layer 810 which functions as a source wire and a sixth conductive layer 811 which functions as a gate wire are formed in contact with the first conductive layer 804 and the fourth conductive layer 808 respectively over the second insulating layer 809.

It is to be noted that a manufacturing method of the aforementioned circular thin film transistor will be hereinafter described in details.

Embodiment Mode 7 will describe a manufacturing method of the case where a structure of semiconductor layers is different from that in Embodiment Mode 5 or 6 with reference to FIGS. 23A to 26B.

Figure 23A:
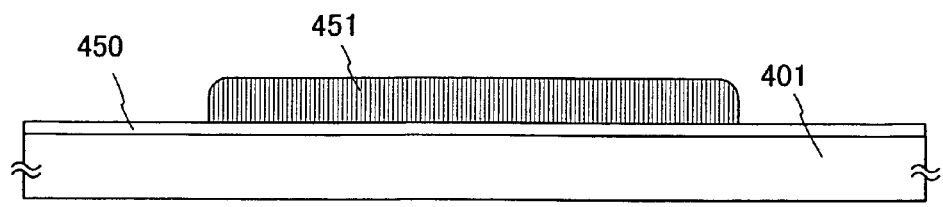
FIGS. 23A to 23D are views showing a manufacturing method of a circular thin film transistor of Embodiment Mode 7.
Figure 23B:
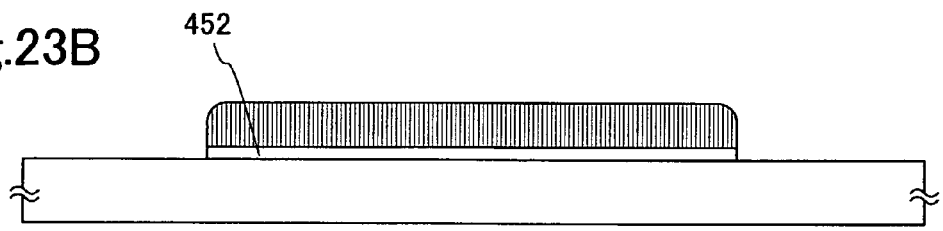

As shown in FIG. 23A, a first semiconductor layer 450 is stacked over the substrate 401 and a first mask 451 is formed over the first semiconductor layer 450 by a droplet discharge method. The first semiconductor layer 450 is etched using the first mask 451, thereby a second semiconductor layer 452 is formed (FIG. 23B).

Figure 23C:
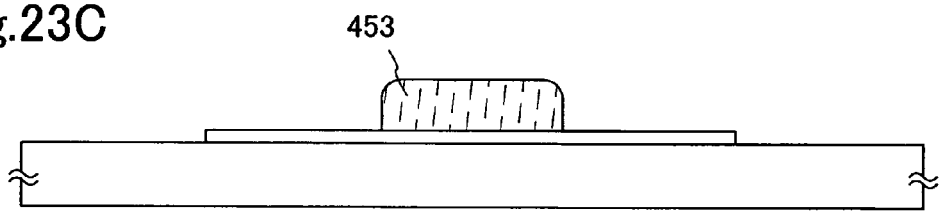
Figure 23D:
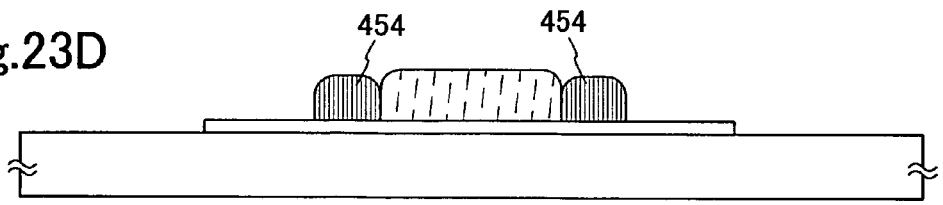

The first mask 451 is removed and a first liquid-repellent layer 453 is formed by a droplet discharge method. A second mask 454 is formed over the second semiconductor layer 452 by a droplet discharge method (FIGS. 23C and 23D).

Figure 24A:
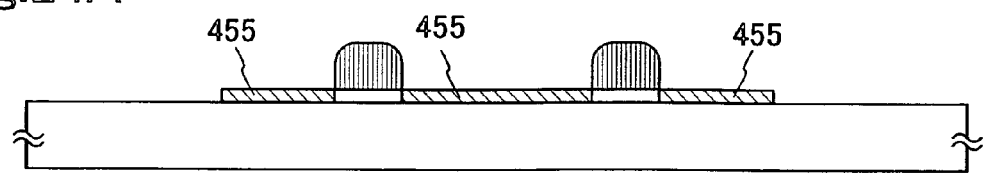
FIGS. 24A to 24D are views showing a manufacturing method of a circular thin film transistor of Embodiment Mode 7.

By removing the first liquid-repellent layer 453 and adding high or low concentration impurities which impart p-type or n-type conductivity to the second semiconductor layer 452, a third semiconductor layer 455 is formed in a portion of the second semiconductor layer 452. It is to be noted that the third semiconductor layer 455 has a function to electrically connect an electrode to an active layer imparted with p-type or n-type conductivity (FIG. 24A).

Figure 24B:
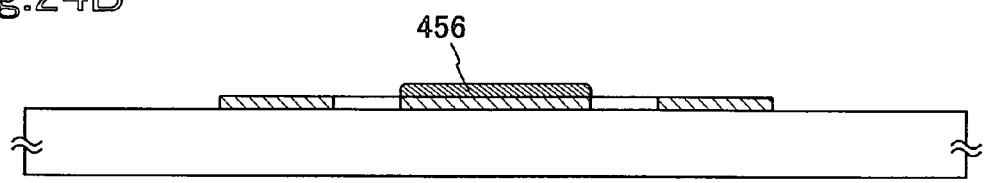
Figure 24C:
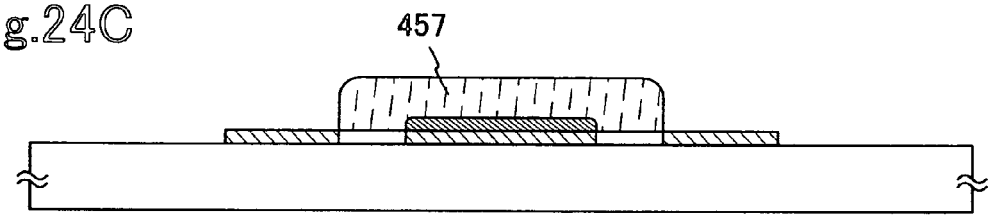

The second mask 454 is removed and a first conductive layer 456 is formed over the third semiconductor layer 455 by a droplet discharge method. It is to be noted that the first conductive layer 456 functions as a source electrode or a drain electrode (FIG. 24B).

Figure 24D:
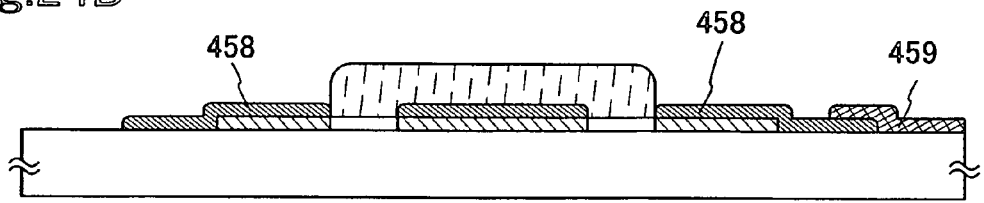

A second liquid-repellent layer 457 is formed over the first conductive layer 456, the second semiconductor layer 452, and the third semiconductor layer 455 by a droplet discharge method. A second conductive layer 458 is formed so as to be in contact with the substrate 401 and the third semiconductor layer 455 by a droplet discharge method. A third conductive layer 459 is formed so as to be in contact with the substrate 401 and the second conductive layer 458. The second conductive layer 458 functions as a drain electrode or a source electrode. The third conductive layer 459 functions as a lead out wire for the drain electrode or a lead out wire for the source electrode (FIG. 24D).

Figure 25A:
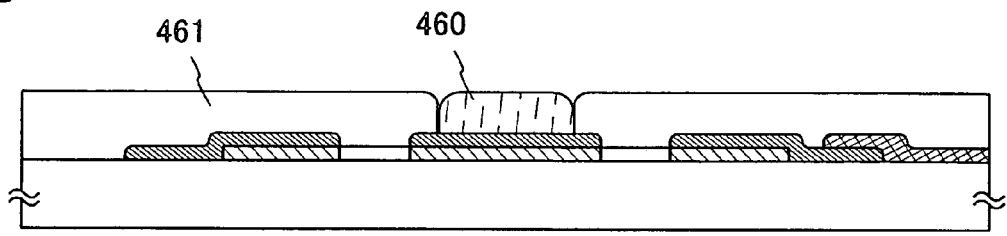
FIGS. 25A to 25D are views showing a manufacturing method of a circular thin film transistor of Embodiment Mode 7.

The second liquid-repellent layer 457 is removed and a third liquid-repellent layer 460 is formed over the first conductive layer 456 by a droplet discharge method. A first insulating layer 461 is formed over the substrate 401, the second semiconductor layer 452, the second conductive layer 458, and the third conductive layer 459 by a droplet discharge method. It is to be noted that the first insulating layer 461 functions as a gate insulating film (FIG. 25A).

Figure 25B:
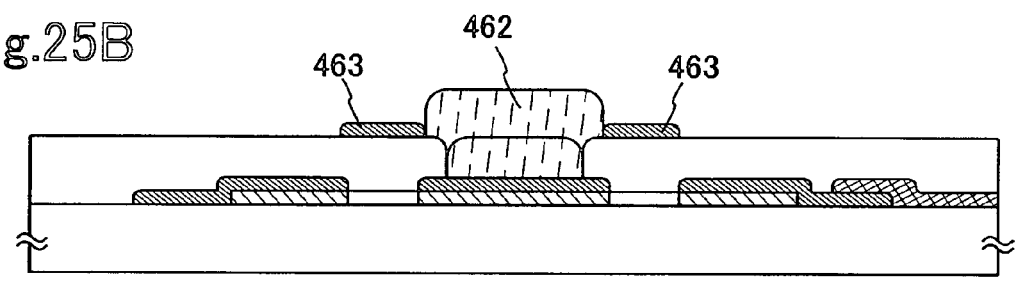

A fourth liquid-repellent layer 462 is formed over the first insulating layer 461 by a droplet discharge method. A fourth conductive layer 463 is formed over the first insulating layer 461 by a droplet discharge method. It is to be noted that the fourth conductive layer 463 functions as a gate electrode (FIG. 25B).

Figure 25C:
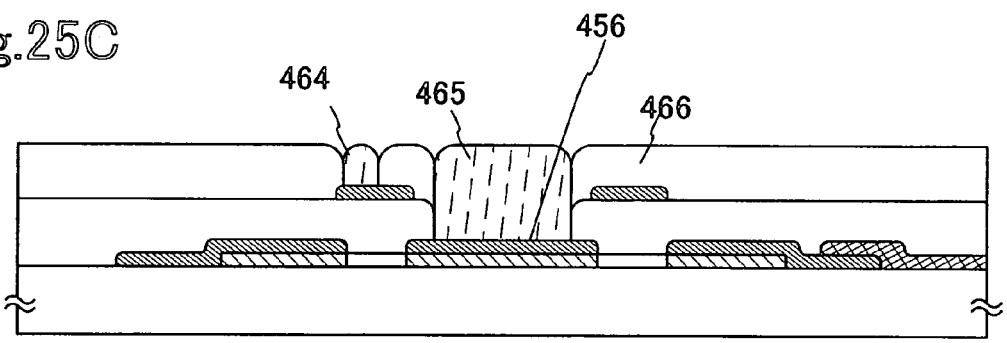
Figure 25D:
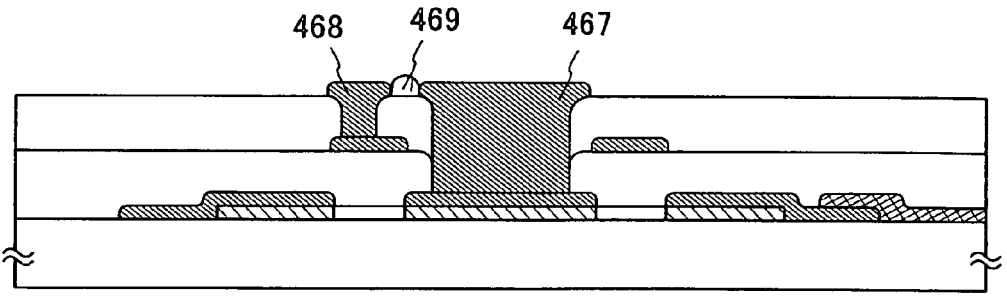

The third liquid-repellent layer 460 and the fourth liquid-repellent layer 462 are removed and a fifth liquid-repellent layer 464 is formed over the fourth conductive layer 463 by a droplet discharge method, a sixth liquid-repellent layer 465 is formed over the first conductive layer 456 by a droplet discharge method, and a second insulating layer 466 is formed over the first insulating layer 461 by a droplet discharge method. It is to be noted that the second insulating layer 466 functions as an interlayer insulating film (FIG. 25C).

The fifth liquid-repellent layer 464 and the sixth liquid-repellent layer 465 are removed and a fifth conductive layer 467 is formed so as to be in contact with the first conductive layer 456 over the second insulating layer 466. It is to be noted that the fifth conductive layer 467 functions as a source electrode and a lead out wire for the source electrode, or a drain electrode and a lead out wire for the drain electrode.

A sixth conductive layer 468 is formed so as to be in contact with the fourth conductive layer 463 over the second insulating layer 466 by a droplet discharge method. It is to be noted that the sixth conductive layer 468 functions as a lead out wire for the gate electrode.

Figure 26A:
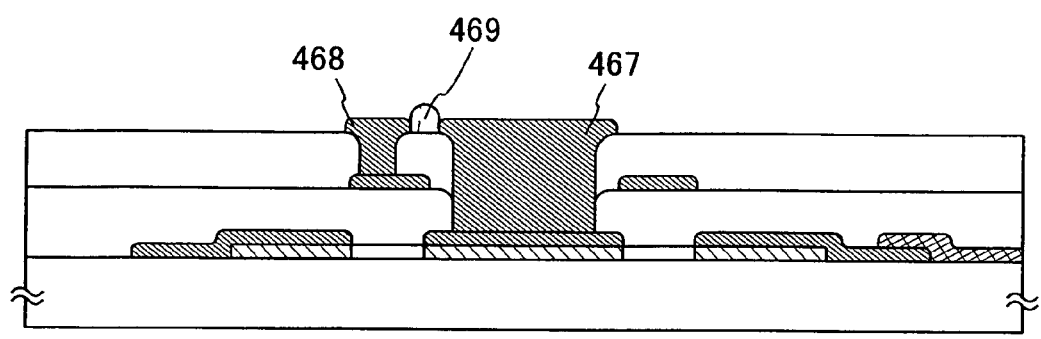
FIGS. 26A and 26B are views showing a manufacturing method of a circular thin film transistor of Embodiment Mode 7.

Alternatively, in Embodiment Mode 7, as shown in FIG. 26A, the fifth liquid-repellent layer 464 and the sixth liquid-repellent layer 465 may be removed and a seventh liquid-repellent layer 469 may be formed over the second insulating layer 466 by a droplet discharge method. Then, the fifth conductive layer 467 and the sixth conductive layer 468 may be simultaneously formed so as to be in contact with the first conductive layer and the fourth conductive layer 463 respectively over the second insulating layer 466 by a droplet discharge method. Subsequently, the sixth liquid-repellent layer 465 is removed. It is to be noted in this case also that the fifth conductive layer 467 functions as a lead out wire for the source electrode or a lead out wire for the drain electrode and the sixth conductive layer 468 functions as a gate electrode and a lead out wire for the gate electrode.

Figure 26B:
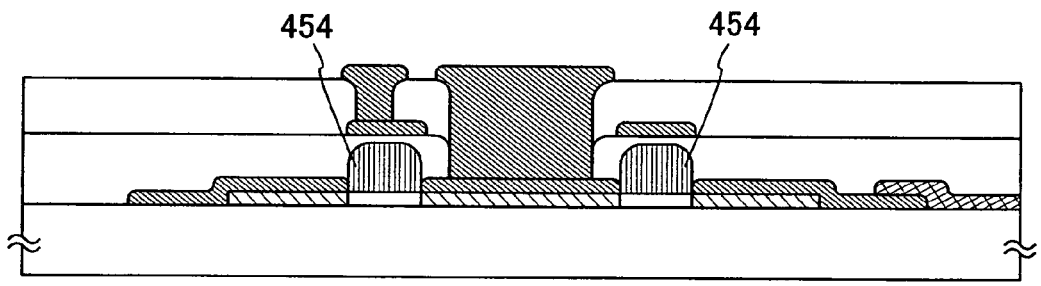

In Embodiment Mode 7, as shown in FIG. 26B, the first conductive layer 456 can be formed over the second semiconductor layer 452 and the third semiconductor layer 455 by a droplet discharge method without removing the second mask 454 which is formed in FIG. 23D and removed in FIG. 24B. It is to be noted that the first conductive layer 456 functions as a source electrode or a drain electrode. That is, the second mask 454 can be used similarly to an insulating layer which is formed later. However, the second mask 454 is required to be formed of a substance which does not have an adverse effect on subsequent steps, such as an insulating material. Leaving the second mask 454 as described above is effective in reducing manufacturing time and cost and further planarizing the film.

The film formed by a droplet discharge method by the aforementioned process may be formed by stacking a thin film by a known method such as a sputtering method and an evaporation method. In that case, a thin film transistor having a desired shape can be formed by forming a mask by a droplet discharge method.

However, in the case where a thin film is formed by a known method such as a sputtering method and an evaporation method and thus it is difficult to form the thin film at normal temperatures, it is required that a heat resistant substrate be used and a measure against heat be provided when stacking thin films.

The first liquid-repellent layer 453 is formed into an arbitrary size by a droplet discharge method and the second mask 454 is formed into an arbitrary size over the second semiconductor layer 452 by a droplet discharge method (FIGS. 23C and 23D). By removing the first liquid-repellent layer 453 and adding high or low concentration impurities which impart p-type or n-type conductivity to the second semiconductor layer 452 using the second mask 454, a third semiconductor layer 455 is formed over a portion of the second semiconductor layer 452 (FIG. 24A). As a result, the channel length of the thin film transistor can be freely controlled.

A fourth liquid-repellent layer 462 and the fourth conductive layer 463 are formed into an arbitrary size over the first insulating layer 461 by a droplet discharge method (FIG. 25B). As a result, the length of the gate electrode in a channel direction can be controlled.

By performing one or both of the aforementioned methods, it becomes possible to freely control one or both of the channel length and the length of an overlapped region of a gate electrode and a film (for example, a semiconductor film imparted with p-type or n-type conductivity) for electrically connecting a crystalline semiconductor film such as an impurity semiconductor film which exists adjacent to a channel portion of a circular thin film transistor to a source electrode and a drain electrode.

Embodiment Mode 8

A structure and a manufacturing method of a circular thin film transistor of the invention will be described with reference to FIGS. 27A to 29D. It is to be noted in Embodiment Mode 8 that the method described in Embodiment Mode 1 can be used in the case of using a liquid-repellent application method. Further, the materials described in Embodiment Mode 1 can be used as materials used for forming insulating layers (including first and second insulating layers in Embodiment Mode 8), liquid-repellent layers (including first to sixth liquid-repellent layers in Embodiment Mode 8), and conductive layers (including first to fifth conductive layers in Embodiment Mode 8).

Figure 27A:
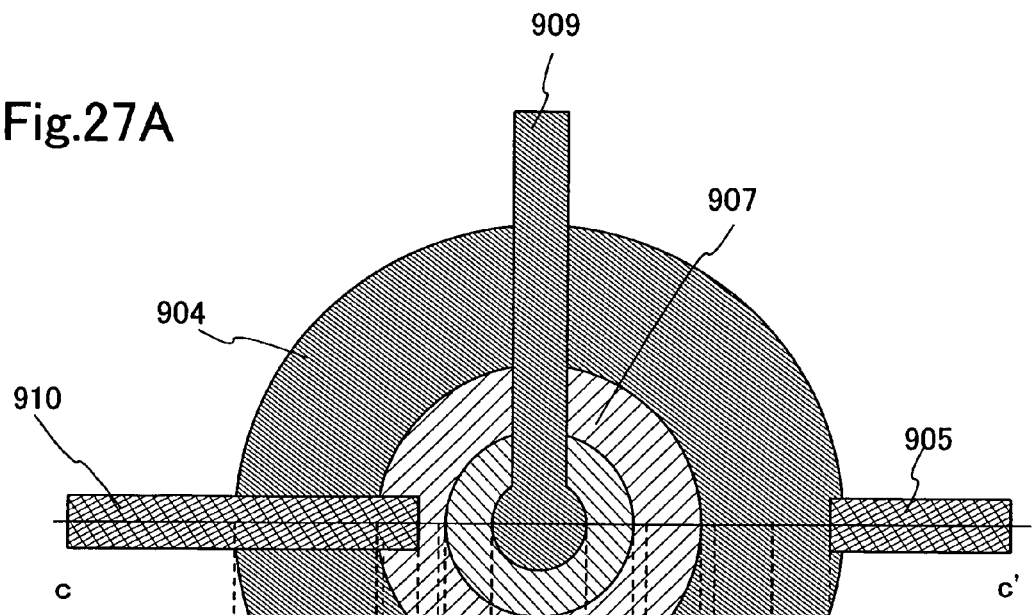
FIGS. 27A and 27B are views showing structures of a circular thin film transistor of Embodiment Mode 8.
Figure 27B:
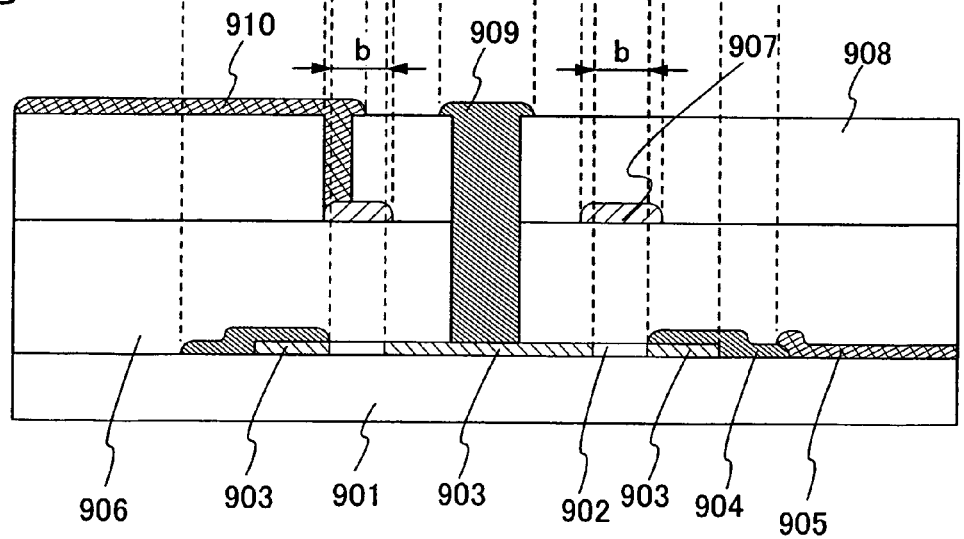

FIG. 27A is a top plan view of a circular thin film transistor of the invention and FIG. 27B is a cross sectional view thereof.

As shown in FIG. 27B, semiconductor layers 902 and 903 as active layers are formed over a substrate 901. The semiconductor layers 903 are formed by adding impurities which impart p-type or n-type conductivity to a portion of the semiconductor layer 902. A first conductive layer 904 which functions as a drain electrode is formed over the semiconductor layer 903 provided apart from a center portion of the circular thin film transistor. A second conductive layer 905 which functions as a drain wire is formed in contact with the first conductive layer 904.

A first insulating layer 906 is formed so as to cover the substrate 901, the first conductive layer 904, and the second conductive layer 905. A third conductive layer 907 which functions as a gate electrode is formed over the first insulating layer 906 and a second insulating layer 908 is formed over the first insulating layer 906 and the third conductive layer 907. A fourth conductive layer 909 which functions as a source electrode and a source wire is formed in contact with the semiconductor layer 903 provided at a center portion of the circular thin film transistor and a fifth conductive layer 910 which functions as a gate wire is formed in contact with the third conductive layer 907 over the second insulating layer 908.

It is to be noted that a manufacturing method of the aforementioned circular thin film transistor will be hereinafter described in details.

In Embodiment Mode 8, the first conductive layer 456 and the fifth conductive layer 467 formed in the different steps in Embodiment Mode 7 are formed in the same step. Note that the same steps as those in Embodiment Mode 7 will be described with the same reference numerals in the same drawings, and the description thereof will be omitted here. That is, with reference to FIGS. 27A to 29D, Embodiment Mode 8 will describe the steps after the steps of forming the third semiconductor layer 455 and removing the second mask 454 in FIG. 24A in Embodiment Mode 7.

Figure 28A:
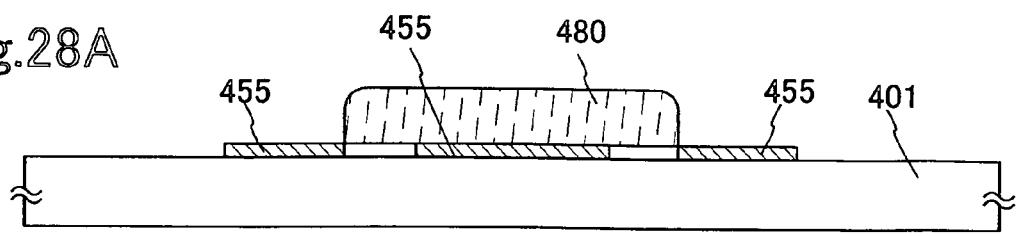
FIGS. 28A to 28D are views showing a manufacturing method of a circular thin film transistor of Embodiment Mode 8.
Figure 28B:
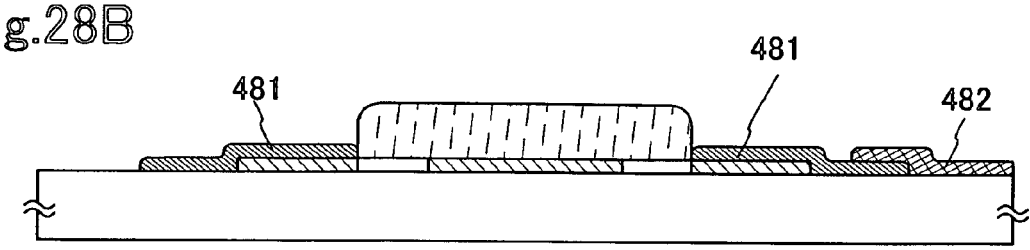

As shown in FIG. 28A, a second liquid-repellent layer 480 is formed over the second semiconductor layer 452 and the third semiconductor layer 455 by a droplet discharge method. A first conductive layer 481 is formed so as to be in contact with the substrate 401 and the third semiconductor layer 455 by a droplet discharge method. A second conductive layer 482 is formed so as to be in contact with the substrate 401 and the first conductive layer 481 by a droplet discharge method. It is to be noted that the second conductive layer 482 functions as a drain electrode and a lead out wire for the drain electrode, or a source electrode and a lead out wire for the source electrode (FIGS. 28A and 28B).

Figure 28C:
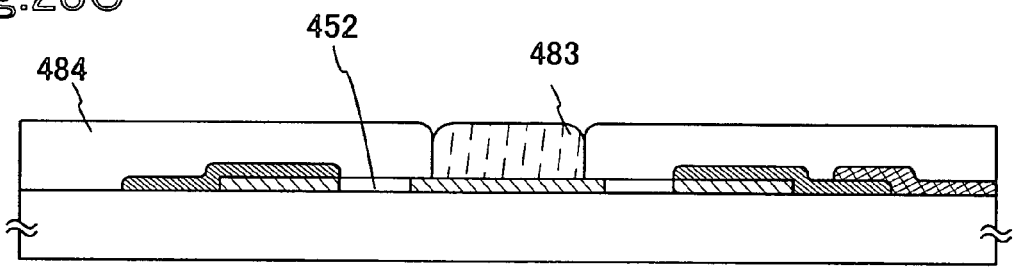

The second liquid-repellent layer 480 is removed, a third liquid-repellent layer 483 is formed over the third semiconductor layer 455 by a droplet discharge method, and a first insulating layer 484 is formed over the substrate 401, the second semiconductor layer 452, the first conductive layer 481, and a portion of the second conductive layer 482 by a droplet discharge method, thereby an insulating layer which functions as a gate insulating film is formed (FIG. 28C).

Figure 28D:
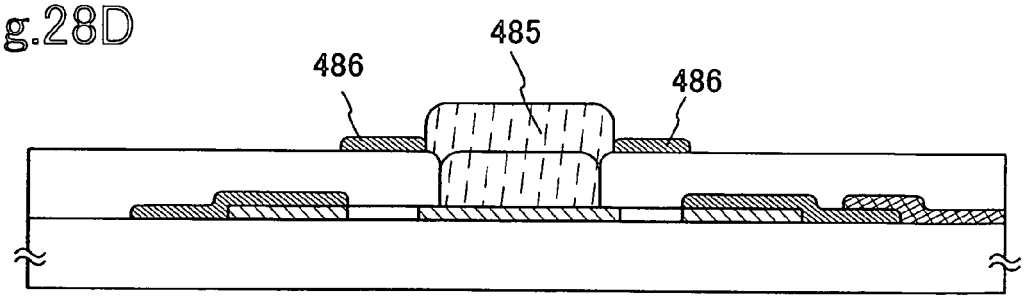

A fourth liquid-repellent layer 485 is formed over the third liquid-repellent layer 483 and the first insulating layer 484 by a droplet discharge method and a third conductive layer 486 is formed over the first insulating layer 484 by a droplet discharge method. It is to be noted that the third conductive layer 486 functions as a gate electrode (FIG. 28D).

Figure 29A:
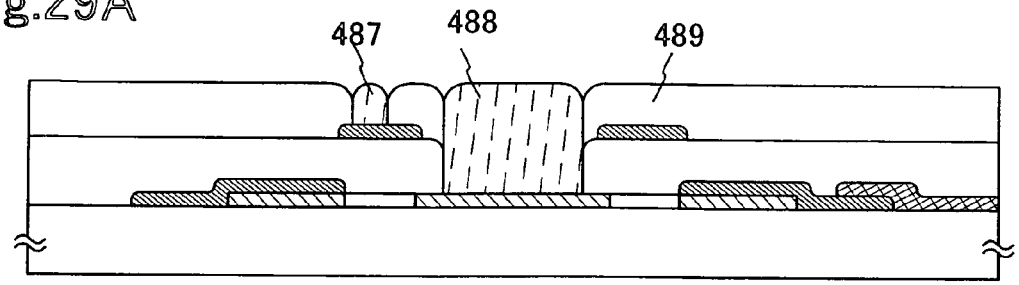
FIGS. 29A to 29D are views showing a manufacturing method of a circular thin film transistor of Embodiment Mode 8.

The third liquid-repellent layer 483 and the fourth liquid-repellent layer 485 are removed and a fifth liquid-repellent layer 487 is formed over the third conductive layer 486 by a droplet discharge method. A sixth liquid-repellent layer 488 is formed over the third semiconductor layer 455 by a droplet discharge method. A second insulating layer 489 is formed over the first insulating layer 484 by a droplet discharge method. It is to be noted that the second insulating layer 489 functions as an interlayer insulating film (FIG. 29A).

Figure 29B:
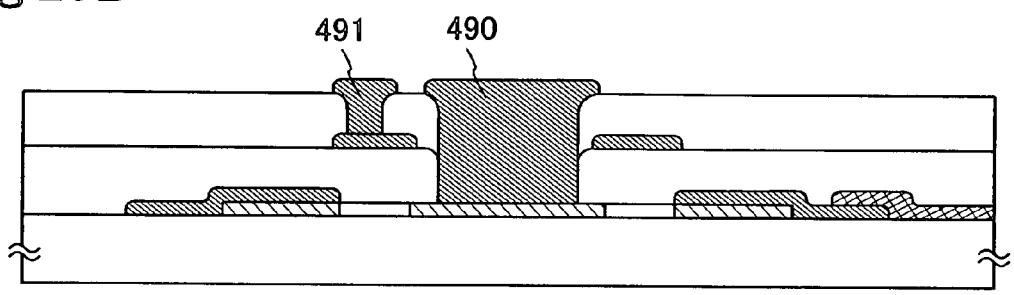

The fifth liquid-repellent layer 487 and the sixth liquid-repellent layer 488 are removed and a fourth conductive layer 490 is formed so as to be in contact with the third semiconductor layer 455 over the second insulating layer 489 by a droplet discharge method. It is to be noted that the fourth conductive layer 490 functions as a source electrode and a lead out wire for the source electrode. A fifth conductive layer 491 is formed so as to be in contact with the third conductive layer 486 over the second insulating layer 489 by a droplet discharge method. It is to be noted that the fifth conductive layer 491 functions as a lead out wire for the gate electrode (FIG. 29B).

Figure 29C:
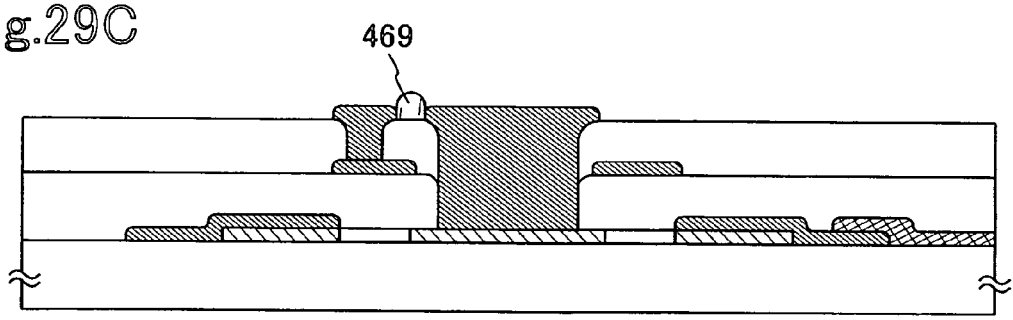

Alternatively, in Embodiment Mode 8, as shown in FIG. 29C, the fifth liquid-repellent layer 487 and the sixth liquid-repellent layer 488 may be removed and a seventh liquid-repellent layer 469 may be formed over the second insulating layer 489 by a droplet discharge method. Then, the fourth conductive layer 490 and the fifth conductive layer 491 may be simultaneously formed so as to be in contact with the third semiconductor layer 455 and the third conductive layer 486 respectively over the second insulating layer 489 by a droplet discharge method. Subsequently, the seventh liquid-repellent layer 469 is removed. It is to be noted in this case also that the fourth conductive layer 490 functions as a lead out wire for the gate electrode and the fifth conductive layer 491 functions as a lead out wire for the source electrode or a lead out wire for the drain electrode.

Figure 29D:
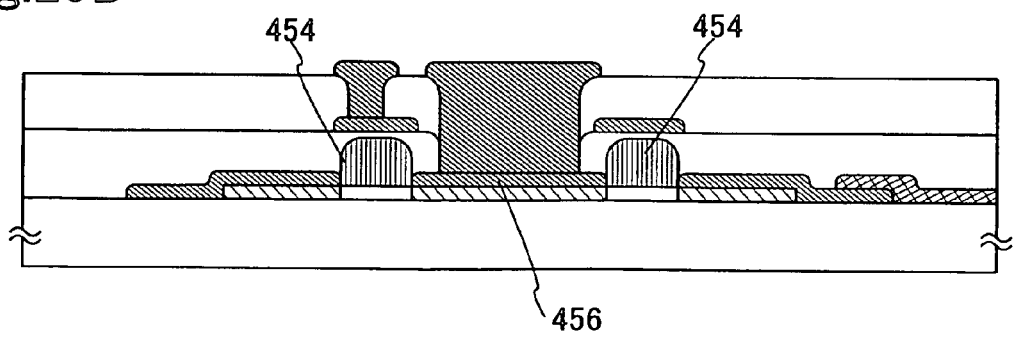

In Embodiment Mode 8, as shown in FIG. 29D, the first conductive layer 456 can be formed over the second semiconductor layer 452 and the third semiconductor layer 455 by a droplet discharge method without removing the second mask 454 which is formed in FIG. 23D and removed in FIG. 24B in Embodiment Mode 7. It is to be noted that the first conductive layer 456 functions as a source electrode or a drain electrode. That is, the second mask 454 can be used similarly to an insulating layer which is formed later. However, the second mask 454 is required to be formed of a substance which does not have an adverse effect on subsequent steps, such as an insulating material. Leaving the second mask 454 as described above is effective in reducing manufacturing time and cost and further planarizing the film.

The film formed by a droplet discharge method by the aforementioned process may be formed by stacking a thin film by a known method such as a sputtering method and an evaporation method. In that case, a thin film transistor having a desired shape can be formed by forming a mask by a droplet discharge method.

However, in the case where a thin film is formed by a known method such as a sputtering method and an evaporation method and thus it is difficult to form the thin film at normal temperatures, it is required that a heat resistant substrate be used and a measure against heat be provided when stacking thin films.

By performing one or both of the aforementioned methods, it becomes possible to freely control one or both of the channel length and the length of an overlapped region of a gate electrode and a film (for example, a semiconductor film imparted with p-type or n-type conductivity) for electrically connecting a crystalline semiconductor film such as an impurity semiconductor film which exists adjacent to a channel portion of a circular thin film transistor to a source electrode and a drain electrode.

Embodiment Mode 9

In Embodiment Mode 9, a circular thin film transistor of the invention is used in a pixel portion of a display device such as a liquid crystal display device and a light emitting device. The position of a transistor in the pixel portion is not particularly limited. For example, a transistor can be provided as shown in a top plan view of FIG. 30. It is to be noted that the circular thin film transistor described in Embodiment Mode 1 is used in this embodiment mode.

Figure 30:
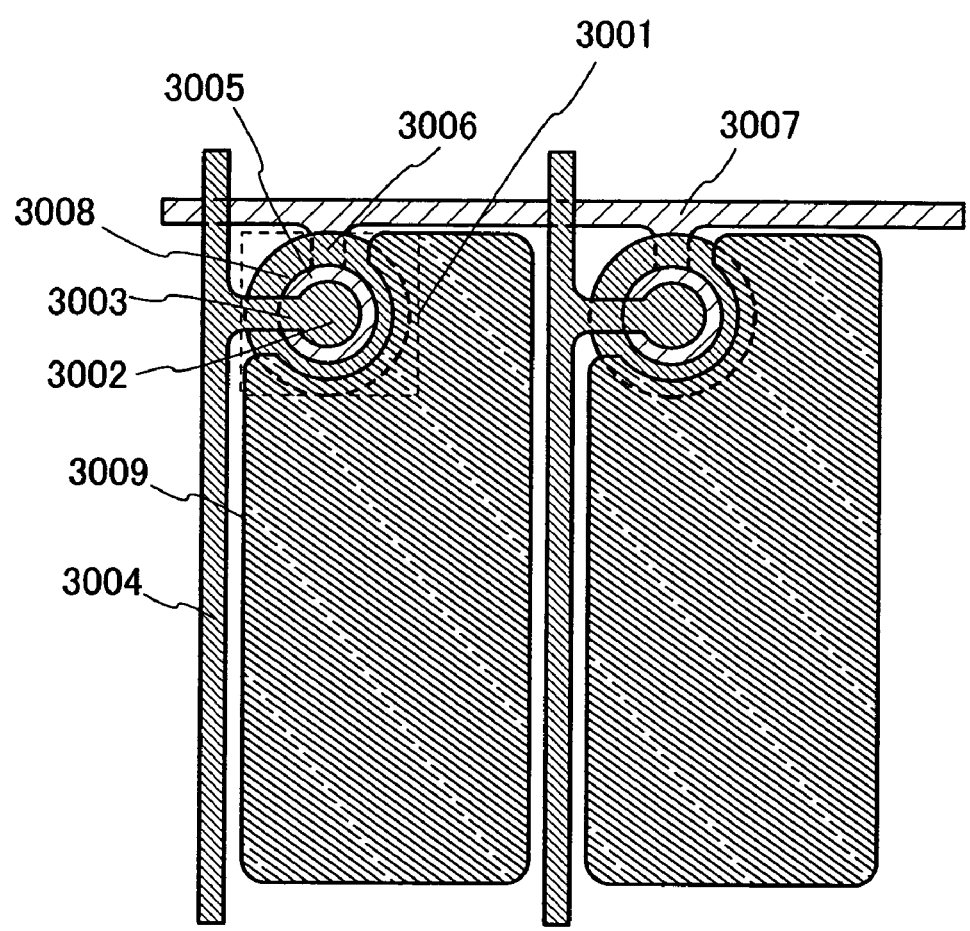
FIG. 30 is a view showing the case where a circular thin film transistor of the invention is used in a pixel portion.

In FIG. 30, a source electrode 3002 of a circular thin film transistor 3001 is connected to a source signal line 3004 through a source wire 3003. A gate electrode 3005 of the circular thin film transistor 3001 is connected to a gate signal line 3007 through a gate wire 3006. A pixel electrode 3009 is formed so that a portion thereof is in contact with a drain electrode 3008.

It is to be noted that one circular thin film transistor is formed in one pixel here, however, the invention is not limited to this configuration. Two or more circular thin film transistors may be provided in one pixel as well.

This application is based on Japanese Patent Application serial no. 2005-147660 filed in Japan Patent Office on 20th, May, 2005, the entire contents of which are hereby incorporated by reference.

What is claimed is:

1. A manufacturing method of a thin film transistor, comprising:

forming a first insulating layer over a portion of a substrate by a droplet discharge method;

forming a first liquid-repellent layer over the first insulating layer by a droplet discharge method;

forming a first conductive layer in contact with the first insulating layer over a portion of the substrate by a droplet discharge method;

forming a second liquid-repellent layer over the first liquid-repellent layer and a portion of the first conductive layer by a droplet discharge method;

forming a second insulating layer in contact with the second liquid-repellent layer over the first conductive layer and the substrate by a droplet discharge method;

removing the first liquid-repellent layer and the second liquid-repellent layer and forming a third liquid-repellent layer over a portion of the first insulating layer;

forming a second conductive layer in contact with the first insulating layer and the third liquid-repellent layer over the first conductive layer and a portion of the second insulating layer;

removing the third liquid-repellent layer and forming a third insulating layer over the first insulating layer, the second conductive layer, and the second insulating layer by a droplet discharge method;

forming a first semiconductor layer over the third insulating layer;

forming a second semiconductor layer imparted with one conductivity type over the first semiconductor layer;

forming a first mask over a portion of the second semiconductor layer by a droplet discharge method;

forming a third semiconductor layer and a fourth semiconductor layer by etching the first semiconductor layer and the second semiconductor layer using the first mask;

removing the first mask and forming a third conductive layer over a portion of the fourth semiconductor layer;

forming a fourth liquid-repellent layer over the third conductive layer and a portion of the fourth semiconductor layer;

forming a fourth conductive layer in contact with the third semiconductor layer and the fourth liquid-repellent layer over the fourth semiconductor layer and a portion of the third insulating layer by a droplet discharge method;

forming a fifth conductive layer in contact with the fourth conductive layer over a portion of the third insulating layer by a droplet discharge method;

removing the fourth liquid-repellent layer and forming a fifth semiconductor layer and a sixth semiconductor layer by etching a portion of the third semiconductor layer and the fourth semiconductor layer using the third conductive layer and the fourth conductive layer as masks;

forming a fifth liquid-repellent layer over the third conductive layer by a droplet discharge method;

forming a fourth insulating layer in contact with the fifth liquid-repellent layer over the third insulating layer, the fourth conductive layer, the fifth conductive layer, and the fifth semiconductor layer by a droplet discharge method; and removing the fifth liquid-repellent layer and forming a sixth conductive layer in contact with the third conductive layer and the fourth insulating layer by a droplet discharge method.

2. A manufacturing method of a thin film transistor, comprising:

forming a first insulating layer over a portion of a substrate by a droplet discharge method;

forming a first liquid-repellent layer over a portion of the first insulating layer by a droplet discharge method;

forming a first conductive layer in contact with the first insulating layer over the substrate by a droplet discharge method;

forming a second liquid-repellent layer over the first liquid-repellent layer and a portion of the first conductive layer by a droplet discharge method;

forming a second insulating layer in contact with the second liquid-repellent layer over the first conductive layer and the substrate by a droplet discharge method;

removing the first liquid-repellent layer and the second liquid-repellent layer and forming a third liquid-repellent layer over a portion of the first insulating layer;

forming a second conductive layer in contact with the first insulating layer and the third liquid-repellent layer over the first conductive layer and a portion of the second insulating layer;

removing the third liquid-repellent layer and forming a third insulating layer over the first insulating layer, the second conductive layer, and the second insulating layer by a droplet discharge method;

forming a first semiconductor layer over the third insulating layer;

forming a second semiconductor layer imparted with one conductivity type over the first semiconductor layer;

forming a first mask over a portion of the second semiconductor layer by a droplet discharge method;

forming a third semiconductor layer and a fourth semiconductor layer by etching the first semiconductor layer and the second semiconductor layer using the first mask;

removing the first mask and forming a second mask over a portion of the fourth semiconductor layer by a droplet discharge method;

forming a fourth liquid-repellent layer over the second mask and a portion of the fourth semiconductor layer by a droplet discharge method;

forming a third conductive layer in contact with the third semiconductor layer and the fourth liquid-repellent layer over the fourth semiconductor layer and a portion of the third insulating layer by a droplet discharge method;

forming a fourth conductive layer in contact with the third conductive layer over a portion of the third insulating layer by a droplet discharge method; and removing the fourth liquid-repellent layer and forming a fifth semiconductor layer and a sixth semiconductor layer by etching a portion of the third semiconductor layer and the fourth semiconductor layer using the second mask and the third conductive layer as masks;

forming a fifth liquid-repellent layer over the second mask by a droplet discharge method;

forming a fourth insulating layer in contact with the fifth liquid-repellent layer over the third insulating layer, the third conductive layer, the fourth conductive layer, and the fifth semiconductor layer by a droplet discharge method; and removing the fifth liquid-repellent layer and the second mask and forming a fifth conductive layer in contact with the sixth semiconductor layer and the fourth insulating layer by a droplet discharge method.

3. A manufacturing method of a thin film transistor, comprising:

forming a first insulating layer over a portion of a substrate by a droplet discharge method;

forming a first liquid-repellent layer over the first insulating layer by a droplet discharge method;

forming a first conductive layer in contact with the first insulating layer over a portion of the substrate by a droplet discharge method;

forming a second liquid-repellent layer over the first liquid-repellent layer and the first conductive layer by a droplet discharge method;

forming a second insulating layer in contact with the second liquid-repellent layer over the first conductive layer and the substrate by a droplet discharge method;

removing the first liquid-repellent layer and the second liquid-repellent layer and forming a third liquid-repellent layer over a portion of the first insulating layer;

forming a second conductive layer in contact with the first insulating layer and the third liquid-repellent layer over the first conductive layer and a portion of the second insulating layer;

removing the third liquid-repellent layer and forming a third insulating layer over the first insulating layer, the second conductive layer, and the second insulating layer by a droplet discharge method;

forming a first semiconductor layer over the third insulating layer;

forming a first mask over a portion of the first semiconductor layer by a droplet discharge method;

forming a second semiconductor layer by etching the first semiconductor layer using the first mask;

removing the first mask and forming a fourth liquid-repellent layer over a portion of the second semiconductor layer by a droplet discharge method;

forming a second mask in contact with the fourth liquid-repellent layer over a portion of the second semiconductor layer by a droplet discharge method;

removing the fourth liquid-repellent layer and forming a third semiconductor layer over a portion of the second semiconductor layer by adding an impurity having one conductivity type to the second semiconductor layer through the second mask;

removing the second mask and forming a third conductive layer over a portion of the third semiconductor layer by a droplet discharge method;

forming a fifth liquid-repellent layer over the second semiconductor layer, a portion of the third semiconductor layer, and the third conductive layer by a droplet discharge method;

forming a fourth conductive layer in contact with the fifth liquid-repellent layer over the third semiconductor layer and a portion of the third insulating layer by a droplet discharge method;

forming a fifth conductive layer in contact with the fourth conductive layer over the third insulating layer by a droplet discharge method;

removing the fifth liquid-repellent layer and forming a sixth liquid-repellent layer over the third conductive layer by a droplet discharge method;

forming a fourth insulating layer in contact with the sixth liquid-repellent layer over the third insulating layer, the second semiconductor layer, the third semiconductor layer, the fourth conductive layer, and the fifth conductive layer by a droplet discharge method; and removing the sixth liquid-repellent layer and forming a sixth conductive layer in contact with the fourth insulating layer over the third conductive layer by a droplet discharge method.

4. A manufacturing method of a thin film transistor, comprising:

forming a first insulating layer over a portion of a substrate by a droplet discharge method;

forming a first liquid-repellent layer over the first insulating layer by a droplet discharge method;

forming a first conductive layer in contact with the first insulating layer over a portion of the substrate by a droplet discharge method;

forming a second liquid-repellent layer over the first liquid-repellent layer and a portion of the first conductive layer by a droplet discharge method;

forming a second insulating layer in contact with the second liquid-repellent layer over the first conductive layer and the substrate by a droplet discharge method;

removing the first liquid-repellent layer and the second liquid-repellent layer and forming a third liquid-repellent layer over the first insulating layer;

forming a second conductive layer in contact with the first insulating layer and the third liquid-repellent layer over the first conductive layer and a portion of the second insulating layer;

removing the third liquid-repellent layer and forming a third insulating layer over the first insulating layer, the second conductive layer, and the second insulating layer by a droplet discharge method;

forming a first semiconductor layer over the third insulating layer;

forming a first mask over a portion of the first semiconductor layer by a droplet discharge method;

forming a second semiconductor layer by etching the first semiconductor layer using the first mask;

removing the first mask and forming a fourth liquid-repellent layer over a portion of the second semiconductor layer by a droplet discharge method;

forming a second mask in contact with the fourth liquid-repellent layer over a portion of the second semiconductor layer by a droplet discharge method;

removing the fourth liquid-repellent layer and forming a third semiconductor layer over a portion of the second semiconductor layer by adding an impurity having one conductivity type to the second semiconductor layer through the second mask;

removing the second mask and forming a fifth liquid-repellent layer over the second semiconductor layer and a portion of the third semiconductor layer by a droplet discharge method;

forming a third conductive layer in contact with the fifth liquid-repellent layer over the third semiconductor layer and a portion of the third insulating layer by a droplet discharge method;

forming a fourth conductive layer in contact with the third conductive layer over a portion of the third insulating layer by a droplet discharge method;

removing the fifth liquid-repellent layer and forming a sixth liquid-repellent layer over the third semiconductor layer by a droplet discharge method;

forming a fourth insulating layer in contact with the sixth liquid-repellent layer over the third insulating layer, the second semiconductor layer, the third conductive layer, and the fourth conductive layer by a droplet discharge method; and removing the sixth liquid-repellent layer and forming a sixth conductive layer in contact with the fourth insulating layer over the third semiconductor layer by a droplet discharge method.

5. A manufacturing method of a thin film transistor, comprising:

forming a first semiconductor layer over a substrate;

forming a second semiconductor layer over the first semiconductor layer;

forming a first mask over a portion of the second semiconductor layer by a droplet discharge method;

forming a third semiconductor layer and a fourth semiconductor layer by etching the first semiconductor layer and the second semiconductor layer using the first mask;

removing the first mask and forming a first conductive layer over a portion of the fourth semiconductor layer by a droplet discharge method;

forming a first liquid-repellent layer over the first conductive layer and a portion of the fourth semiconductor layer by a droplet discharge method;

forming a second conductive layer in contact with the third semiconductor layer and the first liquid-repellent layer over the fourth semiconductor layer, and a portion of the substrate by a droplet discharge method;

forming a third conductive layer in contact with the second conductive layer over a portion of the substrate by a droplet discharge method;

removing the first liquid-repellent layer and forming a fifth semiconductor layer and a sixth semiconductor layer by etching a portion of the third semiconductor layer and the fourth semiconductor layer using the first conductive layer and the second conductive layer as masks;

forming a second liquid-repellent layer over a portion of the first conductive layer by a droplet discharge method;

forming a first insulating layer in contact with the second liquid-repellent layer over the substrate, the second conductive layer and the third conductive layer by a droplet discharge method;

forming a third liquid-repellent layer over the second liquid-repellent layer and a portion of the first insulating layer by a droplet discharge method;

forming a fourth conductive layer in contact with the third liquid-repellent layer over a portion of the first insulating layer by a droplet discharge method;

removing the second liquid-repellent layer and the third liquid-repellent layer and forming a fourth liquid-repellent layer over a portion of the first conductive layer and forming a fifth liquid-repellent layer over a portion of the fourth conductive layer by a droplet discharge method;

forming a second insulating layer in contact with the fourth liquid-repellent layer and the fifth liquid-repellent layer over the first insulating layer, the fourth conductive layer, and the first conductive layer; and removing the fourth liquid-repellent layer and the fifth liquid-repellent layer and forming a fifth conductive layer in contact with the first conductive layer and forming a sixth conductive layer in contact with the fourth conductive layer by a droplet discharge method.

6. A manufacturing method of a thin film transistor, comprising:

forming a first semiconductor layer over a substrate;

forming a second semiconductor layer over the first semiconductor layer;

forming a first mask over a portion of the second semiconductor layer by a droplet discharge method;

forming a third semiconductor layer and a fourth semiconductor layer by etching the first semiconductor layer and the second semiconductor layer using the first mask;

removing the first mask and forming a second mask over a portion of the fourth semiconductor layer by a droplet discharge method;

forming a first liquid-repellent layer over the second mask and a portion of the fourth semiconductor layer by a droplet discharge method;

forming a first conductive layer in contact with the third semiconductor layer and the first liquid-repellent layer over the fourth semiconductor layer, and a portion of the substrate by a droplet discharge method;

forming a second conductive layer in contact with the first conductive layer over a portion of the substrate by a droplet discharge method;

removing the first liquid-repellent layer and forming a fifth semiconductor layer and a sixth semiconductor layer by etching a portion of the third semiconductor layer and the fourth semiconductor layer using the second mask and the first conductive layer as masks;

forming a second liquid-repellent layer over the second mask by a droplet discharge method;

forming a first insulating layer in contact with the second liquid-repellent layer over the substrate, the first conductive layer, the second conductive layer, and the third semiconductor layer by a droplet discharge method;

forming a third liquid-repellent layer over the second liquid-repellent layer and a portion of the first insulating layer by a droplet discharge method;

forming a third conductive layer in contact with the third liquid-repellent layer over a portion of the first insulating layer by a droplet discharge method;

removing the second liquid-repellent layer and the third liquid-repellent layer and forming a fourth liquid-repellent layer over the second mask and forming a fifth liquid-repellent layer over a portion of the third conductive layer by a droplet discharge method;

forming a second insulating layer in contact with the fourth liquid-repellent layer and the fifth liquid-repellent layer over the first insulating layer and the third conductive layer and removing the fourth liquid-repellent layer, the fifth liquid-repellent layer, and the second mask and forming a fourth conductive layer in contact with the sixth semiconductor layer and forming a fifth conductive layer in contact with the third conductive layer by a droplet discharge method.

7. A manufacturing method of a thin film transistor, comprising:

forming a first semiconductor layer over a substrate;

forming a first mask over a portion of the first semiconductor layer;

forming a second semiconductor layer by etching the first semiconductor layer using the first mask;

removing the first mask and forming a first liquid-repellent layer over a portion of the second semiconductor layer by a droplet discharge method;

forming a second mask in contact with the first liquid-repellent layer over a portion of the second semiconductor layer by a droplet discharge method;

removing the first liquid-repellent layer and forming a third semiconductor layer over a portion of the second semiconductor layer by adding an impurity having one conductivity type to the second semiconductor layer through the second mask;

removing the second mask and forming a first conductive layer over a portion of the third semiconductor layer by a droplet discharge method;

forming a second liquid-repellent layer over the second semiconductor layer and the first conductive layer by a droplet discharge method;

forming a second conductive layer in contact with the second liquid-repellent layer over a portion of the third semiconductor layer and a portion of the substrate by a droplet discharge method;

forming a third conductive layer in contact with the second conductive layer over a portion of the substrate by a droplet discharge method;

removing the second liquid-repellent layer and forming a third liquid-repellent layer over a portion of the first conductive layer by a droplet discharge method;

forming a first insulating layer in contact with the third liquid-repellent layer over the substrate, the second semiconductor layer, the first conductive layer, the second conductive layer, and the third conductive layer by a droplet discharge method;

forming a fourth liquid-repellent layer over the third liquid-repellent layer and a portion of the first insulating layer by a droplet discharge method;

forming a fourth conductive layer in contact with the fourth liquid-repellent layer over a portion of the first insulating layer by a droplet discharge method;

removing the third liquid-repellent layer and the fourth liquid-repellent layer and forming a fifth liquid-repellent layer over a portion of the fourth conductive layer and forming a sixth liquid-repellent layer over the first conductive layer by a droplet discharge method;

forming a second insulating layer in contact with the fifth liquid-repellent layer and the sixth liquid-repellent layer over the first insulating layer and the fourth conductive layer; and removing the fifth liquid-repellent layer and the sixth liquid-repellent layer and forming a fifth conductive layer in contact with the first conductive layer and a sixth conductive layer in contact with the fourth conductive layer by a droplet discharge method.

8. A manufacturing method of a thin film transistor, comprising:

forming a first semiconductor layer over a substrate;

forming a first mask over a portion of the first semiconductor layer by a droplet discharge method;

forming a second semiconductor layer by etching the first semiconductor layer using the first mask;

removing the first mask and forming a first liquid-repellent layer over a portion of the second semiconductor layer by a droplet discharge method;

forming a second mask in contact with the first liquid-repellent layer over a portion of the second semiconductor layer by a droplet discharge method;

removing the first liquid-repellent layer and forming a third semiconductor layer over a portion of the second semiconductor layer by adding an impurity having one conductivity type to the second semiconductor layer through the second mask;

removing the second mask and forming a second liquid-repellent layer over the second semiconductor layer and a portion of the third semiconductor layer by a droplet discharge method;

forming a first conductive layer in contact with the second liquid-repellent layer over a portion of the third semiconductor layer and a portion of the substrate by a droplet discharge method;

forming a second conductive layer in contact with the first conductive layer over a portion of the substrate by a droplet discharge method;

removing the second liquid-repellent layer and forming a third liquid-repellent layer over a portion of the third semiconductor layer by a droplet discharge method;

forming a first insulating layer in contact with the third liquid-repellent layer over the substrate, the second semiconductor layer, the first conductive layer, and the second conductive layer by a droplet discharge method;

forming a fourth liquid-repellent layer over the third liquid-repellent layer and a portion of the first insulating layer by a droplet discharge method;

forming a third conductive layer in contact with the fourth liquid-repellent layer over a portion of the first insulating layer by a droplet discharge method;

removing the third liquid-repellent layer and the fourth liquid-repellent layer and forming a fifth liquid-repellent layer over a portion of the third conductive layer and forming a sixth liquid-repellent layer over the third conductive layer by a droplet discharge method;

forming a second insulating layer in contact with the fifth liquid-repellent layer and the sixth liquid-repellent layer over the first insulating layer and the third conductive layer; and removing the fifth liquid-repellent layer and the sixth liquid-repellent layer and forming a fourth conductive layer in contact with the third conductive layer and a fifth conductive layer in contact with the third conductive layer by a droplet discharge method.

9. A method of manufacturing a semiconductor device comprising steps of:
    forming a first layer on a first region of a surface;
    forming a first liquid-repellent layer comprising a first liquid-repellent material on the first layer;
    dropping a second liquid-repellent material on the first liquid-repellent layer so that a second liquid-repellent layer is formed on a side surface of the first layer and a side surface of the first liquid-repellent layer, wherein a second region of the surface is covered by the second liquid-repellent layer;
    forming a second layer over a third region of the surface, wherein the third region of the surface is adjacent to the second region of the surface;
    removing at least the second liquid-repellent layer after forming the second layer; and
    forming a third layer in a gap between the first layer and the second layer.

10. The manufacturing method of a thin film transistor, according to claim 1,
    wherein a length of a gate electrode is controlled by controlling an amount of droplet of a material used for forming the third liquid-repellent layer and the second conductive layer.

11. The manufacturing method of a thin film transistor, according to claim 2,
    wherein a length of a gate electrode is controlled by controlling an amount of droplet of a material used for forming the third liquid-repellent layer and the second conductive layer.

12. The manufacturing method of a thin film transistor, according to claim 3,
    wherein a length of a gate electrode is controlled by controlling an amount of droplet of a material used for forming the third liquid-repellent layer and the second conductive layer.

13. The manufacturing method of a thin film transistor, according to claim 4,
    wherein a length of a gate electrode is controlled by controlling an amount of droplet of a material used for forming the third liquid-repellent layer and the second conductive layer.

14. The manufacturing method of a thin film transistor, according to claim 1,
    wherein a channel length is controlled by controlling an amount of droplet of a material used for forming the third conductive layer and the fourth liquid-repellent layer.

15. The manufacturing method of a thin film transistor, according to claim 2,
    wherein a channel length is controlled by controlling an amount of droplet of a material used for forming the second mask and the fourth liquid-repellent layer.

16. The manufacturing method of a thin film transistor, according to claim 3,
    wherein a channel length is controlled by controlling an amount of droplet of a material used for forming the second mask and the fourth liquid-repellent layer.

17. The manufacturing method of a thin film transistor, according to claim 4,
    wherein a channel length is controlled by controlling an amount of droplet of a material used for forming the second mask and the fourth liquid-repellent layer.

18. The manufacturing method of a thin film transistor, according to claim 5,
    wherein a length of a gate electrode is controlled by controlling an amount of droplet of a material used for forming the third liquid-repellent layer and the fourth conductive layer.

19. The manufacturing method of a thin film transistor, according to claim 6,
    wherein a length of a gate electrode is controlled by controlling an amount of droplet of a material used for forming the third liquid-repellent layer and the third conductive layer.

20. The manufacturing method of a thin film transistor, according to claim 7,
    wherein a length of a gate electrode is controlled by controlling an amount of droplet of a material used for forming the fourth liquid-repellent layer and the fourth conductive layer.

21. The manufacturing method of a thin film transistor, according to claim 8,
    wherein a length of a gate electrode is controlled by controlling an amount of droplet of a material used for forming the fourth liquid-repellent layer and the third conductive layer.

22. The manufacturing method of a thin film transistor, according to claim 5,
    wherein a channel length is controlled by controlling an amount of droplet of a material used for forming the first conductive layer and the first liquid-repellent layer.

23. The manufacturing method of a thin film transistor, according to claim 6,
    wherein a channel length is controlled by controlling an amount of droplet of a material used for forming the second mask and the first liquid-repellent layer.

24. The manufacturing method of a thin film transistor, according to claim 7,
    wherein a channel length is controlled by controlling an amount of droplet of a material used for forming the second mask and the first liquid-repellent layer.

25. The manufacturing method of a thin film transistor, according to claim 8,
    wherein a channel length is controlled by controlling an amount of droplet of a material used for forming the second mask and the first liquid-repellent layer.

26. The manufacturing method of a thin film transistor, according to claim 1,
    wherein the second conductive layer, the third conductive layer, and the fourth conductive layer each of which is a circular electrode.

27. The manufacturing method of a thin film transistor, according to claim 2,
    wherein the second conductive layer, the third conductive layer, and the fifth conductive layer each of which is a circular electrode.

28. The manufacturing method of a thin film transistor, according to claim 3,
    wherein the second conductive layer, the third conductive layer, and the fourth conductive layer each of which is a circular electrode.

29. The manufacturing method of a thin film transistor, according to claim 4, wherein the second conductive layer, the third conductive layer, and the fourth conductive layer each of which is a circular electrode.

30. The manufacturing method of a thin film transistor, according to claim 5,
wherein the first conductive layer, the second conductive layer, and the fourth conductive layer each of which is a circular electrode.

31. The manufacturing method of a thin film transistor, according to claim 6,
wherein the first conductive layer, the third conductive layer, and the fourth conductive layer each of which is a circular electrode.

32. The manufacturing method of a thin film transistor, according to claim 7,
wherein the first conductive layer, the second conductive layer, and the fourth conductive layer each of which is a circular electrode.

33. The manufacturing method of a thin film transistor, according to claim 8,
wherein the first conductive layer, the third conductive layer, and the fourth conductive layer each of which is a circular electrode.

34. The manufacturing method of a thin film transistor, according to claim 1,
wherein the first mask is provided over the third insulating layer which is in contact with the first insulating layer and the second conductive layer through the first semiconductor layer and the second semiconductor layer.

35. The manufacturing method of a thin film transistor, according to claim 2,
wherein the first mask is provided over the third insulating layer which is in contact with the first insulating layer and the second conductive layer through the first semiconductor layer and the second semiconductor layer.

36. The manufacturing method of a thin film transistor, according to claim 3,
wherein the first mask is provided over the third insulating layer which is in contact with the first insulating layer and the second conductive layer through the first semiconductor layer and the second semiconductor layer.

37. The manufacturing method of a thin film transistor, according to claim 4,
wherein the first mask is provided over the third insulating layer which is in contact with the first insulating layer and the second conductive layer through the first semiconductor layer and the second semiconductor layer.

38. The manufacturing method of a thin film transistor, according to claim 1,
wherein the third conductive layer is provided over the first insulating layer and has the same size as the first insulating layer.

39. The manufacturing method of a thin film transistor, according to claim 2,
wherein the second mask is provided over the first insulating layer and has the same size as the first insulating layer.

40. The manufacturing method of a thin film transistor, according to claim 3,
wherein the fourth liquid-repellent layer is provided over the first insulating layer and has the same size as the first insulating layer.

41. The manufacturing method of a thin film transistor, according to claim 3,
wherein the third conductive layer is a region where the fourth liquid-repellent layer is removed.

42. The manufacturing method of a thin film transistor, according to claim 7,
wherein the first conductive layer is a region where the first liquid-repellent layer is removed.

43. The method of manufacturing a semiconductor device according to claim 9, wherein the first layer is an insulating layer.

44. The method of manufacturing a semiconductor device according to claim 9 further comprising a step of forming a fourth layer on a portion of the surface prior to forming the second liquid-repellent layer, wherein the portion of the surface is adjacent to the first layer.

* * * * *